United States Patent
Toida et al.

(10) Patent No.: US 10,437,148 B2
(45) Date of Patent: *Oct. 8, 2019

(54) RESIST MATERIAL, RESIST COMPOSITION AND METHOD FOR FORMING RESIST PATTERN

(71) Applicant: Mitsubishi Gas Chemical Company, Inc., Tokyo (JP)

(72) Inventors: Takumi Toida, Kanagawa (JP); Takashi Sato, Kanagawa (JP); Masatoshi Echigo, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/309,780

(22) PCT Filed: May 8, 2015

(86) PCT No.: PCT/JP2015/063272
§ 371 (c)(1),
(2) Date: Nov. 8, 2016

(87) PCT Pub. No.: WO2015/170734
PCT Pub. Date: Nov. 12, 2015

(65) Prior Publication Data
US 2017/0145142 A1 May 25, 2017

(30) Foreign Application Priority Data
May 8, 2014 (JP) .................. 2014-096999

(51) Int. Cl.
| | |
|---|---|
| G03F 7/004 | (2006.01) |
| G03F 7/30 | (2006.01) |
| C08G 8/12 | (2006.01) |
| C08G 8/14 | (2006.01) |
| C08G 8/16 | (2006.01) |
| C08G 8/18 | (2006.01) |
| C08G 8/24 | (2006.01) |
| C08G 10/02 | (2006.01) |
| C08G 12/02 | (2006.01) |
| C08G 18/02 | (2006.01) |

(Continued)

(52) U.S. Cl.
CPC .............. *G03F 7/039* (2013.01); *C08G 8/04* (2013.01); *C08G 8/12* (2013.01); *C08G 8/14* (2013.01); *C08G 8/16* (2013.01); *C08G 8/18* (2013.01); *C08G 8/24* (2013.01); *C08G 10/02* (2013.01); *C08G 12/02* (2013.01); *C08G 18/02* (2013.01); *G03F 7/004* (2013.01); *G03F 7/0045* (2013.01); *G03F 7/038* (2013.01); *G03F 7/0382* (2013.01); *G03F 7/162* (2013.01); *G03F 7/168* (2013.01); *G03F 7/2037* (2013.01); *G03F 7/30* (2013.01); *G03F 7/327* (2013.01); *G03F 7/38* (2013.01); *H01L 21/027* (2013.01)

(58) Field of Classification Search
CPC .... G03F 7/0045; G03F 7/0392; G03F 7/0382; G03F 7/30; C08G 8/12; C08G 8/14; C08G 8/16; C08G 8/18; C08G 8/24; C08G 10/02; C08G 12/02; C08G 18/02; C07C 69/616; C07C 69/618
USPC ..... 430/270.1, 326; 528/125, 129, 148, 149, 528/150, 151, 153, 155, 176, 196, 205, 528/211; 560/76, 80, 81, 84, 85, 101, 560/102, 106, 107, 108, 109, 113
See application file for complete search history.

(56) References Cited

U.S. PATENT DOCUMENTS 3,640,718 A * 2/1972 Smith ................... G03C 1/675
430/270.1
4,725,422 A * 2/1988 Miyabayashi ........ C04B 35/524
264/29.1

(Continued)

FOREIGN PATENT DOCUMENTS

| EP | 3141959 A1 | 3/2017 |
| JP | 2002-231450 A | 8/2002 |

(Continued)

OTHER PUBLICATIONS

International Search Report dated Jun. 2, 2015, for PCT/JP2015/063272 and English translation of the same (5 pages).

(Continued)

*Primary Examiner* — John S Chu
(74) *Attorney, Agent, or Firm* — Fitch, Even, Tabin & Flannery LLP

(57) ABSTRACT

The resist material according to the present invention contains a compound represented by the following formula (1):

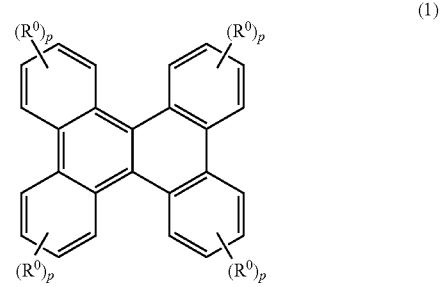

(1)

wherein each $R^0$ is independently a monovalent group having an oxygen atom, a monovalent group having a sulfur atom, a monovalent group having a nitrogen atom, a hydrocarbon group, or a halogen atom; and each p is independently an integer of 0 to 4.

17 Claims, No Drawings

(51) Int. Cl.
*G03F 7/039* (2006.01)
*G03F 7/038* (2006.01)
*H01L 21/027* (2006.01)
*C08G 8/04* (2006.01)
*G03F 7/16* (2006.01)
*G03F 7/20* (2006.01)
*G03F 7/32* (2006.01)
*G03F 7/38* (2006.01)

(56) References Cited

U.S. PATENT DOCUMENTS

| | | | |
|---|---|---|---|
| 6,416,887 B1 * | 7/2002 | Tokito | C07C 211/61 313/504 |
| 2004/0106004 A1 * | 6/2004 | Li | C07C 211/61 428/690 |
| 2005/0255712 A1 | 11/2005 | Kato et al. | |
| 2008/0153031 A1 | 6/2008 | Echigo et al. | |
| 2009/0163693 A1 | 6/2009 | Kim | |
| 2010/0316950 A1 | 12/2010 | Oguro et al. | |
| 2012/0171611 A1 | 7/2012 | Ideno et al. | |

FOREIGN PATENT DOCUMENTS

| | | |
|---|---|---|
| JP | 2002-334869 A | 11/2002 |
| JP | 2004-177668 A | 6/2004 |
| JP | 2004-271838 A | 9/2004 |
| JP | 2005-250434 A | 9/2005 |
| JP | 2005-321587 A | 11/2005 |
| JP | 2005-326838 A | 11/2005 |
| JP | 2006-162858 A | 6/2006 |
| JP | 2008-145539 A | 6/2006 |
| JP | 2006-178083 A | 7/2006 |
| JP | 2007-226170 A | 9/2007 |
| JP | 2007-226204 A | 9/2007 |
| JP | 2009-511732 A | 3/2009 |
| JP | 2009-173623 A | 8/2009 |
| JP | 2013-227307 A | 11/2013 |
| JP | 2013227307 * | 11/2013 |
| JP | 2014-152164 A | 8/2014 |
| WO | 2004/066377 A1 | 8/2004 |
| WO | 2008/004751 A1 | 1/2008 |
| WO | 2009/072465 A1 | 6/2009 |
| WO | 2011/034062 A1 | 3/2011 |

OTHER PUBLICATIONS

Written Opinion of the International Searching Authority dated Jun. 2, 2015 for PCT/JP/063272 and English translation of the same (7 pages).

T. Nakayama M. Nomura K. Haga M. Ueda, "A New Three Component Photoresist Based Calix[4]resorcinarene Derivative, a Cross-linker, and a Photo-acid Generator," Bull. Chem. Soc. Jpn., 71, 2979 (1998) (6 pages).

Patent Cooperation Treaty, International Search Report for International Application No. PCT/JP2015/063285 dated Jul. 14, 2015 and English translation (9 pages).

* cited by examiner

RESIST MATERIAL, RESIST COMPOSITION AND METHOD FOR FORMING RESIST PATTERN

CROSS-REFERENCE TO RELATED APPLICATIONS

This application is a U.S. national phase application filed under 35 U.S.C. § 371 of International Application PCT/JP2015/063272, filed on May 8, 2015, designating the United States, which claims priority from Japanese Application Number 2014-096999, filed May 8, 2014, which are hereby incorporated herein by reference in their entirety.

FIELD OF THE INVENTION

The present invention relates to a resist material, a resist composition comprising the material, and a method for forming a resist pattern using the composition.

BACKGROUND OF THE INVENTION

Conventional typical resist materials are polymer based materials capable of forming amorphous thin films. For example, a line pattern of about 45 to 100 nm is formed by irradiating a resist thin film made by coating a substrate with a solution of a polymer resist material such as polymethyl methacrylate, polyhydroxy styrene with an acid dissociation reactive group, or polyalkyl methacrylate with ultraviolet, far ultraviolet, electron beam, extreme ultraviolet (EUV), and X-ray or the like.

However, because polymer based resists have a molecular weight as large as about 10,000 to 100,000 and also wide molecular weight distribution, in lithography using a polymer based resist, roughness occurs on a fine pattern surface; the pattern dimension becomes difficult to be controlled; and the yield decreases. Therefore, there is a limitation in miniaturization with lithography using a conventional polymer based resist material. In order to make a finer pattern, various low molecular weight resist materials have been proposed.

For example, an alkaline development type negative type radiation-sensitive composition (see Patent Literatures 1 and 2) using a low molecular weight polynuclear polyphenolic compound as a main component has been suggested.

As a candidate of a low molecular weight resist material having high heat resistance, an alkaline development type negative type radiation-sensitive composition (see Patent Literature 3 and Non Patent Literature 1) using a low molecular weight cyclic polyphenolic compound as a main component has been suggested.

CITATION LIST

Patent Literature

Patent Literature 1: Japanese Patent Application Laid-Open No. 2005-326838
Patent Literature 2: Japanese Patent Application Laid-Open No. 2008-145539
Patent Literature 3: Japanese Patent Application Laid-Open No. 2009-173623

Non Patent Literature

Non Patent Literature 1: T. Nakayama, M. Nomura, K. Haga, M. Ueda: Bull. Chem. Soc. Jpn., 71, 2979 (1998)

SUMMARY OF INVENTION

However, the techniques described in Patent Literatures 1 and 2 have the disadvantages that the heat resistance of the obtained composition is not sufficient and the shape of the resulting resist pattern becomes poor. Also, the above alkaline development type negative type radiation-sensitive composition using a low molecular weight cyclic polyphenolic compound as a main component has high heat resistance, but has problems such as low solubility in a safe solvent used in a semiconductor production process, low sensitivity, and the poor shape of the resulting resist pattern. That is, the techniques described in Patent Literature 3 and Non Patent Literature 1 have problems such as low solubility in a safe solvent used in a semiconductor production process, low sensitivity, and the poor shape of the resulting resist pattern. Such low molecular weight resist materials obtained by the conventional techniques are still susceptible to improvement.

The present invention has been made in light of the problems of the conventional techniques described above, and an object of the present invention is to provide a resist material which is excellent in heat resistance and etching resistance, has high solubility in a safe solvent, has high sensitivity, and can impart a good shape to a resist pattern, a resist composition comprising the material, and a method for forming a resist pattern using the composition.

The inventors have, as a result of devoted examinations to solve the above problems, found out that by containing a compound having a specific structure, a resist composition is excellent in heat resistance and etching resistance, has high solubility in a safe solvent, has high sensitivity, and can impart a good shape to a resist pattern, and reached the present invention.

More specifically, the present invention is as follows.

[1]

A resist material comprising a compound represented by the following formula (1):

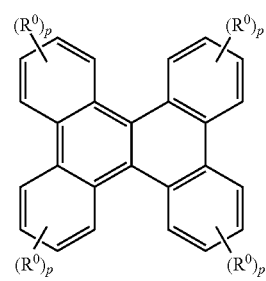

wherein each $R^0$ is independently a monovalent group having an oxygen atom, a monovalent group having a sulfur atom, a monovalent group having a nitrogen atom, a hydrocarbon group, or a halogen atom; and each p is independently an integer of 0 to 4.

[2]

The resist material according to [1], wherein at least one of p is an integer of 1 to 4.

[3]

The resist material according to [1] or [2], wherein at least one of $R^0$ is the monovalent group having the oxygen atom.

[4]

The resist material according to [1], wherein the compound represented by the formula (1) is a compound represented by the following formula (2):

(2)

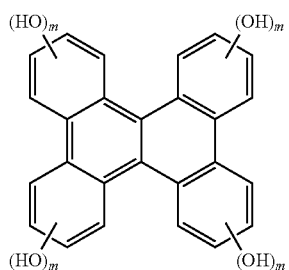

wherein each m is independently an integer of 0 to 4, wherein at least one of m is an integer of 1 to 4.

[5]

The resist material according to [4], wherein the compound represented by the formula (2) is at least one kind selected from a compound group represented by the following formulas (2-1) to (2-6):

(2-1)

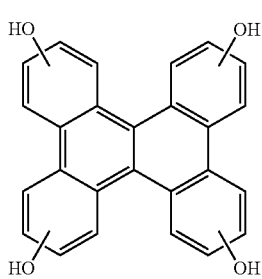

(2-2)

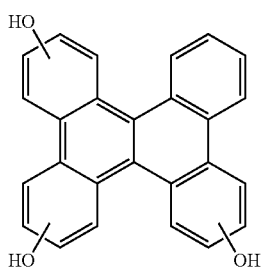

(2-3)

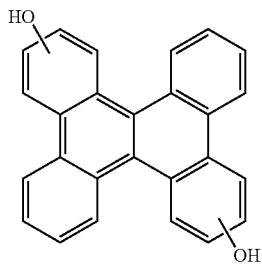

(2-4)

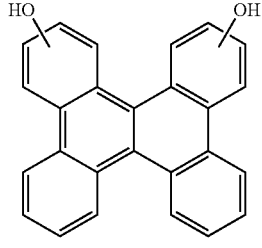

(2-5)

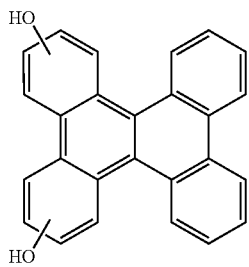

(2-6)

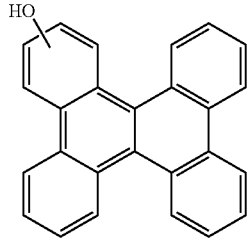

[6]

The resist material according to [1], wherein the compound represented by the formula (1) is a compound represented by the following formula (3):

(3)

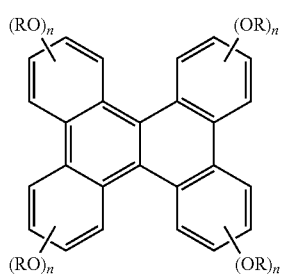

wherein each R is independently a hydrogen atom or an acid dissociation reactive group, wherein at least one of R is an acid dissociation reactive group; and each n is independently an integer of 0 to 4, wherein at least one of n is an integer of 1 to 4.

[7]

The resist material according to [6], wherein the compound represented by the formula (3) is at least one kind selected from a compound group represented by the following formulas (3-1) to (3-6):

(3-1)

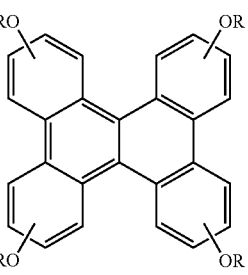

-continued (3-2)
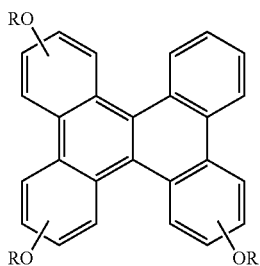

(3-3)
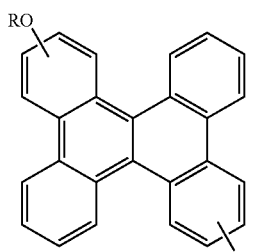

(3-4)
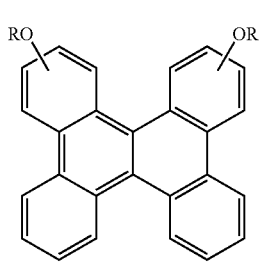

(3-5)
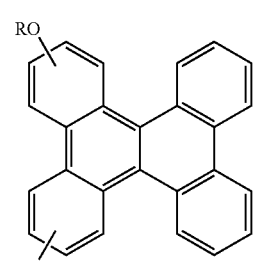

(3-6)
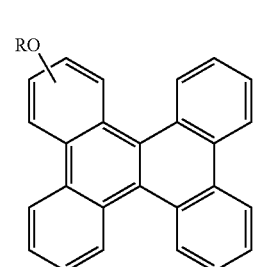

wherein R is as defined in the formula (3).

[8]
The resist material according to [6] or [7], wherein the acid dissociation reactive group is a group selected from the group consisting of a substituted methyl group, a 1-substituted ethyl group, a 1-substituted n-propyl group, a 1-branched alkyl group, a silyl group, an acyl group, a 1-substituted alkoxymethyl group, a cyclic ether group, an alkoxycarbonyl group, and an alkoxycarbonylalkyl group.

[9]
The resist material according to [6] or [7], wherein the acid dissociation reactive group is a group selected from the group consisting of groups represented by the following formula (13-4):

(13-4)
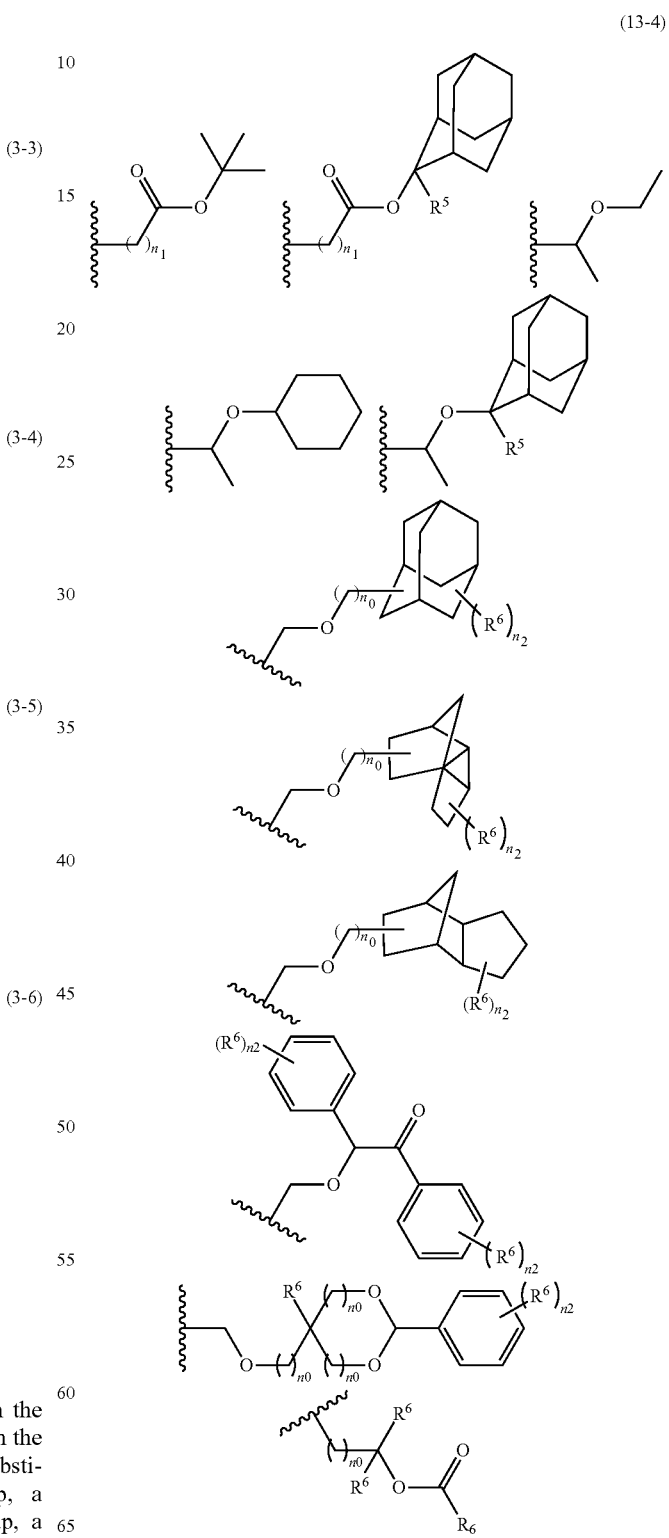

wherein $R^5$ is a hydrogen atom, or a linear or branched alkyl group having 1 to 4 carbon atoms; $R^6$ is a hydrogen atom, a linear or branched alkyl group having 1 to 4 carbon atoms, a cyano group, a nitro group, a heterocyclic group, a halogen atom, or a carboxyl group; $n_1$ is an integer of 0 to 4; $n_2$ is an integer of 1 to 5; and $n_0$ is an integer of 0 to 4.

[10]

A resist material comprising a resin obtained through a reaction of at least a compound represented by the following formula (1) with a compound having crosslinking reactivity:

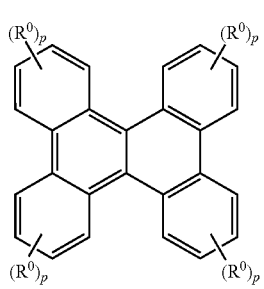

(1)

wherein each $R^0$ is independently a monovalent group having an oxygen atom, a monovalent group having a sulfur atom, a monovalent group having a nitrogen atom, a hydrocarbon group, or a halogen atom; and each p is independently an integer of 0 to 4.

[11]

The resist material according to [10], wherein the compound having crosslinking reactivity is an aldehyde, a ketone, a carboxylic acid, a carboxylic acid halide, a halogen-containing compound, an amino compound, an imino compound, an isocyanate, or an unsaturated hydrocarbon group-containing compound.

The resist material according to [10] or [11], wherein the resin is at least one kind selected from the group consisting of a novolac-based resin, an aralkyl-based resin, a hydroxystyrene-based resin, a (meth)acrylic acid-based resin, and a copolymer thereof.

[13]

The resist material according to any of [10] to [12], wherein the resin has at least one structure selected from the group consisting of structures represented by the following formulas (4-1) to (4-16):

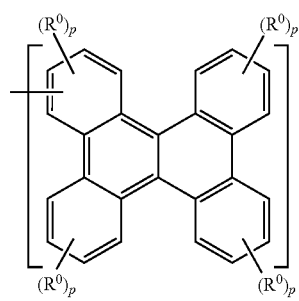

(4-1)

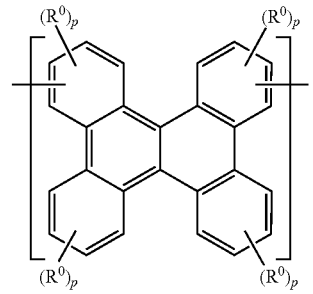

(4-2)

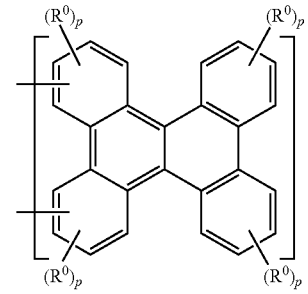

(4-3)

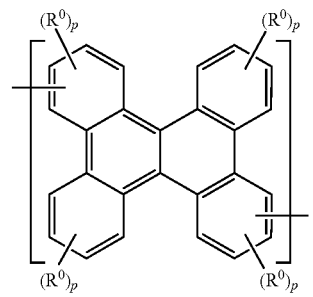

(4-4)

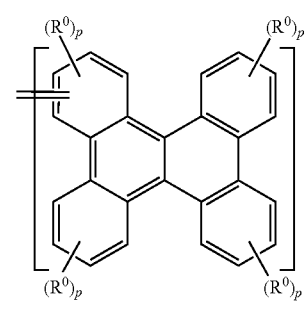

(4-5)

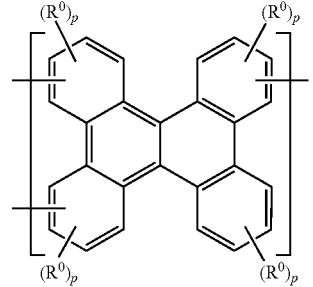

(4-6)

(4-7)
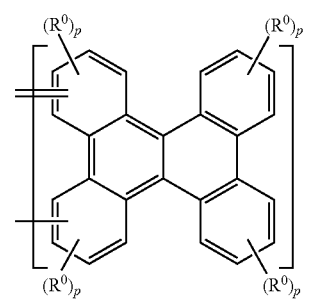
(4-8)
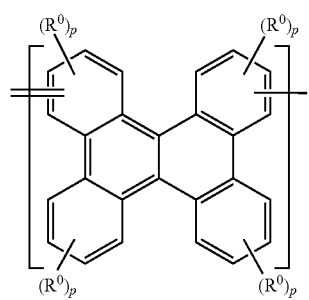
(4-9)
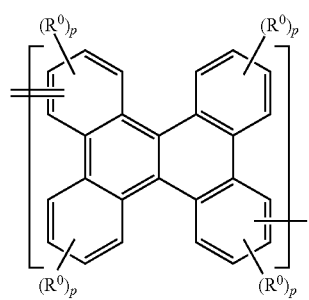
(4-10)
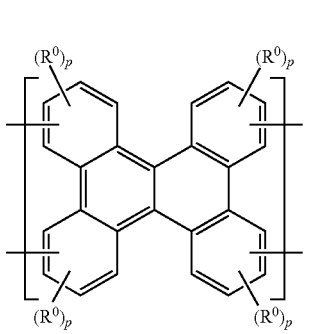
(4-11)
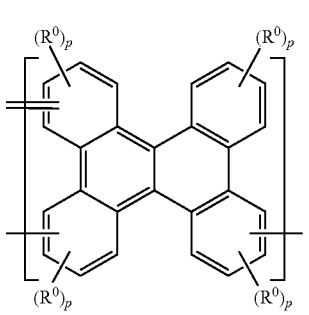
(4-12)
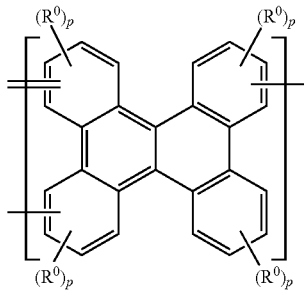
(4-13)
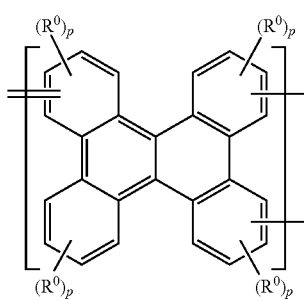
(4-14)
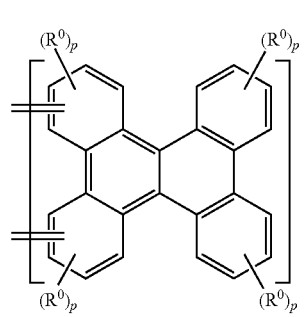
(4-15)
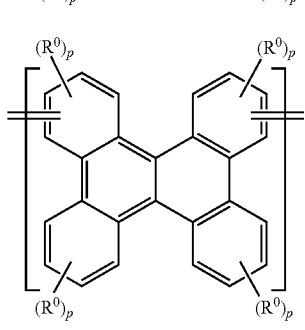
(4-16)
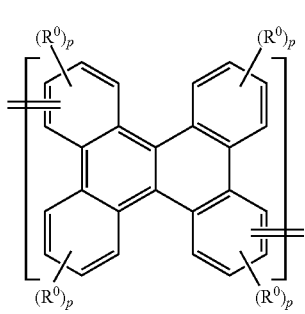
wherein $R^0$ and p are as defined in the formula (1).
[14]
A resist composition comprising the resist material according to any of [1] to [13] and a solvent.

[15]

The resist composition according to [14], further comprising an acid generating agent.

[16]

The resist composition according to [14] or [15], further comprising an acid crosslinking agent.

[17]

A method for forming a resist pattern, comprising the steps of:
coating a substrate with the resist composition according to any of [14] to [16], thereby forming a resist film;
exposing the resist film; and
developing the exposed resist film.

The resist material of the present invention is excellent in heat resistance and etching resistance, has high solubility in a safe solvent, has high sensitivity, and can impart a good shape to a resist pattern.

DESCRIPTION OF EMBODIMENTS

Hereinafter, an embodiment of the present invention (hereinafter, referred to as "present embodiment") will be described. The present embodiment is given in order to illustrate the present invention. The present invention is not limited to only the present embodiment.

[Resist Material]

The resist material of the present embodiment comprises a compound represented by the following formula (1):

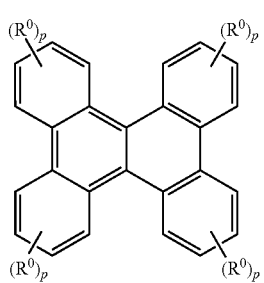

(1)

In the formula (1), each $R^0$ is independently a monovalent group having an oxygen atom, a monovalent group having a sulfur atom, a monovalent group having a nitrogen atom, a hydrocarbon group, or a halogen atom. Each p is independently an integer of 0 to 4.

By virtue of the above configuration, the resist material of the present embodiment is excellent in heat resistance and etching resistance, has high solubility in a safe solvent, has high sensitivity, and can impart a good shape to a resist pattern. The resist material of the present embodiment has high heat resistance derived from a polycyclic aromatic structure (dibenzo[g,p]chrysene skeleton) and may be used even under high temperature baking conditions. Since the resist material of the present embodiment may be baked at a high temperature, the resist material is highly sensitive and can impart a good shape to a resist pattern. In addition, the resist material of the present embodiment has the above polycyclic aromatic structure and is therefore also excellent in etching resistance. Furthermore, the resist material of the present embodiment, albeit having the polycyclic aromatic structure, is highly soluble in an organic solvent, is highly soluble in a safe solvent, and has the good stability of product quality.

Herein, examples of the monovalent group having an oxygen atom include, but not limited to, an acyl group having 1 to 20 carbon atoms, an alkoxycarbonyl group having 2 to 20 carbon atoms, a linear alkyloxy group having 1 to 6 carbon atoms, a branched alkyloxy group having 3 to 20 carbon atoms, a cyclic alkyloxy group having 3 to 20 carbon atoms, a linear alkenyloxy group having 2 to 6 carbon atoms, a branched alkenyloxy group having 3 to 6 carbon atoms, a cyclic alkenyloxy group having 3 to 10 carbon atoms, an aryloxy group having 6 to 10 carbon atoms, an acyloxy group having 1 to 20 carbon atoms, an alkoxycarbonyloxy group having 2 to 20 carbon atoms, an alkoxycarbonylalkyl group having 2 to 20 carbon atoms, a 1-substituted alkoxymethyl group having 2 to 20 carbon atoms, a cyclic ether oxy group having 2 to 20 carbon atoms, an alkoxyalkyloxy group having 2 to 20 carbon atoms, a glycidyloxy group, an allyloxy group, a (meth)acryl group, a glycidyl acrylate group, a glycidyl methacrylate group, and a hydroxyl group.

Examples of the acyl group having 1 to 20 carbon atoms include, but not limited to, a methanoyl group (formyl group), an ethanoyl group (acetyl group), a propanoyl group, a butanoyl group, a pentanoyl group, a hexanoyl group, an octanoyl group, a decanoyl group, and a benzoyl group.

Examples of the alkoxycarbonyl group having 2 to 20 carbon atoms include, but not limited to, a methoxycarbonyl group, an ethoxycarbonyl group, a propoxycarbonyl group, a butoxycarbonyl group, a pentyloxycarbonyl group, a hexyloxycarbonyl group, an octyloxycarbonyl group, and a decyloxycarbonyl group.

Examples of the linear alkyloxy group having 1 to 6 carbon atoms include, but not limited to, a methoxy group, an ethoxy group, a n-propoxy group, a n-butoxy group, a n-pentyloxy group, and a n-hexyloxy group.

Examples of the branched alkyloxy group having 3 to 20 carbon atoms include, but not limited to, an isopropoxy group, an isobutoxy group, and a tert-butoxy group.

Examples of the cyclic alkyloxy group having 3 to 20 carbon atoms include, but not limited to, a cyclopropoxy group, a cyclobutoxy group, a cyclopentyloxy group, a cyclohexyloxy group, a cyclooctyloxy group, and a cyclodecyloxy group.

Examples of the linear alkenyloxy group having 2 to 6 carbon atoms include, but not limited to, a vinyloxy group, a 1-propenyloxy group, a 2-propenyloxy group, a 1-butenyloxy group, and a 2-butenyloxy group.

Examples of the branched alkenyloxy group having 3 to 6 carbon atoms include, but not limited to, an isopropenyloxy group, an isobutenyloxy group, an isopentenyloxy group, and an isohexenyloxy group.

Examples of the cyclic alkenyloxy group having 3 to 10 carbon atoms include, but not limited to, a cyclopropenyloxy group, a cyclobutenyloxy group, a cyclopentenyloxy group, a cyclohexenyloxy group, a cyclooctenyloxy group, and a cyclodecenyloxy group.

Examples of the aryloxy group having 6 to 10 carbon atoms include, but not limited to, a phenyloxy group (phenoxy group), a 1-naphthyloxy group, and a 2-naphthyloxy group.

Examples of the acyloxy group having 1 to 20 carbon atoms include, but not limited to, a formyloxy group, an acetyloxy group, a propionyloxy group, a butyryloxy group, an isobutyryloxy group, and a benzoyloxy group.

Examples of the alkoxycarbonyloxy group having 2 to 20 carbon atoms include, but not limited to, a methoxycarbonyloxy group, an ethoxycarbonyloxy group, a propoxycarbonyloxy group, a butoxycarbonyloxy group, an octyloxycarbonyloxy group, and a decyloxycarbonyloxy group.

Examples of the alkoxycarbonylalkyl group having 2 to 20 carbon atoms include, but not limited to, a methoxycarbonylmethyl group, an ethoxycarbonylmethyl group, a n-propoxycarbonylmethyl group, an isopropoxycarbonylmethyl group, and a n-butoxycarbonylmethyl group.

Examples of the 1-substituted alkoxymethyl group having 2 to 20 carbon atoms include, but not limited to, a 1-cyclopentylmethoxymethyl group, a 1-cyclopentylethoxymethyl group, a 1-cyclohexylmethoxymethyl group, a 1-cyclohexylethoxymethyl group, a 1-cyclooctylmethoxymethyl group, and a 1-adamantylmethoxymethyl group.

Examples of the cyclic ether oxy group having 2 to 20 carbon atoms include, but not limited to, a tetrahydropyranyloxy group, a tetrahydrofuranyloxy group, a tetrahydrothiopyranyloxy group, a tetrahydrothiofuranyloxy group, a 4-methoxytetrahydropyranyloxy group, and a 4-methoxytetrahydrothiopyranyloxy group.

Examples of the alkoxyalkyloxy group having 2 to 20 carbon atoms include, but not limited to, a methoxymethoxy group, an ethoxyethoxy group, a cyclohexyloxymethoxy group, a cyclohexyloxyethoxy group, a phenoxymethoxy group, and a phenoxyethoxy group.

Examples of the (meth)acryl group include, but not limited to, an acryloyloxy group and a methacryloyloxy group. The glycidyl acrylate group is not particularly limited as long as the glycidyl acrylate group can be obtained through the reaction of acrylic acid with a glycidyloxy group. Examples thereof include substituents in compounds shown in Synthesis Example 11 in Examples mentioned later. The glycidyl methacrylate group is not particularly limited as long as the glycidyl methacrylate group can be obtained through the reaction of methacrylic acid with a glycidyloxy group. Examples thereof include substituents in compounds shown in Synthesis Example 12 in Examples mentioned later.

Examples of the monovalent group having a sulfur atom include, but not limited to, a thiol group. The monovalent group having a sulfur atom is preferably a group in which the sulfur atom is directly bonded to a carbon atom constituting the dibenzo[g,p]chrysene skeleton.

Examples of the monovalent group having a nitrogen atom include, but not limited to, a nitro, an amino group, and a diazo group. The monovalent group having a nitrogen atom is preferably a group in which the nitrogen atom is directly bonded to a carbon atom constituting the dibenzo[g,p]chrysene skeleton.

Examples of the hydrocarbon group include, but not limited to, a linear alkyl group having 1 to 6 carbon atoms, a branched alkyl group having 3 to 6 carbon atoms, a cyclic alkyl group having 3 to 10 carbon atoms, a linear alkenyl group having 2 to 6 carbon atoms, a branched alkenyl group having 3 to 6 carbon atoms, a cyclic alkenyl group having 3 to 10 carbon atoms, and an aryl group having 6 to 10 carbon atoms.

Examples of the linear alkyl group having 1 to 6 carbon atoms include, but not limited to, a methyl group, an ethyl group, a n-propyl group, a n-butyl group, a n-pentyl group, and a n-hexyl group.

Examples of the branched alkyl group having 3 to 6 carbon atoms include, but not limited to, an isopropyl group, an isobutyl group, a tert-butyl group, a neopentyl group, and a 2-hexyl group.

Examples of the cyclic alkyl group having 3 to 10 carbon atoms include, but not limited to, a cyclopropyl group, a cyclobutyl group, a cyclopentyl group, a cyclohexyl group, a cyclooctyl group, and a cyclodecyl group.

Examples of the linear alkenyl group having 2 to 6 carbon atoms include, but not limited to, a vinyl group, a 1-propenyl group, a 2-propenyl group (allyl group), a 1-butenyl group, a 2-butenyl group, a 2-pentenyl group, and a 2-hexenyl group.

Examples of the branched alkenyl group having 3 to 6 carbon atoms include, but not limited to, an isopropenyl group, an isobutenyl group, an isopentenyl group, and an isohexenyl group.

Examples of the cyclic alkenyl group having 3 to 10 carbon atoms include, but not limited to, a cyclopropenyl group, a cyclobutenyl group, a cyclopentenyl group, a cyclohexenyl group, a cyclohexenyl group, a cyclooctenyl group, and a cyclodecenyl group.

Examples of the aryl group having 6 to 10 carbon atoms include, but not limited to, a phenyl group and a naphthyl group.

Examples of the halogen atom include, but not limited to, a fluorine atom, a chlorine atom, a bromine atom, and an iodine atom.

In the present embodiment, at least one of p in the above formula (1) is preferably an integer of 1 to 4 from the viewpoint of solubility in a solvent.

In the present embodiment, at least one of $R^0$ in the above formula (1) is preferably a monovalent group having an oxygen atom from the viewpoint of solubility in a solvent and imparting of crosslinkability.

The compound represented by the above formula (1) is preferably a compound represented by the formula (2) from the viewpoint of having both of high heat resistance and high solubility.

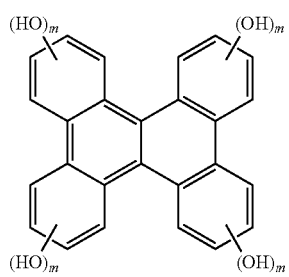

(2)

In the formula (2), each m is independently an integer of 0 to 4. Herein, at least one of m is an integer of 1 to 4.

The compound represented by the above formula (2) has high heat resistance, in spite of its low molecular weight. Since the compound represented by the formula (2) may be baked at a high temperature, the compound is highly sensitive and can impart a good shape to a resist pattern. By having a phenolic hydroxyl group, the compound represented by the formula (2) can further enhance solubility in an organic solvent. In addition, the compound represented by the formula (2) can be expected to be effective for amplifying an acid by the action of radiation.

The resist material comprising the compound represented by the above formula (2) is suitably used as, for example, a base material for negative type resists and also suitably used as a sensitivity adjuster for positive type and negative type resists.

The compound represented by the above formula (2) is more preferably at least one kind selected from a compound group represented by the formulas (2-1) to (2-6) from the viewpoint that the compound is highly sensitive and can impart a good shape to a resist pattern.

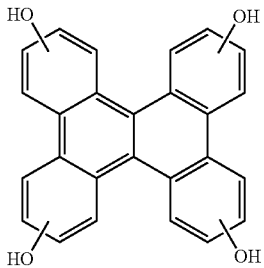

(2-1)

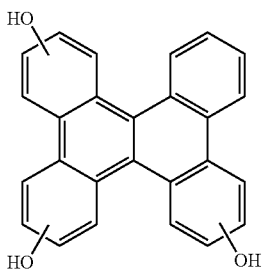

(2-2)

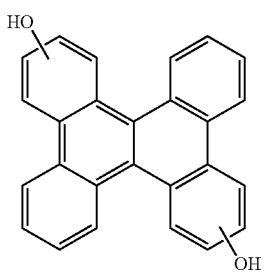

(2-3)

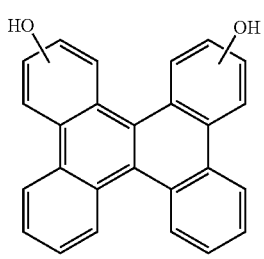

(2-4)

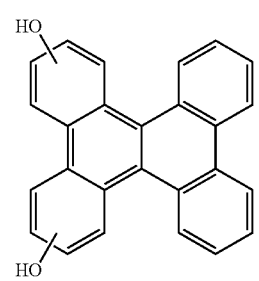

(2-5)

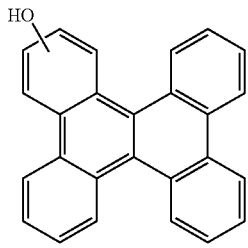

(2-6)

Also, the compound represented by the above formula (1) is preferably a compound represented by the formula (3) from the viewpoint of having both of high heat resistance and high solubility.

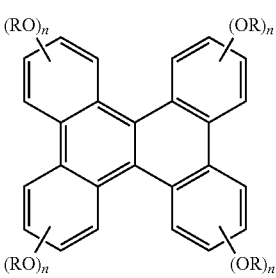

(3)

In the above formula (3), each R is independently a hydrogen atom or an acid dissociation reactive group. Herein, at least one of R is an acid dissociation reactive group. Each n is independently an integer of 0 to 4. Herein, at least one of n is an integer of 1 to 4.

In the present specification, the acid dissociation reactive group refers to a characteristic group that is cleaved in the presence of an acid and thereby converted to, for example, an alkali soluble group. Examples of the alkali soluble group include, but not limited to, a phenolic hydroxyl group, a carboxyl group, a sulfonic acid group, and a hexafluoroisopropanol group. The alkali soluble group is preferably a phenolic hydroxyl group or a carboxyl group, and more preferably a phenolic hydroxyl group.

The acid dissociation reactive group can be arbitrarily selected for use from a hydroxystyrene-based resin, a (meth)acrylic acid-based resin, and the like for use in chemical amplification type resist compositions for KrF or ArF. Preferred examples of the acid dissociation reactive group include a group selected from the group consisting of a substituted methyl group, a 1-substituted ethyl group, a 1-substituted n-propyl group, a 1-branched alkyl group, a silyl group, an acyl group, a 1-substituted alkoxymethyl group, a cyclic ether group, an alkoxycarbonyl group, and an alkoxycarbonylalkyl group. It is preferable that the acid dissociation reactive group should have no crosslinkable functional group.

The substituted methyl group is not particularly limited and can usually be a substituted methyl group having 2 to 20 carbon atoms, preferably a substituted methyl group having 4 to 18 carbon atoms, and more preferably a substituted methyl group having 6 to 16 carbon atoms. Specific examples of the substituted methyl group can include, but not limited to, a methoxymethyl group, a methylthiomethyl group, an ethoxymethyl group, a n-propoxymethyl group, an isopropoxymethyl group, a n-butoxymethyl group, a t-butoxymethyl group, a 2-methylpropoxymethyl group, an ethylthiomethyl group, a methoxyethoxymethyl group, a phenyloxymethyl group, a 1-cyclopentyloxymethyl group, a 1-cyclohexyloxymethyl group, a benzylthiomethyl group, a phenacyl group, a 4-bromophenacyl group, a 4-methoxyphenacyl group, a piperonyl group, and a substituent represented by the formula (13-1) shown below. Specific examples of $R^2$ in the following formula (13-1) include, but not limited to, a methyl group, an ethyl group, an isopropyl group, a n-propyl group, a t-butyl group, and a n-butyl group.

(13-1)

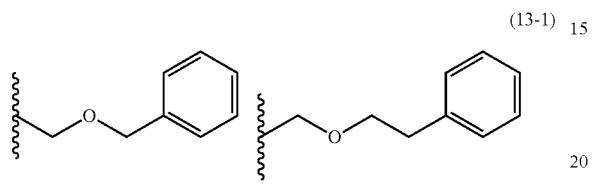

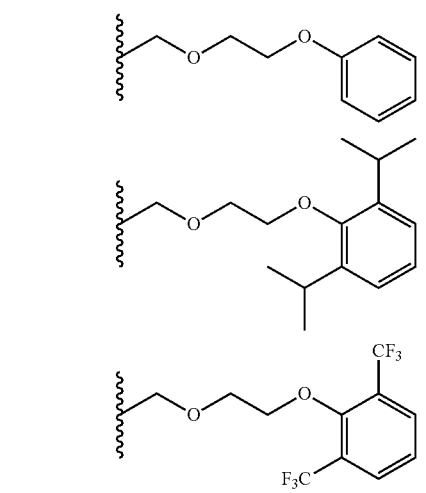

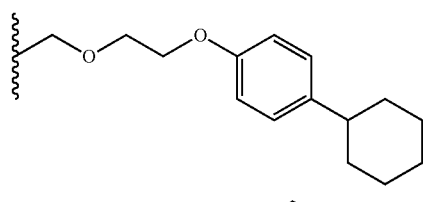

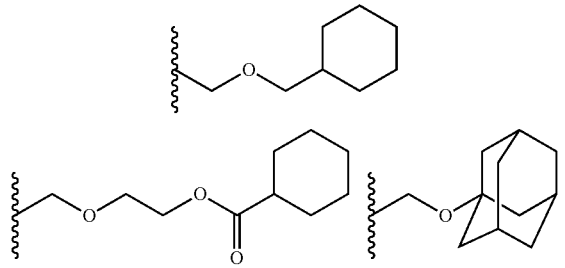

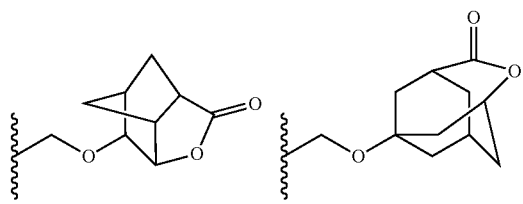

-continued

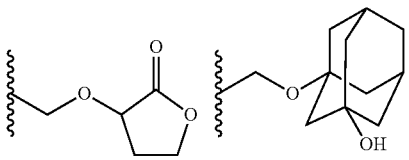

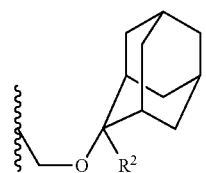

In the above formula (13-1), $R^2$ is an alkyl group having 1 to 4 carbon atoms.

The 1-substituted ethyl group is not particularly limited and can usually be a 1-substituted ethyl group having 3 to 20 carbon atoms, preferably a 1-substituted ethyl group having 5 to 18 carbon atoms, and more preferably a substituted ethyl group having 7 to 16 carbon atoms. Specific examples of the 1-substituted ethyl group can include, but not limited to, a 1-methoxyethyl group, a 1-methylthioethyl group, a 1,1-dimethoxyethyl group, a 1-ethoxyethyl group, a 1-ethylthioethyl group, a 1,1-diethoxyethyl group, a n-propoxyethyl group, an isopropoxyethyl group, a n-butoxyethyl group, a t-butoxyethyl group, a 2-methylpropoxyethyl group, a 1-phenoxyethyl group, a 1-phenylthioethyl group, a 1,1-diphenoxyethyl group, a 1-cyclopentyloxyethyl group, a 1-cyclohexyloxyethyl group, a 1-phenylethyl group, a 1,1-diphenylethyl group, and a substituent represented by the following formula (13-2).

(13-2)

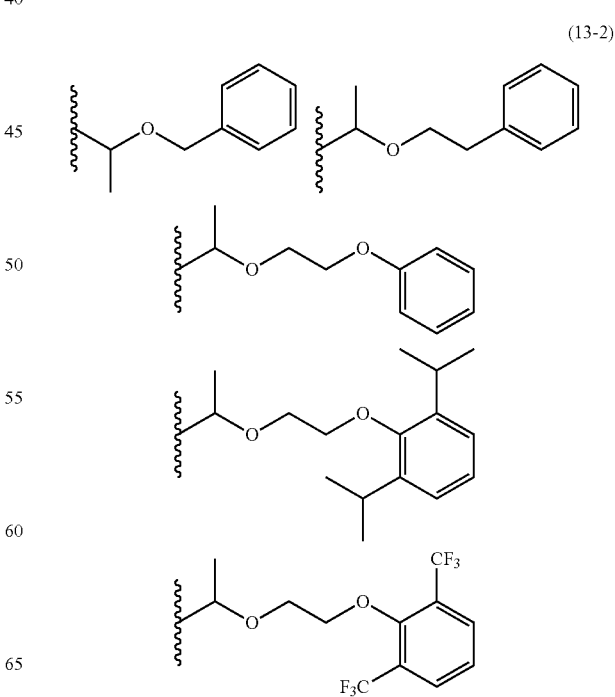

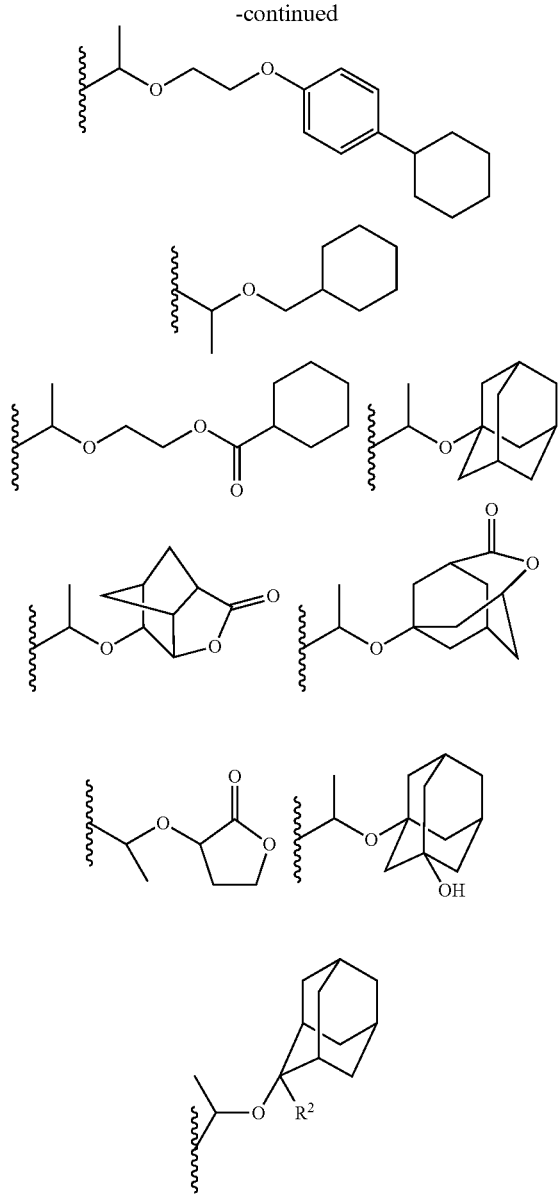

In the above formula (13-2), R² is the same as above.

The 1-substituted n-propyl group is not particularly limited and can usually be a 1-substituted n-propyl group having 4 to 20 carbon atoms, preferably a 1-substituted n-propyl group having 6 to 18 carbon atoms, and more preferably a 1-substituted n-propyl group having 8 to 16 carbon atoms. Specific examples of the 1-substituted n-propyl group can include, but not limited to, a 1-methoxy-n-propyl group and a 1-ethoxy-n-propyl group.

The 1-branched alkyl group is not particularly limited and can usually be a 1-branched alkyl group having 3 to 20 carbon atoms, preferably a 1-branched alkyl group having 5 to 18 carbon atoms, and more preferably a branched alkyl group having 7 to 16 carbon atoms. Specific examples of the 1-branched alkyl group can include, but not limited to, an isopropyl group, a sec-butyl group, a tert-butyl group, a 1,1-dimethylpropyl group, a 1-methylbutyl group, a 1,1-dimethylbutyl group, a 2-methyladamantyl group, and a 2-ethyladamantyl group.

The silyl group is not particularly limited and can usually be a silyl group having 1 to 20 carbon atoms, preferably a silyl group having 3 to 18 carbon atoms, and more preferably a silyl group having 5 to 16 carbon atoms. Specific examples of the silyl group can include, but not limited to, a trimethylsilyl group, an ethyldimethylsilyl group, a methyldiethylsilyl group, a triethylsilyl group, a tert-butyldimethylsilyl group, a tert-butyldiethylsilyl group, a tert-butyldiphenylsilyl group, a tri-tert-butylsilyl group, and a triphenylsilyl group.

The acyl group is not particularly limited and can usually be an acyl group having 2 to 20 carbon atoms, preferably an acyl group having 4 to 18 carbon atoms, and more preferably an acyl group having 6 to 16 carbon atoms. Specific examples of the acyl group can include, but not limited to, an acetyl group, a phenoxyacetyl group, a propionyl group, a butyryl group, a heptanoyl group, a hexanoyl group, a valeryl group, a pivaloyl group, an isovaleryl group, a lauroyl group, an adamantylcarbonyl group, a benzoyl group, and a naphthoyl group.

The 1-substituted alkoxymethyl group is not particularly limited and can usually be a 1-substituted alkoxymethyl group having 2 to 20 carbon atoms, preferably a 1-substituted alkoxymethyl group having 4 to 18 carbon atoms, and more preferably a 1-substituted alkoxymethyl group having 6 to 16 carbon atoms. Specific examples of the 1-substituted alkoxymethyl group can include, but not limited to, a 1-cyclopentylmethoxymethyl group, a 1-cyclopentylethoxymethyl group, a 1-cyclohexylmethoxymethyl group, a 1-cyclohexylethoxymethyl group, a 1-cyclooctylmethoxymethyl group, and a 1-adamantylmethoxymethyl group.

The cyclic ether group is not particularly limited and can usually be a cyclic ether group having 2 to 20 carbon atoms, preferably a cyclic ether group having 4 to 18 carbon atoms, and more preferably a cyclic ether group having 6 to 16 carbon atoms. Specific examples of the cyclic ether group can include, but not limited to, a tetrahydropyranyl group, a tetrahydrofuranyl group, a tetrahydrothiopyranyl group, a tetrahydrothiofuranyl group, a 4-methoxytetrahydropyranyl group, and a 4-methoxytetrahydrothiopyranyl group.

The alkoxycarbonyl group can usually be an alkoxycarbonyl group having 2 to 20 carbon atoms, preferably an alkoxycarbonyl group having 4 to 18 carbon atoms, and more preferably an alkoxycarbonyl group having 6 to 16 carbon atoms. Specific examples of the alkoxycarbonyl group can include, but not limited to, a methoxycarbonyl group, an ethoxycarbonyl group, a n-propoxycarbonyl group, an isopropoxycarbonyl group, a n-butoxycarbonyl group, a tert-butoxycarbonyl group, and an acid dissociation reactive group represented by the formula (13-3) shown below wherein n=0.

The alkoxycarbonylalkyl group is not particularly limited and can usually be an alkoxycarbonylalkyl group having 2 to 20 carbon atoms, preferably an alkoxycarbonylalkyl group having 4 to 18 carbon atoms, and more preferably an alkoxycarbonylalkyl group having 6 to 16 carbon atoms. Specific examples of the alkoxycarbonylalkyl group can include, but not limited to, a methoxycarbonylmethyl group, an ethoxycarbonylmethyl group, a n-propoxycarbonylmethyl group, an isopropoxycarbonylmethyl group, a n-butoxycarbonylmethyl group, and an acid dissociation reactive group represented by the following formula (13-3) wherein n=1 to 4.

(13-3)

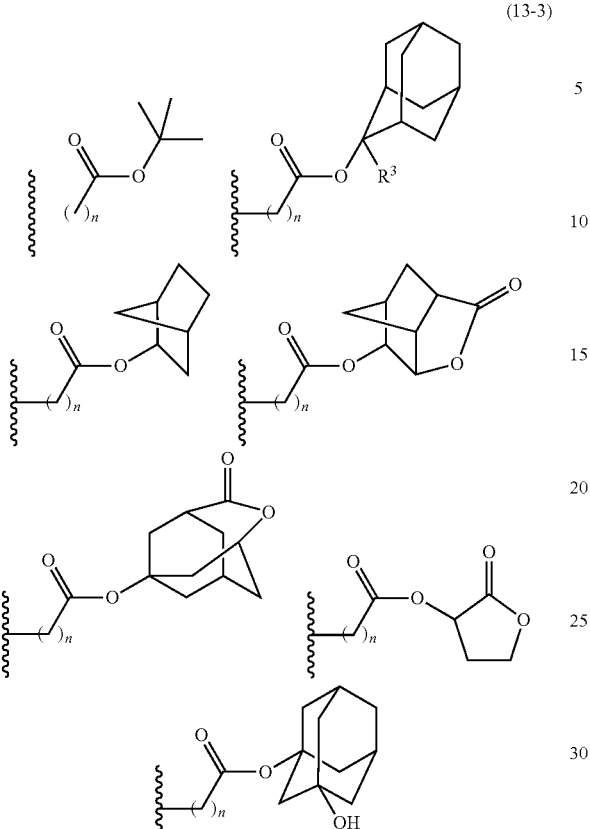

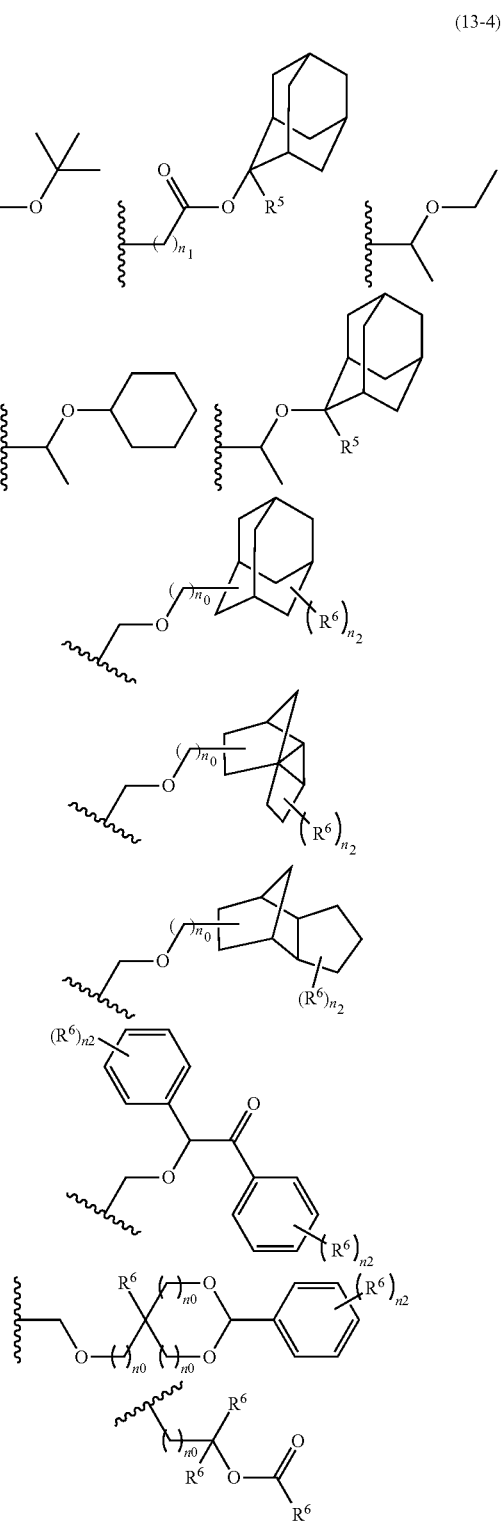

In the above formula (13-3), $R^3$ is a hydrogen atom or a linear or branched alkyl group having 1 to 4 carbon atoms, and n is an integer of 0 to 4.

Among these acid dissociation reactive groups, a substituted methyl group, a 1-substituted ethyl group, a 1-substituted alkoxymethyl group, a cyclic ether group, an alkoxycarbonyl group, and an alkoxycarbonylalkyl group are preferable. A substituted methyl group, a 1-substituted ethyl group, an alkoxycarbonyl group, and an alkoxycarbonylalkyl group are more preferable from the viewpoint of exerting higher sensitivity. An acid dissociation reactive group having a structure selected from a cycloalkane having 3 to 12 carbon atoms, a lactone, and an aromatic ring having 6 to 12 carbon atoms is further preferable. The cycloalkane having 3 to 12 carbon atoms may be monocyclic or polycyclic, but is preferably polycyclic. Specific examples of the cycloalkane having 3 to 12 carbon atoms include, but not limited to, monocycloalkanes, bicycloalkanes, tricycloalkanes, and tetracycloalkanes. More specific examples thereof include, but not limited to: monocycloalkanes such as cyclopropane, cyclobutane, cyclopentane, and cyclohexane; and polycycloalkanes such as adamantane, norbornane, isobornane, tricyclodecane, and tetracyclodecane. Among them, adamantane, tricyclodecane, and tetracyclodecane are preferable, and adamantane and tricyclodecane are more preferable. The cycloalkane having 3 to 12 carbon atoms may have a substituent. Examples of the lactone include, but not limited to, butyrolactone, and a cycloalkane group having 3 to 12 carbon atoms and having a lactone group. Examples of the aromatic ring having 6 to 12 carbon atoms include, but not limited to, a benzene ring, a naphthalene ring, an anthracene ring, a phenanthrene ring, and a pyrene ring. A benzene ring and a naphthalene ring are preferable, and a naphthalene ring is more preferable.

Particularly, an acid dissociation reactive group selected from the group consisting of groups represented by the following formula (13-4) is preferable because of high resolution.

(13-4)

In the above formula (13-4), $R^5$ is a hydrogen atom, or a linear or branched alkyl group having 1 to 4 carbon atoms, $R^6$ is a hydrogen atom, a linear or branched alkyl group having 1 to 4 carbon atoms, a cyano group, a nitro group, a heterocyclic group, a halogen atom, or a carboxyl group, $n_1$ is an integer of 0 to 4, $n_2$ is an integer of 1 to 5, and $n_0$ is an integer of 0 to 4.

The compound represented by the above formula (3) has high heat resistance, in spite of its low molecular weight. Since the compound represented by the formula (3) may be baked at a high temperature, the compound is highly sensitive and can impart a good shape to a resist pattern. By having an acid dissociation reactive group, the compound represented by the formula (3) can further enhance solubility in an organic solvent.

The resist material comprising the compound represented by the above formula (3) is suitably used as, for example, a base material for positive type resists and also suitably used as a sensitivity adjuster for positive type and negative type resists.

The compound represented by the above formula (3) is more preferably a compound represented by any of the formulas (3-1) to (3-6) from the viewpoint that the compound is highly sensitive and can impart a good shape to a resist pattern.

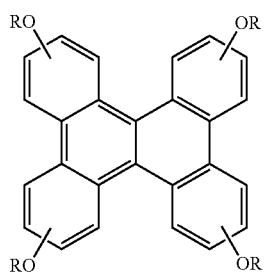
(3-1)

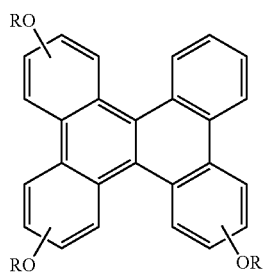
(3-2)

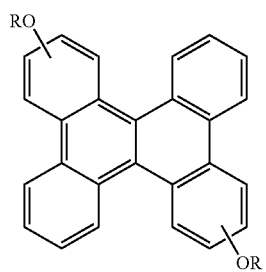
(3-3)

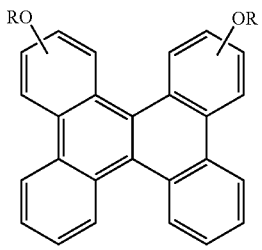
(3-4)

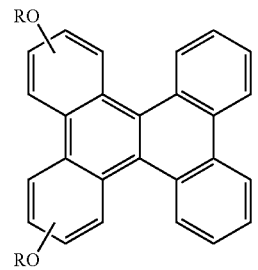
(3-5)

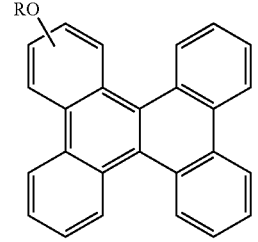
(3-6)

The compound represented by the above formula (1) can be produced by a publicly known method. Examples of the above method include, but not limited to, a method described in Japanese Patent Application Laid-Open No. 2013-227307. Also, the compound represented by the above formula (2) can be obtained, for example, by the sulfonation of dibenzo[g,p]chrysene, followed by the hydroxylation of the obtained dibenzo[g,p]chrysene sulfonate. Alternatively, the compound represented by the above formula (2) can be obtained by obtaining a diazonium salt by the diazotization of the amino group of aminodibenzo[g,p]chrysene, followed by the decomposition of the obtained diazonium salt.

The compound represented by the above formula (2) may be purified, if necessary, in order to improve purity and reduce the residual amount of metals. If an acid catalyst and a promoter remain, the storage stability of the resist composition generally tends to be lower. If a basic catalyst remains, the sensitivity of the resist composition generally tends to be lower. Therefore, the compound represented by the above formula (2) may be purified for the purpose of reducing the residual amounts of these catalysts. The purification can be performed by a publicly known method without denaturing the compound represented by the formula (2). Examples thereof include, but not particularly limited to, a method of washing the compound with water, a method of washing the compound with an acidic aqueous solution, a method of washing the compound with a basic aqueous solution, a method of treating the compound with an ion exchange resin, and a method of treating the compound by silica gel column chromatography. These purification methods are preferably performed in combination of two or more kinds. The acidic aqueous solution, the basic aqueous solution, the ion exchange resin, and the silica gel column chromatography may be arbitrarily selected as optimum ones according to the metals to be removed, the amount and type of an acidic compound and/or a basic compound, the type of the compound represented by the formula (2) to be purified. Specifically, examples of the acidic aqueous solution include an aqueous solution of hydrochloric acid, nitric acid, or acetic acid having a concentration of 0.01 to 10 mol/L. Examples of the basic aqueous solution include an aqueous solution of ammonia having a concentration of 0.01 to 10 mol/L. Examples of the ion exchange resin include a cation exchange resin (e.g., Amberlyst 15J-HG Dry manufactured by Organo Corp.). After the purification, the compound may be dried. The drying can be performed by a publicly known method. Examples thereof include, but not particularly limited to, a method of drying the compound represented by the formula (2) in vacuum or in hot air under conditions that do not denature the compound.

The compound represented by the above formula (3) can be produced, for example, through the reaction of the compound represented by the formula (2) with an acid dissociation reactive group introducing agent (B) in the presence of a catalyst.

The acid dissociation reactive group introducing agent (B) is not particularly limited, and a publicly known one, for example, an acid chloride, an acid anhydride, an active carboxylic acid derivative compound (e.g., dicarbonate), an alkyl halide, a vinyl alkyl ether, dihydropyran, or a halocarboxylic acid alkyl ester is used. Specific examples of the acid dissociation reactive group introducing agent (B) include, but not limited to, di-t-butyl dicarbonate, t-butyl bromoacetate, 2-methyl-2-adamantyl bromoacetate, and 1-adamantyl bromoacetate. These agents are readily available by synthesis according to publicly known methods or as reagents. One kind or two kinds or more of these acid dissociation reactive group introducing agents (B) can be used.

When the acid dissociation reactive group is introduced to at least one phenolic hydroxyl group in the compound represented by the above formula (2) in order to obtain the compound represented by the above formula (3), the acid dissociation reactive group can be introduced to at least one phenolic hydroxyl group in the compound represented by the formula (2), for example, as follows.

For example, the compound represented by the formula (2) is dissolved or suspended in an aprotic solvent such as acetone, tetrahydrofuran (THF), or propylene glycol monomethyl ether acetate. Subsequently, a vinyl alkyl ether (e.g., ethyl vinyl ether) or dihydropyran is added to the solution or the suspension, and the mixture is reacted at 20 to 60° C. at normal pressure for 6 to 72 hours in the presence of an acid catalyst such as pyridinium p-toluenesulfonate. The reaction solution is neutralized with an alkali compound and added to distilled water to precipitate a white solid. Then, the separated white solid can be washed with distilled water and dried to obtain the resist material of the present embodiment.

Alternatively, the resist material of the present embodiment can also be obtained by the following method: first, the compound represented by the formula (2) is dissolved or suspended in an aprotic solvent such as acetone, THF, or propylene glycol monomethyl ether acetate. Subsequently, an alkyl halide (e.g., ethyl chloromethyl ether) or a halocarboxylic acid alkyl ester (e.g., methyladamantyl bromoacetate) is added to the solution or the suspension, and the mixture is reacted at 20 to 110° C. at normal pressure for 6 to 72 hours in the presence of an alkali catalyst such as potassium carbonate. The reaction solution is neutralized with an acid such as hydrochloric acid and added to distilled water to precipitate a white solid. Then, the separated white solid can be washed with distilled water and dried to obtain the resist material of the present embodiment.

The resist material of the present embodiment may be purified, if necessary, in order to improve purity and reduce the residual amount of metals. The purification can be carried out in the same way as in the compound represented by the above formula (2).

Alternatively, the resist material of the present embodiment comprises a resin obtained through the reaction of at least the compound represented by the above formula (1) with a compound having crosslinking reactivity.

The compound having crosslinking reactivity is not particularly limited as long as the compound is capable of oligomerizing or polymerizing the compound represented by the above formula (1). A publicly known one can be used. Specific examples thereof include, but not limited to, an aldehyde, a ketone, a carboxylic acid, a carboxylic acid halide, a halogen-containing compound, an amino compound, an imino compound, an isocyanate, and an unsaturated hydrocarbon group-containing compound.

The above resin is preferably at least one kind selected from the group consisting of a novolac-based resin, an aralkyl-based resin, a hydroxystyrene-based resin, a (meth) acrylic acid-based resin, and a copolymer thereof from the viewpoint of having both of high heat resistance and high solubility.

Also, the above resin preferably has at least on structure selected from the group consisting of structures represented by the following formulas (4-1) to (4-16) from the viewpoint that the resin is highly sensitive and can impart a good shape to a resist pattern.

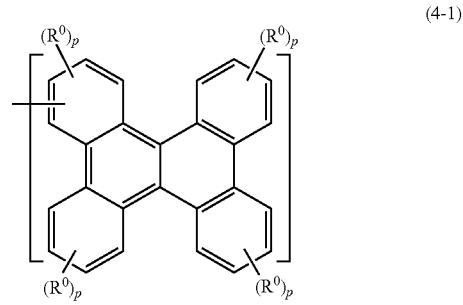

(4-1)

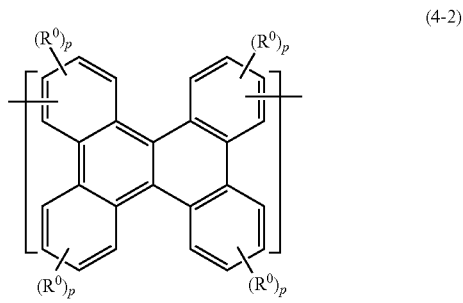

(4-2)

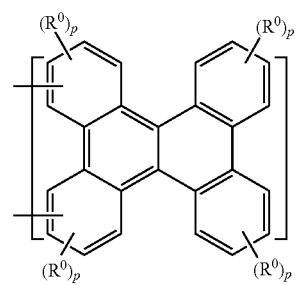
(4-3)
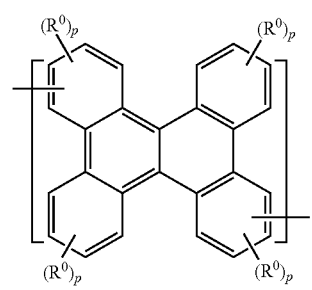
(4-4)
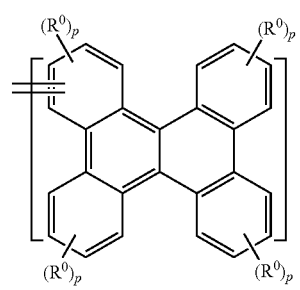
(4-5)
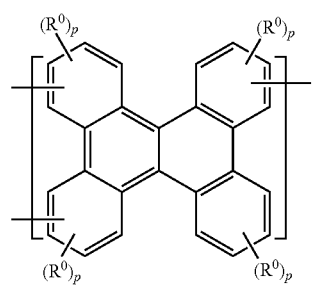
(4-6)
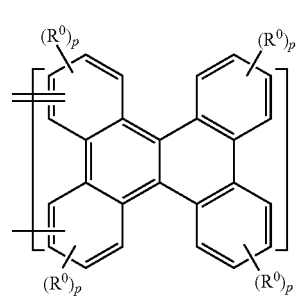
(4-7)
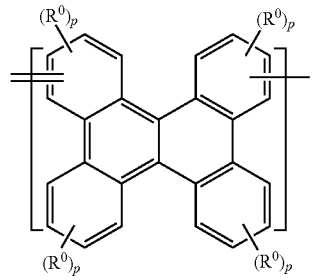
(4-8)
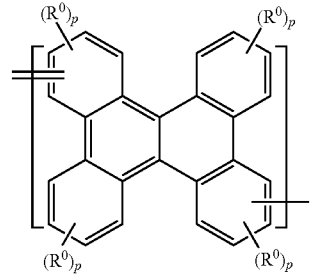
(4-9)
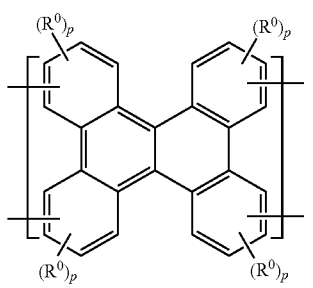
(4-10)
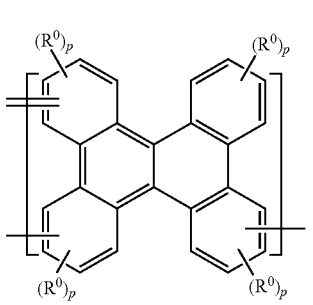
(4-11)
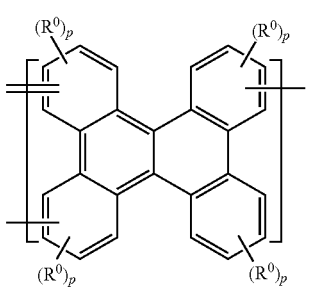
(4-12)

(4-13)
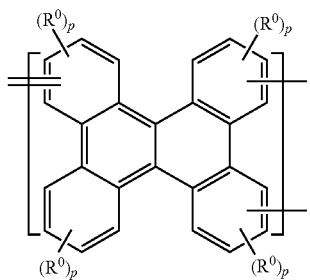

(4-14)
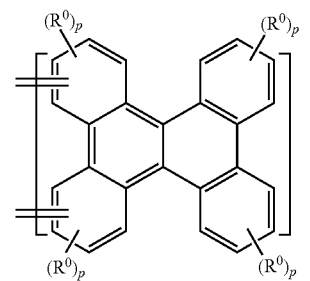

(4-15)
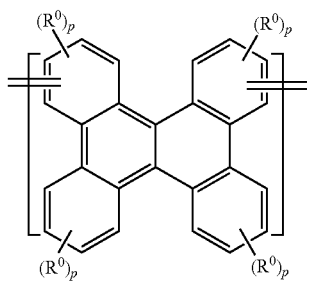

(4-16)
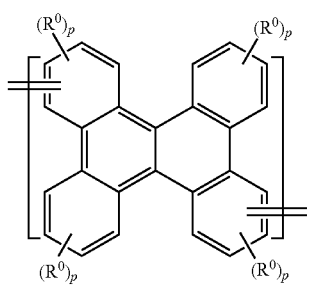

In the above formulas (4-1) to (4-16), $R^0$ and p are as defined in the above formula (1).

Specific examples of the resin having a structure represented by any of the above formulas (4-1) to (4-16) include a resin obtained by converting the compound represented by the above formula (2) to novolac through condensation reaction or the like with an aldehyde which is a compound having crosslinking reactivity.

Herein, examples of the aldehyde used in the conversion of the compound represented by the above formula (2) to novolac include, but not limited to, formaldehyde, trioxane, paraformaldehyde, benzaldehyde, acetaldehyde, propylaldehyde, phenylacetaldehyde, phenylpropylaldehyde, hydroxybenzaldehyde, chlorobenzaldehyde, nitrobenzaldehyde, methylbenzaldehyde, ethylbenzaldehyde, butylbenzaldehyde, biphenylaldehyde, and naphthaldehyde, anthracenecarboxaldehyde, phenanthrenecarboxaldehyde, pyrenecarboxaldehyde, and furfural. Among them, formaldehyde is preferable. These aldehydes may be used alone as one kind or may be used in combination of two or more kinds. The amount of the aldehyde used is not particularly limited, but is preferably 0.2 to 5 mol with respect to 1 mol of the compound represented by the above formula (2), and more preferably 0.5 to 2 mol.

A catalyst may be used in the condensation reaction of the compound represented by the above formula (2) with the aldehyde. Herein, the acid catalyst used can be arbitrarily selected for use from publicly known ones and is not particularly limited. An inorganic acid or an organic acid is widely known as such an acid catalyst. Examples thereof include, but not limited to: inorganic acids such as hydrochloric acid, sulfuric acid, phosphoric acid, hydrobromic acid, and hydrofluoric acid; organic acids such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, and naphthalenedisulfonic acid; Lewis acids such as zinc chloride, aluminum chloride, iron chloride, and boron trifluoride; and solid acids such as silicotungstic acid, phosphotungstic acid, silicomolybdic acid, and phosphomolybdic acid. Among them, an organic acid and a solid acid are preferable from the viewpoint of production. Hydrochloric acid or sulfuric acid is preferable from the viewpoint of production such as easy availability and handleability. These acid catalysts may be used alone as one kind or may be used in combination of two or more kinds.

The amount of the acid catalyst used can be arbitrarily set according to the types of the raw materials used and the catalyst used, reaction conditions, etc. The amount of the acid catalyst used is not particularly limited, but is preferably 0.01 to 100 parts by mass per 100 parts by mass of the reaction raw materials. In the case of copolymerization reaction with a compound having a non-conjugated boule bond, such as indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, or limonene, the aldehyde is not necessarily used.

A reaction solvent may be used in the condensation reaction of the compound represented by the above formula (2) with the aldehyde. The reaction solvent for this polycondensation can be arbitrarily selected for use from publicly known ones. Examples thereof include, but not particularly limited to, water, methanol, ethanol, propanol, butanol, tetrahydrofuran, dioxane, and mixed solvents thereof. These reaction solvents may be used alone as one kind or may be used in combination of two or more kinds. The amount of the reaction solvent used can be arbitrarily set according to the types of the raw materials used and the catalyst used, reaction conditions, etc. The amount of the reaction solvent used is not particularly limited, but is preferably within the range of 0 to 2000 parts by mass per 100 parts by mass of the reaction raw materials.

The reaction temperature can be arbitrarily selected according to the reactivity of the reaction raw materials. The reaction temperature is not particularly limited, but is usually within the range of 10 to 200° C. The reaction method can be arbitrarily selected for use from publicly known approaches. Examples thereof include, but not particularly limited to, a method of charging the compound represented by the above formula (2), the aldehyde, and the catalyst in one portion, and a method of dropping the compound represented by the above formula (2) and the aldehyde in the presence of the catalyst.

The obtained compound can be isolated according to a routine method without particular limitations after the polycondensation reaction terminates. The target novolac resin can be obtained by adopting a general approach in which, for example, the temperature of the reaction vessel is elevated to 130 to 230° C. in order to remove unreacted raw materials, catalyst, etc. present in the system, and volatile portions can be removed at about 1 to 50 mmHg.

Herein, the resin having a structure represented by any of the above formulas (4-1) to (4-16) may be a homopolymer of the compound represented by the above formula (2) or may be a copolymer with another phenol.

Herein, examples of the copolymerizable phenol include, but not limited to, phenol, cresol, dimethylphenol, trimethylphenol, butylphenol, phenylphenol, diphenylphenol, naphthylphenol, resorcinol, methylresorcinol, catechol, butylcatechol, methoxyphenol, methoxyphenol, propylphenol, pyrogallol, and thymol.

The resin having a structure represented by any of the above formulas (4-1) to (4-16) may be obtained by copolymerization with a polymerizable monomer except for another phenol mentioned above. Examples of such a copolymerizable monomer include, but not limited to, naphthol, methylnaphthol, methoxynaphthol, dihydroxynaphthalene, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, vinylnorbornene, pinene, and limonene. The resin having a structure represented by any of the above formulas (4-1) to (4-16) may be a binary or higher (e.g., binary to quaternary) copolymer of the compound represented by the above formula (2) and the above phenol, may be a binary or higher (e.g., binary to quaternary) copolymer of the compound represented by the above formula (2) and the above copolymerizable monomer, or may be a ternary or higher (e.g., ternary or quaternary) copolymer of the compound represented by the above formula (2), the above phenol, and the above copolymerizable monomer.

The molecular weight of the resin having a structure represented by any of the above formulas (4-1) to (4-16) is not particularly limited, but is preferably 500 to 300,000 in terms of polystyrene based weight average molecular weight (Mw), and more preferably 750 to 200,000. The dispersity (weight average molecular weight Mw/number average molecular weight Mn) of the resin having a structure represented by any of the above formulas (4-1) to (4-16) is preferably within the range of 1.1 to 7 from the viewpoint of enhancing crosslinking efficiency while suppressing volatile components during baking. These values of Mw, Mn, and dispersity (Mw/Mn) can be determined by methods described in Examples mentioned later.

The resist material of the present embodiment preferably has high solubility in a solvent from the viewpoint of, for example, further facilitating the application of a wet process. More specifically, in the case of using 1-methoxy-2-propanol (PGME) and/or propylene glycol monomethyl ether acetate (PGMEA) as a solvent, the solubility of the resist material (compound and/or resin) in the solvent is preferably 10% by mass or more. Herein, the solubility in PGME and/or PGMEA is defined by "Mass of the resin/(Mass of the resin+Mass of the solvent)×100 (% by mass)". For example, 10 g of the resist material is evaluated as being dissolved in 90 g of PGMEA when the solubility of the resist material in PGMEA is "10% by mass or more", and is evaluated as being not dissolved therein when the solubility is "less than 10% by mass".

[Resist Composition]

The resist composition of the present embodiment contains a resist material of the present embodiment and a solvent. The resist composition contains preferably 1 to 80% by mass of the solid component (containing a resist material of the present embodiment) and 20 to 99% by mass of the solvent, more preferably 1 to 50% by mass of the solid component and 50 to 99% by mass of the solvent, still more preferably 2 to 40% by mass of the solid component and 60 to 98% by mass of the solvent, and further more preferably 2 to 10% by mass of the solid component and 90 to 98% by mass of the solvent.

When the compound represented by the formula (2) (hereinafter, also referred to as compound (A)) is used as a base material for negative type resist compositions, the amount of the compound (A) used in the present embodiment is preferably 5 to 99.4% by mass of the total weight of the solid component (summation of optionally used solid component such as compound (A), acid generating agent (C), acid crosslinking agent (G), acid diffusion controlling agent (E), and other component (F), hereinafter the same), and more preferably 8 to 90% by mass. The above content tends to produce high resolution, and tends to decrease line edge roughness.

When the compound represented by the formula (3) (hereinafter, also referred to as compound (A')) is used as a base material for positive type resist compositions, the amount of the compound (A') used in the present embodiment is preferably 5 to 99.4% by mass of the total weight of the solid component (summation of optionally used solid component such as compound (A'), acid generating agent (C), acid diffusion controlling agent (E), and other component (F), hereinafter the same), and more preferably 8 to 90% by mass. The above content tends to produce high resolution, and tends to decrease line edge roughness.

The resist composition of the present embodiment preferably contains one or more acid generating agents (C) generating an acid directly or indirectly by irradiation of any radiation selected from visible light, ultraviolet, excimer laser, electron beam, extreme ultraviolet (EUV), X-ray, and ion beam. The amount of the acid generating agent (C) used is preferably 0.001 to 49% by mass of the total mass of the solid component, more preferably 1 to 40% by mass, still more preferably 3 to 30% by mass, and further more preferably 10 to 25% by mass. By using it within the above range, a pattern profile with higher sensitivity and low edge roughness tends to be obtained. In the present embodiment, the acid generation method in the system is not particularly limited. By using excimer laser instead of ultraviolet such as g-ray and i-ray, finer processing is possible, and also by using electron beam, extreme ultraviolet, X-ray or ion beam as a high energy ray, further finer processing is possible.

The acid generating agent (C) is preferably at least one kind selected from the group consisting of compounds represented by the following formulae (7-1) to (7-8):

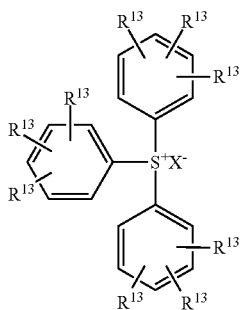

(7-1)

(In the formula (7-1), $R^{13}$ may be the same or different, and are each independently a hydrogen atom, a linear, branched or cyclic alkyl group, a linear, branched or cyclic alkoxy group, a hydroxyl group, or a halogen atom; $X^-$ is an alkyl group, an aryl group, a sulfonic acid ion having a halogen substituted alkyl group or a halogen substituted aryl group, or a halide ion.)

The compound represented by the above formula (7-1) is preferably at least one kind selected from the group consisting of triphenylsulfonium trifluoromethanesulfonate, triphenylsulfonium nonafluoro-n-butanesulfonate, diphenyltolylsulfonium nonafluoro-n-butanesulfonate, triphenylsulfonium perfluoro-n-octanesulfonate, diphenyl-4-methylphenylsulfonium trifluoromethanesulfonate, di-2,4,6-trimethylphenylsulfonium trifluoromethanesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-4-hydroxyphenylsulfonium nonafluoro-n-butanesulfonate, bis(4-hydroxyphenyl)-phenylsulfonium trifluoromethanesulfonate, tri(4-methoxyphenyl)sulfonium trifluoromethanesulfonate, tri(4-fluorophenyl)sulfonium trifluoromethanesulfonate, triphenylsulfonium p-toluenesulfonate, triphenylsulfonium benzenesulfonate, diphenyl-2,4,6-trimethylphenylsulfonium-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate, diphenyl-4-hydroxyphenylsulfonium 10-camphorsulfonate, and cyclo(1,3-perfluoropropanedisulfone)imidate.

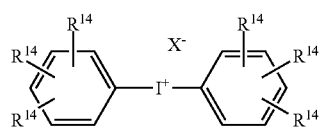

(7-2)

(In the formula (7-2), $R^{14}$ may be the same or different, and each independently represents a hydrogen atom, a linear, branched or cyclic alkyl group, a linear, branched or cyclic alkoxy group, a hydroxyl group, or a halogen atom. $X^-$ is the same as above.)

The compound represented by the above formula (7-2) is preferably at least one kind selected from the group consisting of bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzenesulfonate, diphenyliodonium hexafluorobenzenesulfonate, di(4-trifluoromethylphenyl)iodonium trifluoromethanesulfonate, di(4-trifluoromethylphenyl)iodonium nonafluoro-n-butanesulfonate, di(4-trifluoromethylphenyl)iodonium perfluoro-n-octanesulfonate, di(4-trifluoromethylphenyl)iodonium p-toluenesulfonate, di(4-trifluoromethylphenyl)iodonium benzenesulfonate, and di(4-trifluoromethylphenyl)iodonium 10-camphersulfonate.

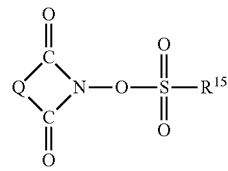

(7-3)

(In the formula (7-3), Q is an alkylene group, an arylene group, or an alkoxylene group, and $R^{15}$ is an alkyl group, an aryl group, a halogen substituted alkyl group, or a halogen substituted aryl group.)

The compound represented by the above formula (7-3) is preferably at least one kind selected from the group consisting of N-(trifluoromethylsulfonyloxy)succinimide, N-(trifluoromethylsulfonyloxy)phthalimide, N-(trifluoromethylsulfonyloxy) diphenylmaleimide, N-(trifluoromethylsulfonyloxy)bicyclo[2.2.1]hept-5-en-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-en-2,3-dicarboxyimide, N-(10-camphorsulfonyloxy) naphthylimide, N-(n-octanesulfonyloxy)bicyclo[2.2.1]hept-5-en-2,3-dicarboxyimide, N-(n-octanesulfonyloxy) naphthylimide, N-(p-toluenesulfonyloxy)bicyclo[2.2.1]hept-5-en-2,3-dicarboxyimide, N-(p-toluenesulfonyloxy) naphthylimide, N-(2-trifluoromethylbenzenesulfonyloxy) bicyclo[2.2.1]hept-5-en-2,3-dicarboxyimide, N-(2-trifluoromethylbenzenesulfonyloxy)naphthylimide, N-(4-trifluoromethylbenzenesulfonyloxy)bicyclo[2.2.1]hept-5-en-2,3-dicarboxyimide, N-(4-trifluoromethylbenzenesulfonyloxy)naphthylimide, N-(perfluorobenzenesulfonyloxy)bicyclo[2.2.1]hept-5-en-2,3-dicarboxyimide, N-(perfluorobenzenesulfonyloxy) naphthylimide, N-(1-naphthalenesulfonyloxy)bicyclo[2.2.1]

hept-5-en-2,3-dicarboxyimide, N-(1-naphthalenesulfonyloxy)naphthylimide, N-(nonafluoro-n-butanesulfonyloxy)bicyclo[2.2.1]hept-5-en-2,3-dicarboxyimide, N-(nonafluoro-n-butanesulfonyloxy)naphthylimide, N-(perfluoro-n-octanesulfonyloxy)bicyclo[2.2.1]hept-5-en-2,3-dicarboxyimide, and N-(perfluoro-n-octanesulfonyloxy)naphthylimide.

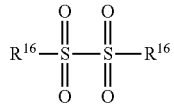
(7-4)

(In the formula (7-4), $R^{16}$ may be the same or different, and are each independently an optionally substituted linear, branched or cyclic alkyl group, an optionally substituted aryl group, an optionally substituted heteroaryl group, or an optionally substituted aralkyl group.)

The compound represented by the above formula (7-4) is preferably at least one kind selected from the group consisting of diphenyldisulfone, di(4-methylphenyl)disulfone, dinaphthyldisulfone, di(4-tert-butylphenyl)disulfone, di(4-hydroxyphenyl)disulfone, di(3-hydroxynaphthyl)disulfone, di(4-fluorophenyl)disulfone, di(2-fluorophenyl)disulfone, and di(4-trifluoromethylphenyl)disulfone.

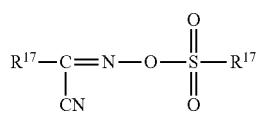
(7-5)

(In the formula (7-5), $R^{17}$ may be the same or different, and are each independently an optionally substituted linear, branched or cyclic alkyl group, an optionally substituted aryl group, an optionally substituted heteroaryl group, or an optionally substituted aralkyl group.)

The compound represented by the above formula (7-5) is preferably at least one kind selected from the group consisting of α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile.

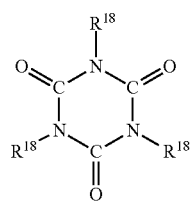
(7-6)

(In the formula (7-6), $R^{18}$ may be the same or different, and are each independently a halogenated alkyl group having one or more chlorine atoms and one or more bromine atoms. The number of carbon atoms in the halogenated alkyl group is preferably 1 to 5.)

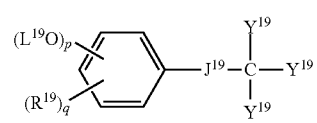
(7-7)

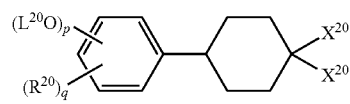
(7-8)

In the formulae (7-7) and (7-8), $R^{19}$ and $R^{20}$ are each independently an alkyl group having 1 to 3 carbon atoms such as a methyl group, an ethyl group, an n-propyl group, and an isopropyl group; a cycloalkyl group such as a cyclopentyl group and a cyclohexyl group; an alkoxyl group having 1 to 3 carbon atoms such as a methoxy group, an ethoxy group, and a propoxy group; or an aryl group such as a phenyl group, a toluoyl group, and a naphthyl group, and preferably an aryl group having 6 to 10 carbon atoms. $L^{19}$ and $L^{20}$ are each independently an organic group having a 1,2-naphthoquinonediazide group. Specifically, preferable examples of the organic group having a 1,2-naphthoquinonediazide group include a 1,2-quinonediazidesulfonyl group such as a 1,2-naphthoquinonediazide-4-sulfonyl group, a 1,2-naphthoquinonediazide-5-sulfonyl group, and a 1,2-naphthoquinonediazide-6-sulfonyl group. Among these, a 1,2-naphthoquinonediazide-4-sulfonyl group and a 1,2-naphthoquinonediazide-5-sulfonyl group are more preferable. p is an integer of 1 to 3; q is an integer of 0 to 4; and 1≤p+q≤5. $J^{19}$ is a single bond, a polymethylene group having 1 to 4 carbon atoms, a cycloalkylene group, a phenylene group, a group represented by the following formula (7-7-1), a carbonyl group, an ester group, an amide group, or an ether group. $Y^{19}$ is a hydrogen atom, an alkyl group, or an aryl group, and $X^{20}$ are each independently a group represented by the following formula (7-8-1):

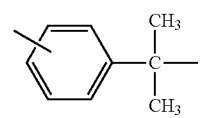
(7-7-1)

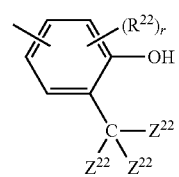
(7-8-1)

In the formula (7-8-1), $Z^{22}$ are each independently an alkyl group, a cycloalkyl group, or an aryl group; $R^{22}$ is an alkyl group, a cycloalkyl group, or an alkoxyl group; and r is an integer of 0 to 3.

Examples of the other acid generating agent include, but not limited to, bissulfonyldiazomethanes such as bis(p-toluenesulfonyl)diazomethane, bis(2,4-dimethylphenylsulfonyl)diazomethane, bis(tert-butylsulfonyl)diazomethane, bis(n-butylsulfonyl)diazomethane, bis(isobutylsulfonyl)diazomethane, bis(isopropylsulfonyl)diazomethane, bis(n-propylsulfonyl)diazomethane, bis(cyclohexylsulfonyl)diazomethane, bis(isopropylsulfonyl)diazomethane, 1,3-bis(cyclohexylsulfonylazomethylsulfonyl)propane, 1,4-bis (phenylsulfonylazomethylsulfonyl)butane, 1,6-bis(phenylsulfonylazomethylsulfonyl)hexane, and 1,10-bis(cyclohexylsulfonylazomethylsulfonyl)decane; and halogen-containing triazine derivatives such as 2-(4-methoxyphenyl)-4,6-(bistrichloromethyl)-1,3,5-triazine, 2-(4-methoxynaphthyl)-4,6-(bistrichloromethyl)-1,3,5-triazine, tris(2,3-dibromopropyl)-1,3,5-triazine, and tris(2,3-dibromopropyl)isocyanurate.

Among the acid generating agents, an acid generating agent having an aromatic ring is preferable, and an acid generating agent represented by the formula (7-1) or (7-2) is more preferable. Among these, an acid generating agent having a sulfonate ion wherein $X^-$ of the formula (7-1) or (7-2) has an aryl group or a halogen-substituted aryl group is still more preferable; an acid generating agent being a sulfonate ion wherein $X^-$ of the formula (7-1) or (7-2) has an aryl group is further more preferable; and diphenyltrimethylphenylsulfonium p-toluenesulfonate, triphenylsulfonium p-toluenesulfonate, triphenylsulfonium trifluoromethanesulfonate, and triphenylsulfonium nonafluoromethanesulfonate are particularly preferable. By using the acid generating agent, LER tends to be further reduced.

The acid generating agent (C) can be used alone or in combination of two or more kinds.

The resist composition of the present embodiment preferably contains one or more acid crosslinking agents (G). The acid crosslinking agent (G) is a compound capable of intramolecular or intermolecular crosslinking the compound represented by the formula (1) in the presence of the acid generated from the acid generating agent (C). Examples of such an acid crosslinking agent (G) include a compound having one or more groups (hereinafter, referred to as "crosslinkable group") capable of crosslinking the compound represented by the formula (1).

Specific examples of such a crosslinkable group include, but not limited to, (i) a hydroxyalkyl group such as a hydroxy (C1-C6 alkyl group), a C1-C6 alkoxy (C1-C6 alkyl group), and an acetoxy (C1-C6 alkyl group), or a group derived therefrom; (ii) a carbonyl group such as a formyl group and a carboxy (C1-C6 alkyl group), or a group derived therefrom; (iii) a nitrogenous group having group such as a dimethylaminomethyl group, a diethylaminomethyl group, a dimethylolaminomethyl group, a diethylolaminomethyl group, and a morpholinomethyl group; (iv) a glycidyl group having group such as a glycidyl ether group, a glycidyl ester group, and a glycidylamino group; (v) a group derived from an aromatic group such as a C1-C6 allyloxy (C1-C6 alkyl group) and a C1-C6 aralkyloxy (C1-C6 alkyl group) such as a benzyloxymethyl group and a benzoyloxymethyl group; and (vi) a polymerizable multiple bond-containing group such as a vinyl group and a isopropenyl group. As the crosslinkable group of the acid crosslinking agent (G) of the present embodiment, a hydroxyalkyl group and an alkoxyalkyl group or the like are preferable, and an alkoxymethyl group is more preferable.

Examples of the acid crosslinking agent (G) having the above crosslinkable group include, but not limited to, (i) a methylol group-containing compound such as a methylol group-containing melamine compound, a methylol group-containing benzoguanamine compound, a methylol group-containing urea compound, a methylol group-containing glycoluryl compound, and a methylol group-containing phenolic compound; (ii) an alkoxyalkyl group-containing compound such as an alkoxyalkyl group-containing melamine compound, an alkoxyalkyl group-containing benzoguanamine compound, an alkoxyalkyl group-containing urea compound, an alkoxyalkyl group-containing glycoluryl compound, and an alkoxyalkyl group-containing phenolic compound; (iii) a carboxymethyl group-containing compound such as a carboxymethyl group-containing melamine compound, a carboxymethyl group-containing benzoguanamine compound, a carboxymethyl group-containing urea compound, a carboxymethyl group-containing glycoluryl compound, and a carboxymethyl group-containing phenolic compound; (iv) an epoxy compound such as a bisphenol A based epoxy compound, a bisphenol F based epoxy compound, a bisphenol S based epoxy compound, a novolac resin based epoxy compound, a resol resin based epoxy compound, and a poly(hydroxystyrene) based epoxy compound.

As the acid crosslinking agent (G), a compound having a phenolic hydroxyl group, and a compound and resin where the above crosslinkable group is introduced into an acid functional group in an alkali soluble resin to impart crosslinkability can be further used. The introduction rate of the crosslinkable group in that case is adjusted to be usually 5 to 100 mol %, preferably 10 to 60 mol %, and more preferably 15 to 40 mol % based on the total acid functional groups in the compound having a phenolic hydroxyl group, and the alkali soluble resin. Within the above range, the crosslinking reaction tends to sufficiently proceed, and a decrease in the film remaining rate, and swelling phenomena and meandering or the like of a pattern tend to be avoided, which is preferable.

In the resist composition of the present embodiment, as the acid crosslinking agent (G), an alkoxyalkylated urea compound or resin thereof, or an alkoxyalkylated glycoluryl compound or resin thereof is preferable. More preferable examples of the acid crosslinking agent (G) include compounds represented by the following formulae (8-1) to (8-3) and an alkoxymethylated melamine compound (acid crosslinking agent (G1)).

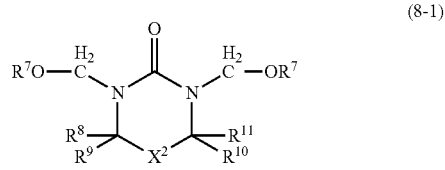

(8-1)

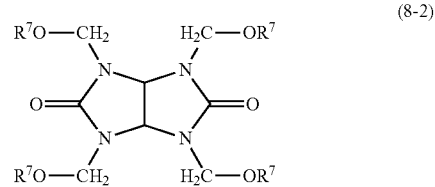

(8-2)

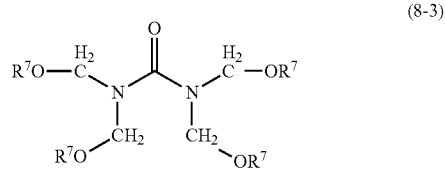

(8-3)

In the above formulae (8-1) to (8-3), $R^7$ each independently represents a hydrogen atom, an alkyl group, or an acyl group; $R^8$ to $R^{11}$ each independently represents a hydrogen atom, a hydroxyl group, an alkyl group, or an alkoxyl group; and $X^2$ represents a single bond, a methylene group, or an oxygen atom.

The alkyl group represented by R⁷ is preferably 1 to 6 carbon atoms, and more preferably 1 to 3 carbon atoms. Examples thereof include a methyl group, an ethyl group, and a propyl group. The acyl group represented by R⁷ is preferably 2 to 6 carbon atoms, and more preferably 2 to 4 carbon atoms. Examples thereof include an acetyl group and a propionyl group. The alkyl group represented by R⁸ to R¹¹ is preferably 1 to 6 carbon atoms, and more preferably 1 to 3 carbon atoms. Examples thereof include a methyl group, an ethyl group, and a propyl group. The alkoxy group represented by R⁸ to R¹¹ is preferably 1 to 6 carbon atoms, and more preferably 1 to 3 carbon atoms. Examples thereof include a methoxy group, an ethoxy group, and a propoxy group. X² is preferably a single bond or a methylene group. R⁷ to R¹¹ and X² may be substituted with an alkyl group such as a methyl group and an ethyl group, an alkoxy group such as a methoxy group and an ethoxy group, a hydroxyl group, and a halogen atom or the like. A plurality of R⁷ and R⁸ to R¹¹ may be each the same or different. Specific examples of the compound represented by the formula (8-1) include compounds shown below:

Specific examples of the compound represented by the formula (8-1) include, but not limited to, compounds represented below:

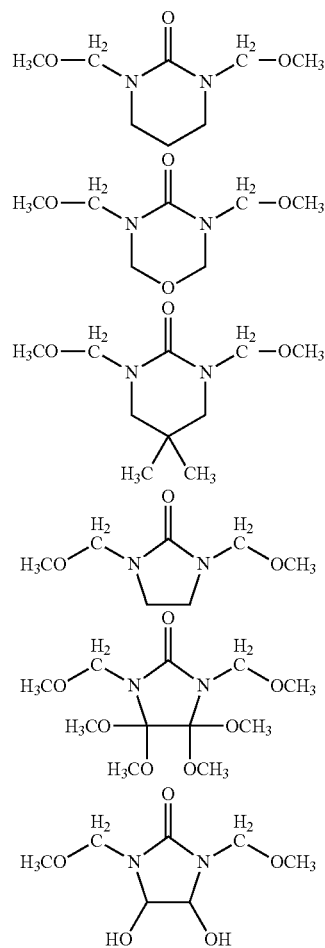

Specific examples of the compound represented by the formula (8-2) include, but not limited to, N,N,N,N-tetra(methoxymethyl)glycoluryl, N,N,N,N-tetra(ethoxymethyl) glycoluryl, N,N,N,N-tetra(n-propoxymethyl)glycoluryl, N,N,N,N-tetra(isopropoxymethyl)glycoluryl, N,N,N,N-tetra (n-butoxymethyl)glycoluryl, and N,N,N,N-tetra(t-butoxymethyl)glycoluryl. Among these, N,N,N,N-tetra(methoxymethyl)glycoluryl is preferable.

Specific examples of the compound represented by the formula (8-3) include, but not limited to, compounds represented below:

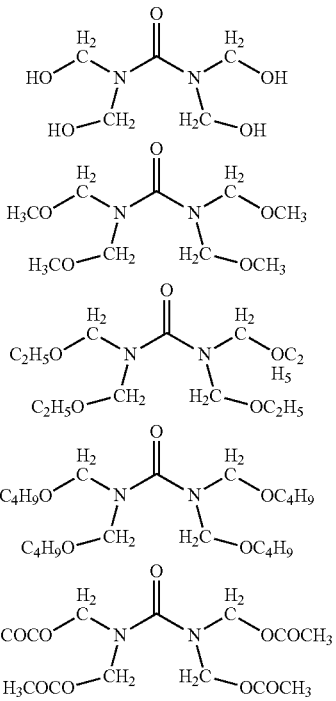

Specific examples of the alkoxymethylated melamine compound include, but not limited to, N,N,N,N,N,N-hexa (methoxymethyl)melamine, N,N,N,N,N,N-hexa(ethoxymethyl)melamine, N,N,N,N,N,N-hexa(n-propoxymethyl) melamine, N,N,N,N,N,N-hexa(isopropoxymethyl) melamine, N,N,N,N,N,N-hexa(n-butoxymethyl)melamine, and N,N,N,N,N,N-hexa(t-butoxymethyl)melamine. Among these, N,N,N,N,N,N-hexa(methoxymethyl)melamine is preferable.

The above acid crosslinking agent (G1) can be obtained by, for example, conducting a condensation reaction of a urea compound or a glycoluryl compound with formalin to introduce an methylol group, etherifying the product with lower alcohols such as methyl alcohol, ethyl alcohol, propyl alcohol, and butyl alcohol, and then cooling the reaction solution to collect a precipitated compound or resin thereof. The above acid crosslinking agent (G1) can be obtained as a commercially available product such as CYMEL (trade name, manufactured by MT AquaPolymer) and NIKALAC (manufactured by Sanwa Chemical).

Other preferable examples of the acid crosslinking agent (G) include a phenol derivative having 1 to 6 benzene rings within a molecule and two or more hydroxyalkyl groups and/or alkoxyalkyl groups within the entire molecule, the hydroxyalkyl groups and/or alkoxyalkyl groups being bonded to any of the above benzene rings (acid crosslinking agent (G2)). More preferable examples thereof include a phenol derivative having a molecular weight of 1500 or less, 1 to 6 benzene rings and a total of two or more hydroxyalkyl groups and/or alkoxyalkyl groups within a molecule, the hydroxyalkyl groups and/or alkoxyalkyl groups being bonded to any one of the above benzene rings, or a plurality of benzene rings.

The hydroxyalkyl group bonded to a benzene ring is the one of 1 to 6 carbon atoms such as a hydroxymethyl group, a 2-hydroxyethyl group, and a 2-hydroxy-1-propyl group is preferable. As the alkoxyalkyl group bonded to a benzene ring, the one of 2 to 6 carbon atoms is preferable. Specifically, a methoxymethyl group, an ethoxymethyl group, an n-propoxymethyl group, an isopropoxymethyl group, an n-butoxymethyl group, an isobutoxymethyl group, a sec-butoxymethyl group, a t-butoxymethyl group, a 2-methoxyethyl group, or a 2-methoxy-1-propyl group is preferable.

Among these phenol derivatives, particularly preferable ones are shown below:

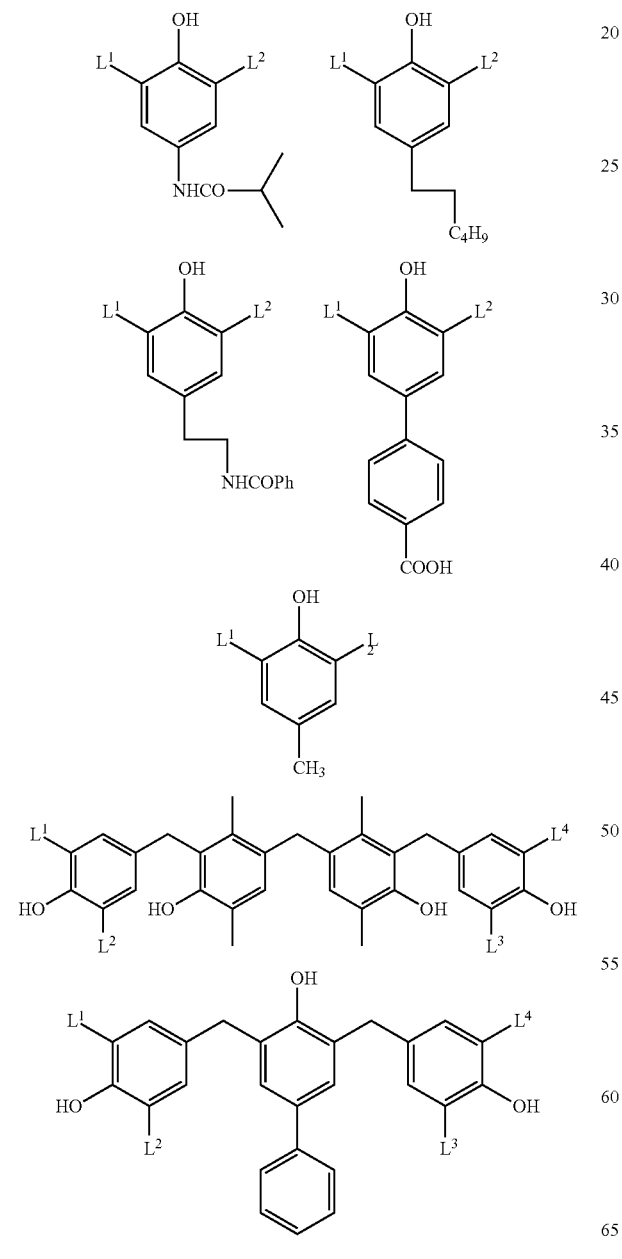

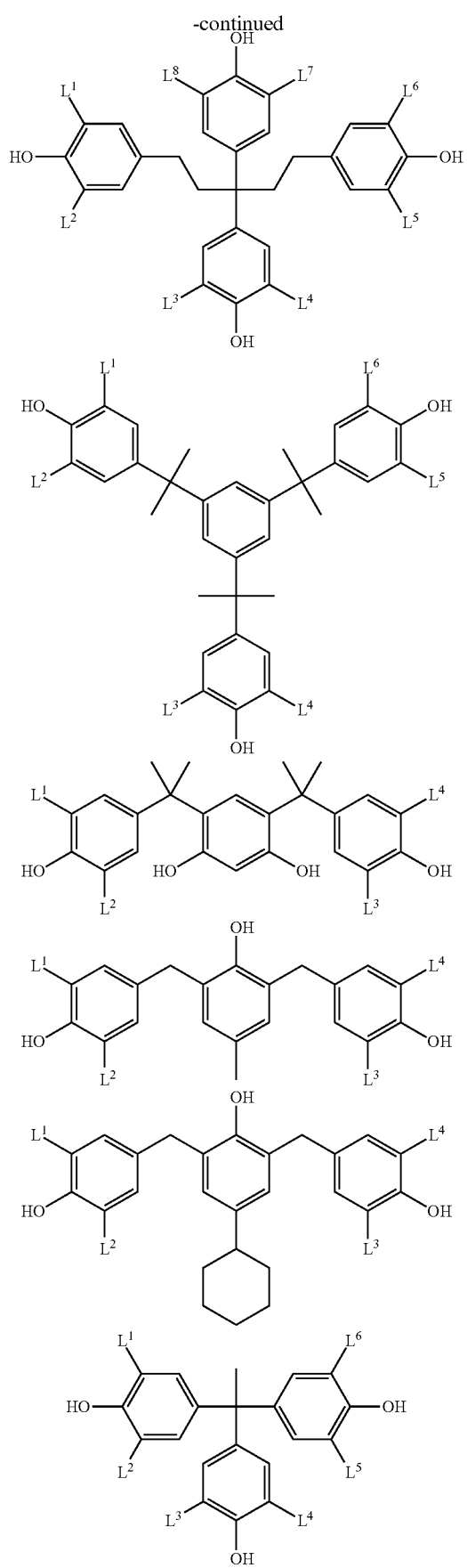

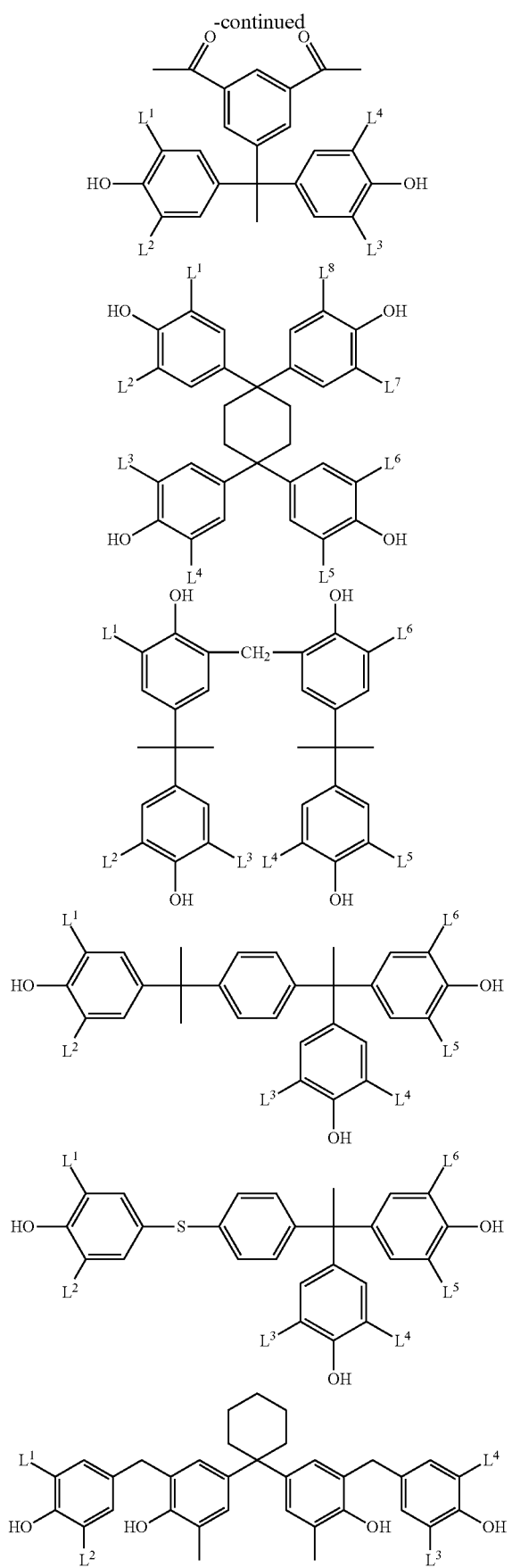
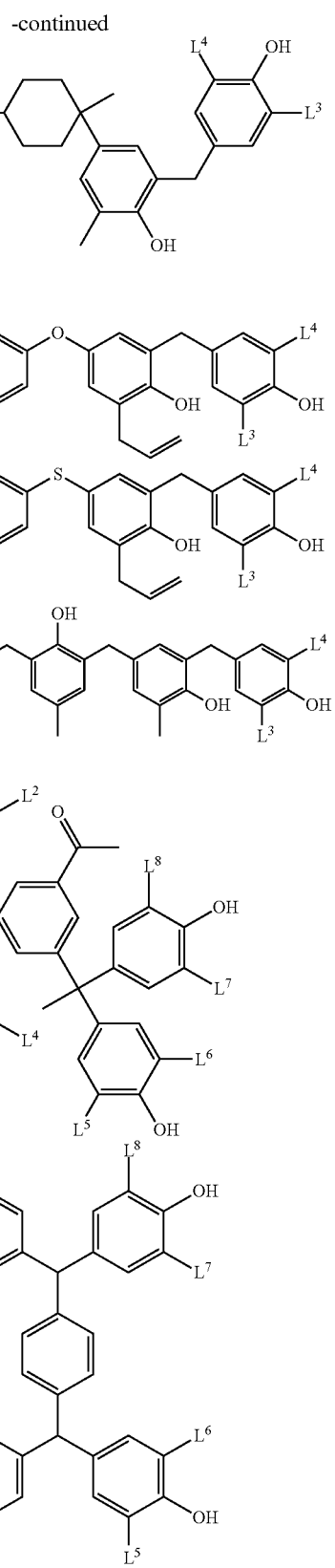
In the above formulae, $L^1$ to $L^8$ may be the same or different, and each independently represents a hydroxymethyl group, a methoxymethyl group, or an ethoxymethyl group. A phenol derivative having a hydroxymethyl group can be obtained by reacting the corresponding phenolic compound having no hydroxymethyl group (a compound where $L^1$ to $L^8$ in the above formulae are a hydrogen atom) with formaldehyde in the presence of a basic catalyst. In this case, in order to prevent resinification and gelation, the reaction temperature is preferably 60° C. or less. Specifically, it can be synthesized by methods described in Japanese Patent Application Laid-Open Nos. 6-282067 and 7-64285 or the like.

A phenol derivative having an alkoxymethyl group can be obtained by reacting the corresponding phenol derivative having a hydroxymethyl group with an alcohol in the presence of an acid catalyst. In this case, in order to prevent resinification and gelation, the reaction temperature is preferably 100° C. or less. Specifically, it can be synthesized by methods described in EP632003A1 or the like.

While the phenol derivative having a hydroxymethyl group and/or an alkoxymethyl group thus synthesized is preferable in terms of stability upon storage, the phenol derivative having an alkoxymethyl group is particularly preferable in terms of stability upon storage. The acid crosslinking agent (G2) may be used alone, or may be used in combination of two or more kinds.

Other particularly preferable examples of the acid crosslinking agent (G) include a compound having at least one α-hydroxyisopropyl group (acid crosslinking agent (G3)). The compound is not particularly limited in the structure, as long as it has an α-hydroxyisopropyl group. A hydrogen atom of a hydroxyl group in the above α-hydroxyisopropyl group may be substituted with one or more acid dissociation reactive groups (R—COO— group, R—SO$_2$— group or the like, wherein R represents a substituent group selected from the group consisting of a linear hydrocarbon group having 1 to 12 carbon atoms, a cyclic hydrocarbon group having 3 to 12 carbon atoms, an alkoxy group having 1 to 12 carbon atoms, a 1-branched alkyl group having 3 to 12 carbon atoms, and an aromatic hydrocarbon group having 6 to 12 carbon atoms). Examples of a compound having the above α-hydroxyisopropyl group include, but not limited to, one kind or two kinds or more of a substituted or non-substituted aromatic based compound, a diphenyl compound, a naphthalene compound, a furan compound or the like containing at least one α-hydroxyisopropyl group. Specific examples thereof include a compound represented by the following general formula (9-1) (hereinafter, referred to as "benzene based compound (1)"), a compound represented by the following general formula (9-2) (hereinafter, referred to as "diphenyl based compound (2)"), a compound represented by the following general formula (9-3) (hereinafter, referred to as "naphthalene based compound (3)"), and a compound represented by the following general formula (9-4) (hereinafter, referred to as "furan based compound (4)").

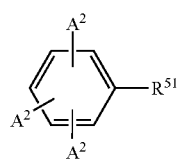
(9-1)

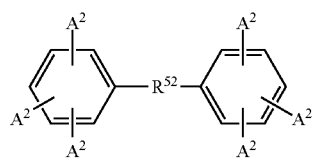
(9-2)

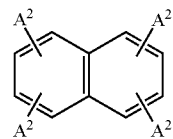
(9-3)

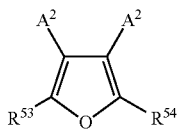
(9-4)

In the above general formulae (9-1) to (9-4), each $A^2$ independently represents an α-hydroxyisopropyl group or a hydrogen atom, and at least one $A^2$ is an α-hydroxyisopropyl group. In the general formula (9-1), $R^{51}$ represents a hydrogen atom, a hydroxyl group, a linear or branched alkylcarbonyl group having 2 to 6 carbon atoms, or a linear or branched alkoxycarbonyl group having 2 to 6 carbon atoms. Furthermore, in the general formula (9-2), $R^{52}$ represents a single bond, a linear or branched alkylene group having 1 to 5 carbon atoms, —O—, —CO—, or —COO—. Also, in the general formula (9-4), $R^{53}$ and $R^{54}$ represent a hydrogen atom or a linear or branched alkyl group having 1 to 6 carbon atoms independently from each other.

Specific examples of the benzene based compound (1) include, but not limited to, α-hydroxyisopropylbenzenes such as α-hydroxyisopropylbenzene, 1,3-bis(α-hydroxyisopropyl)benzene, 1,4-bis(α-hydroxyisopropyl)benzene, 1,2,4-tris(α-hydroxyisopropyl)benzene, and 1,3,5-tris(α-hydroxyisopropyl)benzene; α-hydroxyisopropylphenols such as 3-α-hydroxyisopropylphenol, 4-α-hydroxyisopropylphenol, 3,5-bis(α-hydroxyisopropyl)phenol, and 2,4,6-tris(α-hydroxyisopropyl)phenol; α-hydroxyisopropylphenyl alkyl ketones such as 3-α-hydroxyisopropylphenyl methyl ketone, 4-α-hydroxyisopropylphenyl methyl ketone, 4-α-hydroxyisopropylphenyl ethyl ketone, 4-α-hydroxyisopropylphenyl-n-propyl ketone, 4-α-hydroxyisopropylphenyl isopropyl ketone, 4-α-hydroxyisopropylphenyl-n-butyl ketone, 4-α-hydroxyisopropylphenyl-t-butyl ketone, 4-α-hydroxyisopropylphenyl-n-pentyl ketone, 3,5-bis(α-hydroxyisopropyl)phenyl methyl ketone, 3,5-bis(α-hydroxyisopropyl)phenyl ethyl ketone, and 2,4,6-tris(α-hydroxyisopropyl)phenyl methyl ketone; alkyl 4-α-hydroxyisopropylbenzoates such as methyl 3-α-hydroxyisopropylbenzoate, methyl 4-α-hydroxyisopropylbenzoate, ethyl 4-α-hydroxyisopropylbenzoate, n-propyl 4-α-hydroxyisopropylbenzoate, isopropyl 4-α-hydroxyisopropylbenzoate, n-butyl 4-α-hydroxyisopropylbenzoate, t-butyl 4-α-hydroxyisopropylbenzoate, n-pentyl 4-α-hydroxyisopropylbenzoate, methyl 3,5-bis(α-hydroxyisopropyl)benzoate, ethyl 3,5-bis(α-hydroxyisopropyl)benzoate, and methyl 2,4,6-tris(α-hydroxyisopropyl)benzoate.

Specific examples of the above diphenyl based compound (2) include, but not limited to, α-hydroxyisopropylbiphenyls such as 3-α-hydroxyisopropylbiphenyl, 4-α-hydroxyisopropylbiphenyl, 3,5-bis(α-hydroxyisopropyl)biphenyl, 3,3'-bis(α-hydroxyisopropyl)biphenyl, 3,4'-bis(α-hydroxyisopropyl)biphenyl, 4,4'-bis(α-hydroxyisopropyl)biphenyl, 2,4,6-tris(α-hydroxyisopropyl)biphenyl, 3,3',5-tris(α-hydroxyisopropyl)biphenyl, 3,4',5-tris(α-hydroxyisopropyl)biphenyl, 2,3',4,6,-tetrakis(α-hydroxyisopropyl)biphenyl, 2,4,4',6,-tetrakis(α-hydroxyisopropyl)biphenyl, 3,3',5,5'-tetrakis(α-hydroxyisopropyl)biphenyl, 2,3',4,5',6-pentakis(α-hydroxyisopropyl)biphenyl, and 2,2',4,4',6,6'-hexakis(α-hydroxyisopropyl)biphenyl;

α-hydroxyisopropyldiphenylalkanes such as 3-α-hydroxyisopropyldiphenylmethane, 4-α-hydroxyisopropyldiphenylmethane, 1-(4-α-hydroxyisopropylphenyl)-2-phenylethane, 1-(4-α-hydroxyisopropylphenyl)-2-phenylpropane, 2-(4-α-hydroxyisopropylphenyl)-2-phenylpropane, 1-(4-α-hydroxyisopropylphenyl)-3-phenylpropane, 1-(4-α-hydroxyisopropylphenyl)-4-phenylbutane, 1-(4-α-hydroxyisopropylphenyl)-5-phenylpentane, 3,5-bis(α-hydroxyisopropyldiphenylmethane, 3,3'-bis(α-hydroxyisopropyl)diphenylmethane, 3,4'-bis(α-hydroxyisopropyl)diphenylmethane, 4,4'-bis(α-hydroxyisopropyl)diphenylmethane, 1,2-bis(4-α-hydroxyisopropylphenyl)ethane, 1,2-bis(4-α-hydroxypropylphenyl)propane, 2,2-bis(4-α-hydroxypropylphenyl)propane, 1,3-bis(4-α-hydroxypropylphenyl)propane, 2,4,6-tris(α-hydroxyisopropyl)diphenylmethane, 3,3',5-tris(α-hydroxyisopropyl)diphenylmethane, 3,4',5-tris(α-hydroxyisopropyl)diphenylmethane, 2,3',4,6-tetrakis(α-hydroxyisopropyl)diphenylmethane, 2,4,4',6-tetrakis(α-hydroxyisopropyl)diphenylmethane, 3,3',5,5'-tetrakis(α-hydroxyisopropyl)diphenylmethane, 2,3',4,5',6-pentakis(α-hydroxyisopropyl)diphenylmethane, and 2,2',4,4',6,6'-hexakis(α-hydroxyisopropyl)diphenylmethane;

α-hydroxyisopropyldiphenyl ethers such as 3-α-hydroxyisopropyldiphenyl ether, 4-α-hydroxyisopropyldiphenyl ether, 3,5-bis(α-hydroxyisopropyl)diphenyl ether, 3,3'-bis(α-hydroxyisopropyl)diphenyl ether, 3,4'-bis(α-hydroxyisopropyl)diphenyl ether, 4,4'-bis(α-hydroxyisopropyl)diphenyl ether, 2,4,6-tris(α-hydroxyisopropyl)diphenyl ether, 3,3',5-tris(α-hydroxyisopropyl)diphenyl ether, 3,4',5-tris(α-hydroxyisopropyl)diphenyl ether, 2,3',4,6-tetrakis(α-hydroxyisopropyl)diphenyl ether, 2,4,4',6-tetrakis(α-hydroxyisopropyl)diphenyl ether, 3,3',5,5'-tetrakis(α-hydroxyisopropyl)diphenyl ether, 2,3',4,5',6-pentakis(α-hydroxyisopropyl)diphenyl ether, and 2,2',4,4',6,6'-hexakis(α-hydroxyisopropyl)diphenyl ether;

α-hydroxyisopropyldiphenyl ketones such as 3-α-hydroxyisopropyldiphenyl ketone, 4-α-hydroxyisopropyldiphenyl ketone, 3,5-bis(α-hydroxyisopropyl)diphenyl ketone, 3,3'-bis(α-hydroxyisopropyl)diphenyl ketone, 3,4'-bis(α-hydroxyisopropyl)diphenyl ketone, 4,4'-bis(α-hydroxyisopropyl)diphenyl ketone, 2,4,6-tris(α-hydroxyisopropyl)diphenyl ketone, 3,3',5-tris(α-hydroxyisopropyl)diphenyl ketone, 3,4',5-tris(α-hydroxyisopropyl)diphenyl ketone, 2,3',4,6-tetrakis(α-hydroxyisopropyl)diphenyl ketone, 2,4,4',6-tetrakis(α-hydroxyisopropyl)diphenyl ketone, 3,3',5,5'-tetrakis(α-hydroxyisopropyl)diphenyl ketone, 2,3',4,5',6-pentakis(α-hydroxyisopropyl)diphenyl ketone, and 2,2',4,4',6,6'-hexakis(α-hydroxyisopropyl)diphenyl ketone; phenyl α-hydroxyisopropylbenzoates such as phenyl 3-α-hydroxyisopropylbenzoate, phenyl 4-α-hydroxyisopropylbenzoate, 3-α-hydroxyisopropylphenyl benzoate, 4-α-hydroxyisopropylphenyl benzoate, phenyl 3,5-bis(α-hydroxyisopropyl)benzoate, 3-α-hydroxyisopropylphenyl 3-α-hydroxyisopropylbenzoate, 4-α-hydroxyisopropylphenyl 3-α-hydroxyisopropylbenzoate, 3-α-hydroxyisopropylphenyl 4-α-hydroxyisopropylbenzoate, 4-α-hydroxyisopropylphenyl 4-α-hydroxyisopropylbenzoate, 3,5-bis(α-hydroxyisopropyl)phenyl benzoate, phenyl 2,4,6-tris(α-hydroxyisopropyl)benzoate, 3-α-hydroxyisopropylphenyl 3,5-bis(α-hydroxyisopropyl)benzoate, 4-α-hydroxyisopropylphenyl 3,5-bis(α-hydroxyisopropyl)benzoate, 3,5-bis(α-hydroxyisopropyl)phenyl 3-α-hydroxyisopropylbenzoate, 3,5-bis(α-hydroxyisopropyl)phenyl 4-α-hydroxyisopropylbenzoate, 2,4,6-tris(α-hydroxyisopropyl)phenyl benzoate, 3-α-hydroxyisopropylphenyl 2,4,6-tris(α-hydroxyisopropyl)benzoate, 4-α-hydroxyisopropylphenyl 2,4,6-tris(α-hydroxyisopropyl)benzoate, 3,5-bis(α-hydroxyisopropyl)phenyl 3,5-bis(α-hydroxyisopropyl)benzoate, 2,4,6-tris(α-hydroxyisopropyl)phenyl 3-α-hydroxyisopropylbenzoate, 2,4,6-tris(α-hydroxyisopropyl)phenyl 4-α-hydroxyisopropylbenzoate, 3,5-bis(α-hydroxyisopropyl)phenyl 2,4,6-tris(α-hydroxyisopropyl)benzoate, 2,4,6-tris(α-hydroxyisopropyl)phenyl 3,5-bis(α-hydroxyisopropyl)benzoate, and 2,4,6-tris(α-hydroxyisopropyl)phenyl 2,4,6-tris(α-hydroxyisopropyl)benzoate.

Furthermore, specific examples of the above naphthalene based compound (3) include, but not limited to, 1-(α-hydroxyisopropyl)naphthalene, 2-(α-hydroxyisopropyl)naphthalene, 1,3-bis(α-hydroxyisopropyl)naphthalene, 1,4-bis(α-hydroxyisopropyl)naphthalene, 1,5-bis(α-hydroxyisopropyl)naphthalene, 1,6-bis(α-hydroxyisopropyl)naphthalene, 1,7-bis(α-hydroxyisopropyl)naphthalene, 2,6-bis(α-hydroxyisopropyl)naphthalene, 2,7-bis(α-hydroxyisopropyl)naphthalene, 1,3,5-tris(α-hydroxyisopropyl)naphthalene, 1,3,6-tris(α-hydroxyisopropyl)naphthalene, 1,3,7-tris(α-hydroxyisopropyl)naphthalene, 1,4,6-tris(α-hydroxyisopropyl)naphthalene, 1,4,7-tris(α-hydroxyisopropyl)naphthalene, and 1,3,5,7-tetrakis(α-hydroxyisopropyl)naphthalene.

Specific examples of the above furan based compound (4) include, but not limited to, 3-(α-hydroxyisopropyl) furan, 2-methyl-3-(α-hydroxyisopropyl)furan, 2-methyl-4-(α-hydroxyisopropyl)furan, 2-ethyl-4-(α-hydroxyisopropyl)furan, 2-n-propyl-4-(α-hydroxyisopropyl)furan, 2-isopropyl-4-(α-hydroxyisopropyl)furan, 2-n-butyl-4-(α-hydroxyisopropyl)furan, 2-t-butyl-4-(α-hydroxyisopropyl)furan, 2-n-pentyl-4-(α-hydroxyisopropyl)furan, 2,5-dimethyl-3-(α-hydroxyisopropyl)furan, 2,5-diethyl-3-(α-hydroxyisopropyl)furan, 3,4-bis(α-hydroxyisopropyl)furan, 2,5-dimethyl-3,4-bis(α-hydroxyisopropyl)furan, and 2,5-diethyl-3,4-bis(α-hydroxyisopropyl)furan.

As the above acid crosslinking agent (G3), a compound having two or more free α-hydroxyisopropyl groups is preferable; the above benzene based compound (1) having two or more α-hydroxyisopropyl groups, the above diphenyl based compound (2) having two or more α-hydroxyisopropyl groups, and the above naphthalene based compound (3) having two or more α-hydroxyisopropyl groups are more preferable; and α-hydroxyisopropylbiphenyls having two or more α-hydroxyisopropyl groups and the above naphthalene based compound (3) having two or more α-hydroxyisopropyl groups are still more preferable.

The above acid crosslinking agent (G3) can normally be obtained by a method for reacting an acetyl group-containing compound such as 1,3-diacetylbenzene with Grignard reagent such as $CH_3MgBr$ to methylate and then hydrolyzing, or a method for oxidizing an isopropyl group-containing compound such as 1,3-diisopropylbenzene with oxygen or the like to produce a peroxide and then reducing.

The amount of the acid crosslinking agent (G) used in the present embodiment is preferably 0.5 to 49% by mass of the total mass of the solid component, more preferably 0.5 to 40% by mass, still more preferably 1 to 30% by mass, and further more preferably 2 to 20% by mass. When the content of the above acid crosslinking agent (G) is 0.5% by mass or more, the inhibiting effect of the solubility of a resist film in an alkaline developing solution tends to be improved, and a decrease in the film remaining rate, and occurrence of swelling and meandering of a pattern tends to be able to be inhibited, which is preferable. On the other hand, when the content is 50% by mass or less, a decrease in heat resistance as a resist tends to be able to be inhibited, which is preferable.

The content of at least one kind of compound selected from the above acid crosslinking agent (G1), acid crosslinking agent (G2), and acid crosslinking agent (G3) in the above acid crosslinking agent (G) is also not particularly limited, and can be within various ranges according to the kind of substrates or the like used upon forming a resist pattern.

In all acid crosslinking agent components, the content of the alkoxymethylated melamine compound and/or the compounds represented by the formulas (9-1) to (9-3) is preferably 50 to 99% by mass, more preferably 60 to 99% by mass, and much more preferably 70 to 98% by mass, and further more preferably 80 to 97% by mass. By having the alkoxymethylated melamine compound and/or the compounds represented by (9-1) to (9-3) of 50% by mass or more of all acid crosslinking agent components, the resolution tends to be further improved, which is preferable. By having the compounds of 99% by mass or less, the pattern cross section tends to be likely to have a rectangular shape, which is preferable.

In the present embodiment, the resist composition may contain an acid diffusion controlling agent (E) having a function of controlling diffusion of an acid generated from an acid generating agent by radiation irradiation in a resist film to inhibit any unpreferable chemical reaction in an unexposed region or the like. By using such an acid diffusion controlling agent (E), the storage stability of a resist composition tends to be improved. Also, along with the further improvement of the resolution, the line width change of a resist pattern due to variation in the post exposure delay time before radiation irradiation and the post exposure delay time after radiation irradiation can be inhibited, and the composition tends to have extremely excellent process stability. Such an acid diffusion controlling agent (E) includes a radiation degradable basic compound such as a nitrogen atom-containing basic compound, a basic sulfonium compound, and a basic iodonium compound. The acid diffusion controlling agent (E) can be used alone or in combination of two or more kinds.

Examples of the above acid diffusion controlling agent include, but not limited to, a nitrogen-containing organic compound, and a basic compound degradable by exposure. Examples of the above nitrogen-containing organic compound include, but not limited to, a compound represented by the following general formula (10):

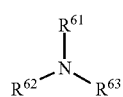

(10)

(hereinafter, referred to as a "nitrogen-containing compound (I)"), a diamino compound having two nitrogen atoms within the same molecule (hereinafter, referred to as a "nitrogen-containing compound (II)"), a polyamino compound or polymer having three or more nitrogen atoms (hereinafter, referred to as a "nitrogen-containing compound (III)"), an amide group-containing compound, a urea compound, and a nitrogen-containing heterocyclic compound.

The acid diffusion controlling agent (E) may be used alone as one kind or may be used in combination of two or more kinds.

In the above general formula (10), $R^{61}$, $R^{62}$, and $R^{63}$ represent a hydrogen atom, a linear, branched or cyclic alkyl group, an aryl group, or an aralkyl group independently from each other. The above alkyl group, aryl group, or aralkyl group may be non-substituted or may be substituted with a hydroxyl group or the like. Herein, examples of the above linear, branched or cyclic alkyl group include the one of 1 to 15 carbon atoms, and preferably 1 to 10 carbon atoms. Specific examples thereof include a methyl group, an ethyl group, an n-propyl group, an isopropyl group, an n-butyl group, an isobutyl group, a sec-butyl group, a t-butyl group, an n-pentyl group, a neopentyl group, an n-hexyl group, a texyl group, an n-heptyl group, an n-octyl group, an n-ethylhexyl group, an n-nonyl group, and an n-decyl group. Examples of the above aryl group include the one of 6 to 12 carbon atoms. Specific examples thereof include a phenyl group, a tolyl group, a xylyl group, a cumenyl group, and a 1-naphthyl group. Furthermore, examples of the above aralkyl group include the one of 7 to 19 carbon atoms, and preferably 7 to 13 carbon atoms. Specific examples thereof include a benzyl group, an α-methylbenzyl group, a phenethyl group, and a naphthylmethyl group.

Specific examples of the above nitrogen-containing compound (I) include, but not limited to, mono(cyclo)alkylamines such as n-hexylamine, n-heptylamine, n-octylamine, n-nonylamine, n-decylamine, n-dodecylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, methyl-n-dodecylamine, di-n-dodecylmethyl, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine, and tricyclohexylamine; alkanolamines such as monoethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Specific examples of the above nitrogen-containing compound (II) include, but not limited to, ethylenediamine, N,N,N',N'-tetramethylethylenediamine, N,N,N',N'-tetrakis (2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Specific examples of the above nitrogen-containing compound (III) include, but not limited to, polymers of polyethyleneimine, polyarylamine, and N-(2-dimethylaminoethyl) acrylamide.

Specific examples of the above amide group-containing compound include, but not limited to, formamide, N-methylformamide, N,N-dimethylformamide, acetamide, N-methylacetamide, N,N-dimethylacetamide, propioneamide, benzamide, pyrrolidone, and N-methylpyrrolidone.

Specific examples of the above urea compound include, but not limited to, urea, methylurea, 1,1-dimethylurea, 1,3-dimethylurea, 1,1,3,3-tetramethylurea, 1,3-diphenylurea, and tri-n-butylthiourea.

Specific examples of the above nitrogen-containing heterocyclic compound include, but not limited to, imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, amide nicotinate, quinoline, 8-oxyquinoline, and acridine; and pyrazine, pyrazole, pyridazine, quinozaline, purine, pyrrolidine, piperidine, morpholine, 4-methylmorpholine, piperazine, 1,4-dimethylpiperazine, and 1,4-diazabicyclo[2.2.2]octane.

Examples of the radiation degradable basic compound can include a sulfonium compound represented by the following general formula (11-1), and an iodonium compound represented by the following general formula (11-2):

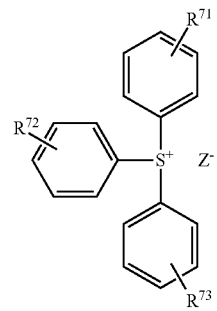

(11-1)

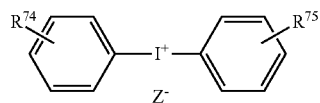

(11-2)

In the above general formulae (11-1) and (11-2), $R^{71}$, $R^{72}$, $R^{73}$, $R^{74}$, and $R^{75}$ represent a hydrogen atom, an alkyl group having 1 to 6 carbon atoms, an alkoxyl group having 1 to 6 carbon atoms, a hydroxyl group, or a halogen atom independently from each other. $Z^-$ represents $HO^-$, $R-COO^-$ (R represents an alkyl group having 1 to 6 carbon atoms, an aryl group having 6 to 11 carbon atoms, or an alkaryl group having 7 to 12 carbon atoms), or an anion represented by the following general formula (11-3):

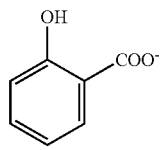

(11-3)

Specific examples of the above radiation degradable basic compound include, but not limited to, triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, and 4-t-butylphenyl-4-hydroxyphenyliodonium salicylate.

The content of the acid diffusion controlling agent (E) is preferably 0.001 to 49% by mass of the total mass of the solid component, more preferably 0.01 to 10% by mass, still more preferably 0.01 to 5% by mass, and further more preferably 0.01 to 3% by mass. Within the above range, a decrease in resolution, and deterioration of the pattern shape and the dimension fidelity or the like tend to be prevented. Moreover, even though the post exposure delay time from electron beam irradiation to heating after radiation irradiation becomes longer, deterioration in the shape of the pattern upper layer portion tends to be inhibited. When the content is 10% by mass or less, a decrease in sensitivity, and developability of the unexposed portion or the like tends to be able to be prevented. By using such an acid diffusion controlling agent, the storage stability of a resist composition improves, also along with improvement of the resolution, the line width change of a resist pattern due to variation in the post exposure delay time before radiation irradiation and the post exposure delay time after radiation irradiation can be inhibited, and the composition tends to be extremely excellent process stability.

To the resist composition of the present embodiment, within the range of not inhibiting the purpose of the present embodiment, if required, as the other component (F), one kind or two kinds or more of various additive agents such as a dissolution promoting agent, a dissolution controlling agent, a sensitizing agent, a surfactant and an organic carboxylic acid or an oxo acid of phosphor, or derivative thereof can be added.

[Dissolution Promoting Agent]

A dissolution promoting agent is a component having a function of increasing the solubility of a compound represented by the formula (1) in a developing solution to moderately increase the dissolution rate of the compound upon developing, when the solubility of the compound is too low. The low molecular weight dissolution promoting agent can be used, within the range of not deteriorating the effect of the present embodiment. Examples of the above dissolution promoting agent can include, but not limited to, a low molecular weight phenolic compound. Specific examples thereof can include bisphenols, tris(hydroxyphenyl)methane, and calixresorcinarene. These dissolution promoting agents can be used alone or in mixture of two or more kinds. The content of the dissolution promoting agent is arbitrarily adjusted according to the kind of the compound to be used.

[Dissolution Controlling Agent]

The dissolution controlling agent is a component having a function of controlling the solubility of the compound represented by the formula (1) in a developing solution to moderately decrease the dissolution rate upon developing, when the solubility of the compound is too high.

Examples of the dissolution controlling agent include, but not limited to, aromatic hydrocarbons such as phenanthrene, anthracene, and acenaphthene; ketones such as acetophenone, benzophenone, and phenyl naphtyl ketone; and sulfones such as methyl phenyl sulfone, diphenyl sulfone, and dinaphthyl sulfone. These dissolution controlling agents can be used alone or in two or more kinds.

The content of the dissolution controlling agent is arbitrarily adjusted according to the kind of the compound to be used.

[Sensitizing Agent]

The sensitizing agent is a component having a function of absorbing irradiated radiation energy, transmitting the energy to the acid generating agent (C), and thereby increasing the acid production amount, and improving the apparent sensitivity of a resist. Examples of such a sensitizing agent include benzophenones, biacetyls, pyrenes, phenothiazines, and fluorenes. These sensitizing agents can be used alone or in two or more kinds. The content of the sensitizing agent is arbitrarily adjusted according to the kind of the compound to be used.

[Surfactant]

The surfactant is a component having a function of improving coatability and striation of the resist composition of the present embodiment, and developability of a resist or the like. Such a surfactant may be any of anionic, cationic, nonionic or amphoteric. A preferable surfactant is a nonionic surfactant. The nonionic surfactant has a good affinity with a solvent used in production of resist compositions and more effects. Examples of the nonionic surfactant include, but not particularly limited to, a polyoxyethylene higher alkyl ethers, polyoxyethylene higher alkyl phenyl ethers, and higher fatty acid diesters of polyethylene glycol. Examples of commercially available products include, hereinafter by trade name, EFTOP (manufactured by Jemco Inc.), MEGAFAC (manufactured by DIC Corporation), Fluorad (manufactured by Sumitomo 3M Limited), AsahiGuard, Surflon (hereinbefore, manufactured by Asahi Glass Co., Ltd.), Pepole (manufactured by Toho Chemical Industry Co., Ltd.), KP (manufactured by Shin-Etsu Chemical Co., Ltd.), and Polyflow (manufactured by Kyoeisha Chemical Co., Ltd.). The content of the surfactant is arbitrarily adjusted according to the kind of the compound to be used.

[Organic Carboxylic Acid or Oxo Acid of Phosphor or Derivative Thereof]

For the purpose of prevention of sensitivity deterioration or improvement of a resist pattern shape and post exposure delay stability or the like, and as an additional optional component, an organic carboxylic acid or an oxo acid of phosphor or derivative thereof may be contained. The composition can be used in combination with the acid diffusion controlling agent, or may be used alone. As the organic carboxylic acid, but not particularly limited, for example, malonic acid, citric acid, malic acid, succinic acid, benzoic acid, and salicylic acid, or the like are preferable. Examples of the oxo acid of phosphor or derivative thereof include, but not limited to, phosphoric acid or derivative thereof such as ester including phosphoric acid, di-n-butyl ester phosphate, and diphenyl ester phosphate; phosphonic acid or derivative thereof such as ester including phosphonic acid, dimethyl ester phosphonate, di-n-butyl ester phosphonate, phenylphosphonic acid, diphenyl ester phosphonate, and dibenzyl ester phosphonate; and phosphinic acid and derivative thereof such as ester including phosphinic acid and phenylphosphinic acid. Among these, phosphonic acid is particularly preferable.

The organic carboxylic acid or the oxo acid of phosphor or derivative thereof can be used alone or in combination of two or more kinds. The content of the organic carboxylic acid or the oxo acid of phosphor or derivative thereof is arbitrarily adjusted according to the kind of the compound to be used.

[Other Additive Agent Excluding Additives Mentioned Above (Dissolution Promoting Agent, Dissolution Controlling Agent, Sensitizing Agent, Surfactant and Organic Carboxylic Acid or Oxo Acid of Phosphor, or Derivative Thereof, Etc.)]

To the resist composition of the present embodiment, within the range of not inhibiting the purpose of the present embodiment, if required, one kind or two kinds or more of additive agents other than the above dissolution controlling agent, sensitizing agent, surfactant and organic carboxylic acid or an oxo acid of phosphor, or derivative thereof can be added. Examples of such an additive agent include a dye, a pigment, and an adhesion aid. For example, the composition contains the dye or the pigment, and thereby a latent image of the exposed portion can be visualized and influence of halation upon exposure tends to be alleviated, which is preferable. The composition contains the adhesion aid, and thereby adhesiveness to a substrate tends to be able to be improved, which is preferable. Furthermore, examples of other additive agent include a halation preventing agent, a storage stabilizing agent, a defoaming agent, and a shape improving agent. Specific examples thereof include 4-hydroxy-4'-methylchalkone.

The total amount of the optional component (F) is preferably 0 to 94% by mass of the total mass of the solid component.

When the resist composition of the present embodiment is used as a negative type resist, the content of the resist composition of the present embodiment (the compound (A)/the acid generating agent (C)/the acid crosslinking agent (G)/the acid diffusion controlling agent (E)/the optional component (F)) is preferably 5 to 99.4/0.001 to 94/0.5 to 94/0.001 to 94/0 to 94 in % by mass based on the solid content, and more preferably 8 to 90/1 to 50/0.5 to 50/0.01 to 10/0 to 94. The content ratio of each component is selected from each range so that the summation thereof is 100% by mass. By the above content ratio, performance such as sensitivity, resolution, and developability tends to be excellent.

When the resist composition of the present embodiment is used as a positive type resist, the content of the resist composition of the present embodiment (the compound (A')/the acid generating agent (C)/the acid diffusion controlling agent (E)/the optional component (F)) is preferably 5 to 99.4/0.001 to 94/0.001 to 94/0 to 94 in % by mass based on the solid content, and more preferably 8 to 90/1 to 50/0.01 to 50/0 to 94. The content ratio of each component is selected from each range so that the summation thereof is 100% by mass. By the above content ratio, performance such as sensitivity, resolution, and developability tends to be excellent.

The resist composition of the present embodiment is usually prepared by dissolving each component in a solvent upon use into a homogenous solution, and then if required, filtering through a filter or the like with a pore diameter of about 0.2 μm, for example.

Examples of the solvent used in the preparation of the resist composition of the present embodiment can include, but not particularly limited to, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; ethylene glycol monoalkyl ethers such as ethylene glycol monomethyl ether and ethylene glycol monoethyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; propylene glycol monoalkyl ethers such as propylene glycol monomethyl ether and propylene glycol monoethyl ether; ester lactates such as methyl lactate, ethyl lactate, n-propyl lactate, n-butyl lactate, and n-amyl lactate; aliphatic carboxylic acid esters such as methyl acetate, ethyl acetate, n-propyl acetate, n-butyl acetate, n-amyl acetate, n-hexyl acetate, methyl propionate, and ethyl propionate; other esters such as methyl 3-methoxypropionate, ethyl 3-methoxypropionate, methyl 3-ethoxypropionate, ethyl 3-ethoxypropionate, methyl 3-methoxy-2-methylpropionate, 3-methoxybutylacetate, 3-methyl-3-methoxybutylacetate, butyl 3-methoxy-3-methylpropionate, butyl 3-methoxy-3-methylbutyrate, methyl acetoacetate, methyl pyruvate, and ethyl pyruvate; aromatic hydrocarbon atoms such as toluene and xylene; ketones such as 2-heptanone, 3-heptanone, 4-heptanone, cyclopentanone, and cyclohexanone; amides such as N,N-dimethylformamide, N-methylacetamide, N,N-dimethylacetamide, and N-methylpyrrolidone; and lactones such as γ-lactone. These solvents can be used alone or in combination of two or more kinds.

The resist composition of the present embodiment can contain a predetermined resin within the range of not inhibiting the purpose of the present embodiment. Examples of the predetermined resin include, but not particularly limited to, a novolac resin, polyvinyl phenols, polyacrylic acid, polyvinyl alcohol, a styrene-maleic anhydride resin, an acrylic acid, vinyl alcohol, a polymer containing vinylphenol as a monomeric unit, and derivatives thereof. The content of the predetermined resin is arbitrarily adjusted according to the kind of the compound represented by the formula (1) to be used, is preferably 30 parts by mass or less per 100 parts by mass of the compound, more preferably 10 parts by mass or less, still more preferably 5 parts by mass or less, and further more preferably 0 part by mass.

[Resist Pattern Formation Method]

A resist pattern formation method according to the present embodiment includes steps of forming a resist film by coating a substrate with the above resist composition of the present embodiment, exposing the above formed resist film, and developing the exposed resist film to form a resist pattern. The resist pattern formed by the resist pattern formation method according to the present embodiment is excellent in its shape, and can also be formed as an upper layer resist in a multilayer process.

In order to form a resist pattern, a resist film is formed by coating a conventionally publically known substrate with the resist composition of the present embodiment using a coating means such as spin coating, flow casting coating, and roll coating. The conventionally publically known substrate is not particularly limited. A substrate for electronic components, and the one having a predetermined wiring pattern formed thereon, or the like can be exemplified. More specific examples include a substrate made of a metal such as a silicon wafer, copper, chromium, iron and aluminum, and a glass substrate. Examples of a wiring pattern material include, but not particularly limited to, copper, aluminum, nickel, and gold. Also if required, the substrate may be a substrate having an inorganic and/or organic film provided thereon. Examples of the inorganic film include, but not particularly limited to, an inorganic antireflection film (inorganic BARC). Examples of the organic film include, but not particularly limited to, an organic antireflection film (organic BARC). Surface treatment with hexamethylene disilazane or the like may be conducted.

Next, the coated substrate is heated if required. The heating conditions vary according to the content composition of the resist composition, or the like, but are preferably 20 to 250° C., and more preferably 20 to 150° C. By heating, the adhesiveness of a resist to a substrate may improve, which is preferable. Then, the resist film is exposed to a desired pattern by any radiation selected from the group consisting of visible light, ultraviolet, excimer laser, electron beam, extreme ultraviolet (EUV), X-ray, and ion beam. The exposure conditions or the like are arbitrarily selected according to the compounding composition of the resist composition, or the like. In the present embodiment, in order to stably form a fine pattern with a high degree of accuracy in exposure, the resist film is preferably heated after radiation irradiation. The heating conditions vary according to the compounding composition of the resist composition, or the like, but are preferably 20 to 250° C., and more preferably 20 to 150° C.

Next, by developing the exposed resist film in a developing solution, a predetermined resist pattern is formed. As the developing solution, a solvent having a solubility parameter (SP value) close to that of the compound of the formula (1) to be used is preferably selected. A polar solvent such as a ketone-based solvent, an ester-based solvent, an alcohol-based solvent, an amide-based solvent, and an ether-based solvent; and a hydrocarbon-based solvent, or an alkaline aqueous solution can be used.

Examples of the ketone-based solvent include, but not limited to, 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include, but not limited to, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include, but not limited to, an alcohol such as methyl alcohol, ethyl alcohol, n-propyl alcohol, isopropyl alcohol (2-propanol), n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, but not limited to, dioxane and tetrahydrofuran in addition to the above glycol ether-based solvents.

Examples of the amide-based solvent which can be used include, but not limited to, N-methyl-2-pyrrolidone, N,N-dimethylacetamide, N,N-dimethylformamide, phosphoric hexamethyltriamide, and 1,3-dimethyl-2-imidazolidinone.

Examples of the hydrocarbon-based solvent include, but not limited to, an aromatic hydrocarbon-based solvent such as toluene and xylene; and an aliphatic hydrocarbon-based solvent such as pentane, hexane, octane, and decane.

A plurality of above solvents may be mixed, or the solvent may be used by mixing the solvent with a solvent other than those described above or water within the range having performance. In order to sufficiently exhibit the desired effect of the present embodiment, the water content ratio as the whole developing solution is preferably less than 70% by mass, more preferably less than 50% by mass, still more preferably less than 30% by mass, and further preferably less than 10% by mass. Particularly preferably, the developing solution is substantially moisture free. That is, the content of the organic solvent in the developing solution is preferably 30% by mass or more and 100% by mass or less based on the total amount of the developing solution, more preferably 50% by mass or more and 100% by mass or less, still more preferably 70% by mass or more and 100% by mass or less, further more preferably 90% by mass or more and 100% by mass or less, and particularly preferably 95% by mass or more and 100% by mass or less.

Examples of the alkaline aqueous solution include, but not limited to, an alkaline compound such as mono-, di- or tri-alkylamines, mono-, di- or tri-alkanolamines, heterocyclic amines, tetramethyl ammonium hydroxide (TMAH), and choline.

Particularly, the developing solution containing at least one kind of solvent selected from a ketone-based solvent, an ester-based solvent, an alcohol-based solvent, an amide-based solvent, and an ether-based solvent tends to improve resist performance such as resolution and roughness of the resist pattern, which is preferable.

The vapor pressure of the developing solution is preferably 5 kPa or less at 20° C., more preferably 3 kPa or less, and still more preferably 2 kPa or less. The evaporation of the developing solution on the substrate or in a developing cup tends to be inhibited by setting the vapor pressure of the developing solution to 5 kPa or less, to improve temperature uniformity within a wafer surface, thereby resulting in a tendency of improvement in size uniformity within the wafer surface.

Specific examples of developing solution having a vapor pressure of 5 kPa or less include, but not limited to, a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone, and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol; an ether-based solvent such as tetrahydrofuran; an amide-based solvent such as N-methyl-2-pyrrolidone, N,N-dimethylacetamide, and N,N-dimethylformamide; an aromatic hydrocarbon-based solvent such as toluene and xylene; and an aliphatic hydrocarbon-based solvent such as octane and decane.

Specific examples of developing solution having a vapor pressure of 2 kPa or less which is a particularly preferable range include, but not limited to, a ketone-based solvent such as 1-octanone, 2-octanone, 1-nonanone, 2-nonanone, 4-heptanone, 2-hexanone, diisobutyl ketone, cyclohexanone, methylcyclohexanone, and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol, and n-decanol; a glycol-based solvent such as ethylene glycol, diethylene glycol, and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol; an amide-based solvent such as N-methyl-2-pyrrolidone, N,N-dimethylacetamide, and N,N-dimethylformamide; an aromatic hydrocarbon-based solvent such as xylene; and an aliphatic hydrocarbon-based solvent such as octane and decane.

To the developing solution, a surfactant can be added in an appropriate amount, if required. The surfactant is not particularly limited but, for example, an ionic or nonionic fluorine-based and/or silicon-based surfactant can be used. Examples of the fluorine-based and/or silicon-based surfactant include the surfactants described in Japanese Patent Application Laid-Open Nos. 62-36663, 61-226746, 61-226745, 62-170950, 63-34540, 7-230165, 8-62834, 9-54432, and 9-5988, and U.S. Pat. Nos. 5,405,720, 5,360,692, 5,529,881, 5,296,330, 5,436,098, 5,576,143, 5,294,511, and 5,824,451. The surfactant is preferably a nonionic surfactant. The nonionic surfactant is not particularly limited, but a fluorine-based surfactant or a silicon-based surfactant is more preferably used.

The amount of the surfactant used can be usually 0.001 to 5% by mass based on the total amount of the developing solution, preferably 0.005 to 2% by mass, and more preferably 0.01 to 0.5% by mass.

The development method is not particularly limited, but for example, a method for dipping a substrate in a bath filled with a developing solution for a fixed time (dipping method), a method for raising a developing solution on a substrate surface by the effect of a surface tension and keeping it still for a fixed time, thereby conducting the development (puddle method), a method for spraying a developing solution on a substrate surface (spraying method), and a method for continuously ejecting a developing solution on a substrate rotating at a constant speed while scanning a developing solution ejecting nozzle at a constant rate (dynamic dispense method), or the like may be applied. The time for conducting the pattern development is not particularly limited, but is preferably 10 seconds to 90 seconds.

After the step of conducting development, a step of stopping the development by the replacement with another solvent may be practiced.

A step of rinsing the resist film with a rinsing solution containing an organic solvent is preferably provided after the development.

The rinsing solution used in the rinsing step after development is not particularly limited as long as the rinsing solution does not dissolve the resist pattern cured by cross-linking. A solution containing a general organic solvent or water may be used as the rinsing solution. As the rinsing solution, a rinsing solution containing at least one kind of organic solvent selected from a hydrocarbon-based solvent, a ketone-based solvent, an ester-based solvent, an alcohol-based solvent, an amide-based solvent, and an ether-based solvent is preferably used. More preferably, after development, a step of rinsing the film by using a rinsing solution containing at least one kind of organic solvent selected from the group consisting of a ketone-based solvent, an ester-based solvent, an alcohol-based solvent and an amide-based solvent is conducted. Still more preferably, after development, a step of rinsing the film by using a rinsing solution containing an alcohol-based solvent or an ester-based solvent is conducted. Further more preferably, after development, a step of rinsing the film by using a rinsing solution containing a monohydric alcohol is conducted. Particularly preferably, after development, a step of rinsing the film by using a rinsing solution containing a monohydric alcohol having 5 or more carbon atoms is conducted. The time for rinsing the pattern is not particularly limited, but is preferably 10 seconds to 90 seconds.

Herein, examples of the monohydric alcohol used in the rinsing step after development include a linear, branched or cyclic monohydric alcohol. Specific examples include, but not limited to, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol or the like can be used. Examples of monohydric alcohol having 5 or more carbon atoms include, but not limited to, 1-hexanol, 2-hexanol, 4-methyl-2-pentanol, 1-pentanol, and 3-methyl-1-butanol or the like can be used.

A plurality of these components may be mixed, or the component may be used by mixing the component with an organic solvent other than those described above.

The water content ratio in the rinsing solution is preferably 10% by mass or less, more preferably 5% by mass or less, and still more preferably 3% by mass or less. By setting the water content ratio to 10% by mass or less, better development characteristics tend to be obtained.

The vapor pressure at 20° C. of the rinsing solution used after development is preferably 0.05 kPa or more and 5 kPa or less, more preferably 0.1 kPa or more and 5 kPa or less, and much more preferably 0.12 kPa or more and 3 kPa or less. By setting the vapor pressure of the rinsing solution to 0.05 kPa or more and 5 kPa or less, the temperature uniformity in the wafer surface tends to be enhanced and moreover, swelling due to permeation of the rinsing solution is further inhibited. As a result, the dimensional uniformity in the wafer surface tends to be further improved.

The rinsing solution may also be used after adding an appropriate amount of a surfactant to the rinsing solution.

In the rinsing step, the wafer after development is rinsed using the organic solvent-containing rinsing solution. The method for rinsing treatment is not particularly limited. However, for example, a method for continuously ejecting a rinsing solution on a substrate spinning at a constant speed (spin coating method), a method for dipping a substrate in a bath filled with a rinsing solution for a fixed time (dipping method), and a method for spraying a rinsing solution on a substrate surface (spraying method), or the like can be applied. Above all, it is preferable to conduct the rinsing treatment by the spin coating method and after the rinsing, spin the substrate at a rotational speed of 2,000 rpm to 4,000 rpm, to remove the rinsing solution from the substrate surface.

After forming the resist pattern, a pattern wiring substrate is obtained by etching. Etching can be conducted by a publicly known method such as dry etching using plasma gas, and wet etching with an alkaline solution, a cupric chloride solution, and a ferric chloride solution or the like.

After forming the resist pattern, plating can also be conducted. Examples of the above plating method include, but not limited to, copper plating, solder plating, nickel plating, and gold plating.

The remaining resist pattern after etching can be peeled by an organic solvent. Examples of the above organic solvent include PGMEA (propylene glycol monomethyl ether acetate), PGME (propylene glycol monomethyl ether), and EL (ethyl lactate). Examples of the above peeling method include a dipping method and a spraying method. A wiring substrate having a resist pattern formed thereon may be a multilayer wiring substrate, and may have a small diameter through hole.

The wiring substrate obtained in the present embodiment can also be formed by a method for forming a resist pattern, then depositing a metal in vacuum, and subsequently dissolving the resist pattern in a solution, i.e., a liftoff method.

EXAMPLES

The present embodiment will be more specifically described with reference to examples below. However, the present embodiment is not limited to these examples. Hereinafter, the structure of a compound in synthesis examples and comparative examples was confirmed by $^1$H-NMR measurement.

[Molecular Weight]

A molecular weight was measured using Acquity UPLC/MALDI-Synapt HDMS manufactured by Water Corporation according to LC-MS analysis.

[Polystyrene Based Molecular Weight]

A polystyrene based weight average molecular weight (Mw) and number average molecular weight (Mn) were determined according to gel permeation chromatography (GPC) analysis. Dispersity (Mw/Mn) was determined.

Apparatus: Shodex model GPC-101 (manufactured by Showa Denko K.K.)
Column: KF-80M×3
Eluent: 1 mL/min THF
Temperature: 40° C.

(Synthesis Example 1) Synthesis of Dibenzochrysene (DBC)

On the basis of the description of Example 1 in Japanese Patent Application Laid-Open No. 2013-227307, 6.8 g of dibenzo[g,p]chrysene (DBC) was obtained as a brown powdery solid by synthesis. As a result of liquid chromatography analysis, the obtained solid had a purity of 99.8%.

(Synthesis Example 2) Synthesis of Hydroxydibenzochrysene (HDBC)

On the basis of the description of Example 7 in Japanese Patent Application Laid-Open No. 2013-227307, 1.6 g of hydroxydibenzochrysene (HDBC) was obtained as a brown powdery solid by the sulfonation of dibenzo[g,p]chrysene on the same scale, followed by the hydroxylation of the obtained dibenzo[g,p]chrysene sulfonate.

As a result of liquid chromatography mass spectrometry (LC/MS analysis), 98% of the obtained compound was 4-substituted hydroxydibenzochrysene (HDBC-4), and the remaining portion was 3-substituted hydroxydibenzochrysene (HDBC-3). This LC/MS analysis employed Acquity UPLC/MALDI-Synapt HDMS manufactured by Water Corporation.

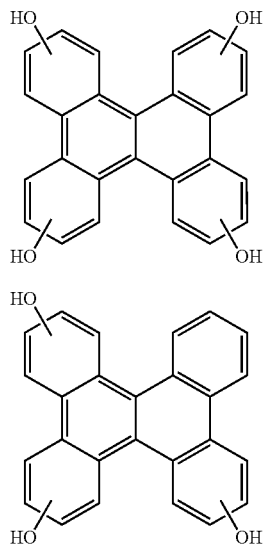

(Synthesis Example 3) Synthesis of R-DBC

A container (internal capacity: 100 mL) equipped with a stirrer, a condenser tube, and a burette was charged with 10 g (30 mmol) of DBC, 0.7 g (42 mmol) of paraformaldehyde, 50 mL of glacial acetic acid, and 50 mL of PGME, and 8 mL of 95% sulfuric acid was added thereto. This reaction solution was stirred at 100° C. for 6 hours to perform reaction. Next, the reaction solution was concentrated. The reaction product was precipitated by the addition of 1000 mL of methanol. After cooling to room temperature, the precipitates were separated by filtration. The obtained solid matter was filtered, dried, and then separated and purified by column chromatography to obtain 6.4 g of the objective resin (R-DBC).

As a result of measuring the polystyrene based molecular weight of the obtained resin by the above method, it was Mn: 698, Mw: 1563, and Mw/Mn: 2.24.

Examples 1 to 3

Resist compositions corresponding to Examples 1 to 3 were each prepared using the above compounds or resins obtained in Synthesis Examples 1 to 3, and the following materials according to the composition shown in Table 1.

Acid generating agent: di-t-butyl diphenyl iodonium nonafluoromethanesulfonate (DTDPI) manufactured by Midori Kagaku Co., Ltd.

Crosslinking agent: NIKALAC MX270 (NIKALAC) manufactured by Sanwa Chemical Co., Ltd.

Organic solvent: propylene glycol monomethyl ether acetate (PGMEA)

Next, a silicon substrate was spin coated with each of the resist compositions of Examples 1 to 3, and then baked at 110° C. for 90 seconds to respectively form resist films with a film thickness of 200 nm. Subsequently, these resist films were evaluated for their etching resistance by an etching test under conditions shown below. The evaluation results are shown in Table 1.

[Etching Test]

Etching apparatus: RIE-10NR manufactured by SAMCO Inc.

Output: 50 W

Pressure: 20 Pa

Time: 2 min

Etching gas

Ar gas flow rate:$CF_4$ gas flow rate:$O_2$ gas flow rate=50:5:5 (sccm)

[Evaluation of Etching Resistance]

The evaluation of etching resistance was conducted by the following procedures.

First, a resist film of novolac was prepared under the same conditions as in Examples 1 to 3 except that novolac (PSM 4357 manufactured by Gunei Chemical Industry Co., Ltd.) was used instead of the compounds or the resins of Examples 1 to 3. Then, this resist film of novolac was used as a subject in the above etching test, and its etching rate at that time was measured.

Next, the resist films of Examples 1 to 3 were similarly used as subjects in the above etching test, and their etching rates at that time were measured.

Then, etching resistance was evaluated according to the following evaluation criteria on the basis of the etching rate of the resist film of novolac.

<Evaluation Criteria>

A: The etching rate was less than −10% as compared with the resist film of novolac.

B: The etching rate was −10% to +5% as compared with the resist film of novolac.

C: The etching rate was more than +5% as compared with the resist film of novolac.

TABLE 1

| | Compound or resin (parts by mass) | Organic solvent (parts by mass) | Acid generating agent (parts by mass) | Crosslinking agent (parts by mass) | Evaluation of etching resistance |
|---|---|---|---|---|---|
| Example 1 | DBC (10) | PGMEA (90) | DTDPI (0.5) | NIKALAC (0.5) | A |
| Example 2 | HDBC (10) | PGMEA (90) | DTDPI (0.5) | NIKALAC (0.5) | A |
| Example 3 | R-DBC (10) | PGMEA (90) | DTDPI (0.5) | NIKALAC (0.5) | A |

(Synthesis Example 4) Synthesis of Iododibenzochrysene

On the basis of the description of Japanese Patent Application Laid-Open No. 2013-227307, a four necked flask (capacity: 5 L) equipped with a mechanical stirring apparatus and a reflux condenser tube was charged with 30 g (0.0913 mol) of DBC obtained in Synthesis Example 1 and 900 g of chloroform (manufactured by Wako Pure Chemical Industries, Ltd.), and DBC was dissolved in chloroform by stirring at room temperature. The flask was cooled to 2° C. using an ice salt bath (−5° C.). In this state, 950 g of a 5% solution of $I_2$ in $CHCl_3$ (solution of iodine in chloroform) was dropped thereto over 1 hour using a dropping pump (PTFE diaphragm pump). While the stirring was continued, the reaction was monitored by HPLC analysis every 1 hour after the dropping terminated. The reaction was stopped by the addition of 620 g of a 1 N aqueous $NaHSO_3$ solution (1 mol/L aqueous $NaHSO_3$ solution). Then, the contents were neutralized by the addition of 526.6 g of a 9% aqueous $NaHCO_3$ solution, and the obtained contents were washed with water three times. Subsequently, the solvent was removed from this organic phase by concentration under reduced pressure using an evaporator to obtain 41.2 g of a white solid. As a result of liquid chromatography mass spectrometry (LC/MS analysis), the obtained compound was an iododibenzochrysene mixture containing 7.0% monoiododibenzochrysene (IDBC-1), 80% diiododibenzochrysene (IDBC-2), and 13% triiododibenzochrysene (IDBC-3).

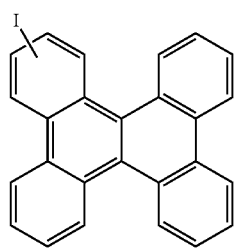

(IDBC-1)

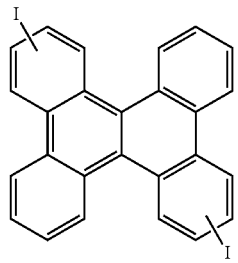

(IDBC-2)

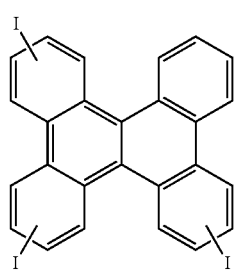

(IDBC-3)

(Synthesis Example 5) Synthesis of Dinitrodibenzochrysene

On the basis of the description of Japanese Patent Application Laid-Open No. 2013-227307, a four necked flask (capacity: 300 mL) equipped with a mechanical stirring apparatus and a reflux condenser tube was charged with 6.67 g (0.0203 mol) of DBC obtained in Synthesis Example 1 and 200 g of chloroform (manufactured by Wako Pure Chemical Industries, Ltd.), and DBC was dissolved in chloroform by stirring in a water bath (26° C.). Then, 7.58 g of a 67.5% aqueous $HNO_3$ solution (aqueous nitric acid solution) (containing 0.0812 mol of $HNO_3$) was dropped thereto over 5 minutes using a pipette. This dropping caused heat generation of the contents so that the temperature of the solution was elevated to 28° C. In addition, the color of the solution was changed from pale yellow color to dark brown color in about 10 minutes from the completion of the dropping. The stirring was continued in a state where the temperature of the contents was 26 to 27° C. A yellow orange solid started to be precipitated about 15 minutes after the dropping terminated. The precipitates were increased while the time passed. The contents were in a slurry form in 2 hours from the completion of the dropping. Subsequently, the water bath was changed to a hot water bath having a temperature of 65° C., and reflux reaction (internal temperature: 59° C.) was performed for 4 hours. In the contents, yellow slurry particles were rendered finer while the ratio of dinitrodibenzochrysene (NO2DBC-2) detected by LCMS analysis was increased, and the progression of its production was confirmed.

In order to promote the production of dinitrodibenzochrysene, 1.89 g of a 67.5% aqueous $HNO_3$ solution (aqueous nitric acid solution) (containing 0.0203 mol of $HNO_3$) was further added thereto, and the reflux reaction was continued for 1 hour to complete the reaction. Subsequently, the contents after the above operation were cooled with stirring until the temperature reached 25° C. Then, solid liquid separation was performed using a Buchner funnel and a Kiriyama filter paper to isolate solid matter. Subsequently, the obtained solid matter was washed with 50 g of methanol for the purpose of removing acid portions therefrom, and then dried under reduced pressure at a temperature of 60° C. for 12 hours to obtain 6 g of a yellow powder. As a result of liquid chromatography mass spectrometry (LC/MS analysis), the above yellow powder was confirmed to be dinitrodibenzochrysene (NO2DBC-2) containing 2.0% mononitrodibenzochrysene (NO2DBC-1).

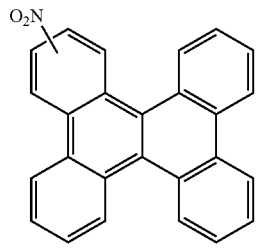

(NO2DBC-1)

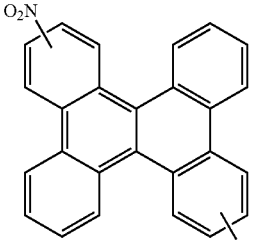

(NO2DBC 2)

(Synthesis Example 6) Synthesis of Diaminodibenzochrysene

On the basis of the description of Japanese Patent Application Laid-Open No. 2013-227307, a three necked flask (capacity: 200 mL) equipped with a magnet type stirring apparatus and a reflux condenser tube was charged with 2.0 g of the above mixture of nitrodibenzochrysene obtained in Synthesis Example 5, 0.2 g (dry mass based) of 5% Pd/C (50% water wetted palladium carbon), and 30 g of tetrahydrofuran (THF), and the contents were heated to 60° C. by stirring in a hot water bath (65° C.). Subsequently, 2.39 g of an 80% aqueous hydrazine solution, i.e., an aqueous solution containing 0.0382 mol of hydrazine (NH$_2$NH$_2$), was dropped thereto over 5 minutes using a pipette. This dropping gradually changed the contents from a yellow slurry state to a red brown liquid. In this operation, the generation of nitrogen gas and heat generation (reflux) were observed. Then, the reflux was continued with stirring for 2 hours in a state where the temperature of the contents was 63° C. to complete the reaction. Then, for the purpose of removing Pd/C, solid liquid separation was performed at a temperature of about 30° C. using a Buchner funnel, No. 5C filter paper, and RADIOLITE (filter aid) to isolate a red brown liquid. Subsequently, this red brown solution was charged to a three necked flask (capacity: 100 mL) equipped with a concentration apparatus, and the volume was decreased under reduced pressure using an aspirator at an internal temperature of about 45° C. until the amount of the solution (tetrahydrofuran) was almost halved to obtain a concentrated red brown solution. The red brown solution thus obtained was further dropped using a pipette to 120 g of distilled water stirred in a beaker (capacity: 300 mL) at room temperature. This dropping precipitated yellow red solid matter. The contents were subjected to solid liquid separation using a Buchner funnel and a Kiriyama filter paper to obtain yellow orange solid matter. The obtained solid matter was dried at a temperature of 60° C. and under reduced pressure of 10 mmHg for 12 hours to obtain 1.4 g of a yellow orange powder. As a result of liquid chromatography mass spectrometry (LC/MS analysis), the above yellow orange powder was confirmed to be diaminodibenzochrysene (NH2DBC-2) containing 4.0% monoaminodibenzochrysene (NH2DBC-1).

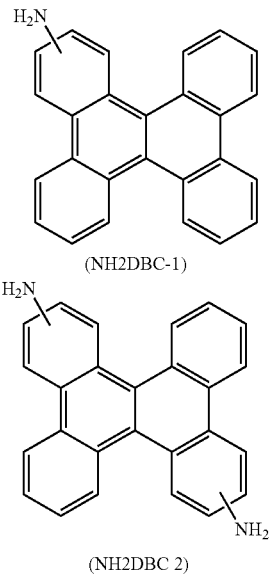

(NH2DBC-1)

(NH2DBC 2)

(Synthesis Example 7) Synthesis of Aminodiglycidyl Dibenzochrysene

On the basis of the description of Japanese Patent Application Laid-Open No. 2013-227307, a four necked flask (capacity: 300 mL) equipped with a magnet type stirring apparatus and a reflux condenser tube was charged with 10.85 g of the mixture of aminodibenzochrysene obtained in Synthesis Example 6, 27 g of ethanol (manufactured by Wako Pure Chemical Industries, Ltd.), and 67.2 g (0.726 mol) of epichlorohydrin (manufactured by Kanto Chemical Co., Inc.), and the contents were reacted with stirring at an internal temperature of 80° C. for 6 hours while incubated using a hot water bath. This changed the contents to a red brown solution. Subsequently, while the stirring was continued in a hot water bath, the internal temperature was lowered to 60° C. Then, 10.67 g of a 50% aqueous NaOH solution (aqueous sodium hydroxide solution) (containing 0.267 mol of NaOH) was dropped thereto over 5 hours using a pipette. Then, the stirring was continued for 3 hours and stopped. Subsequently, the solvent (ethanol+water) was removed under reduced pressure using an aspirator. Then, the contents were dissolved by the addition of 100 g of toluene, and washed with 50 g of distilled water three times. The solvent in the organic phase thus washed with water was removed at a temperature of 100° C. and under reduced pressure of 1 mmHg to obtain 12.3 g of a red brown mass. As a result of liquid chromatography mass spectrometry (LC/MS analysis), the above yellow orange powder was confirmed to be diaminodiglycidyl dibenzochrysene (AGDBC-2) containing 4.0% monoaminodiglycidyl dibenzochrysene (AGDBC-1).

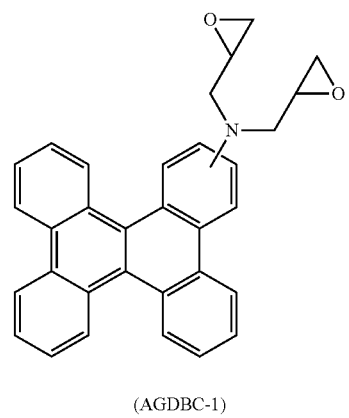

(AGDBC-1)

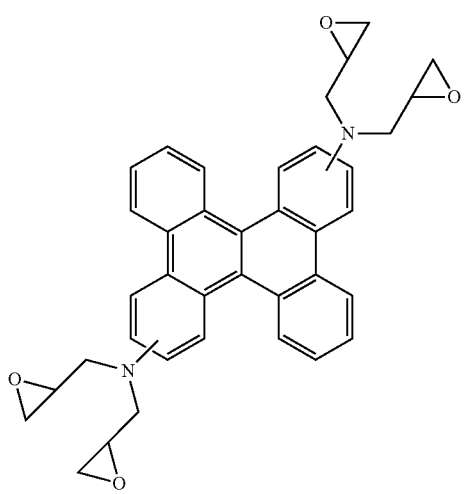

(AGDBC-2)

(Synthesis Example 8) Synthesis of
Dibenzochrysene Glycidyl Ether

On the basis of the description of Japanese Patent Application Laid-Open No. 2014-152164, 10 g (about 0.255 mol) of hydroxydibenzochrysene obtained in Synthesis Example 2, 100 g of ethanol, and 300 g (3.24 mol) of epichlorohydrin (manufactured by Kanto Chemical Co., Inc.) were charged, and stirred and mixed at 40° C. While the internal temperature was kept at 40° C., 4.3 g (containing 0.11 mol) of a sodium hydroxide powder was added to the above contents to obtain a solution. Then, the solvent (ethanol and epichlorohydrin) was removed under reduced pressure. Subsequently, 100 g of methyl isobutyl ketone (MIBK) was added to the contents thus free from the solvent, and the mixture was stirred. Then, insoluble matter was removed to obtain 1.2 g of dibenzochrysene glycidyl ether (DBCGE) as yellow oily matter. As a result of liquid chromatography mass spectrometry (LC/MS analysis), the obtained compound was confirmed to be 4-substituted dibenzochrysene glycidyl ether (DBCGE-4) containing 2.0% 3-substituted dibenzochrysene glycidyl ether (DBCGE-3) represented by the following formula:

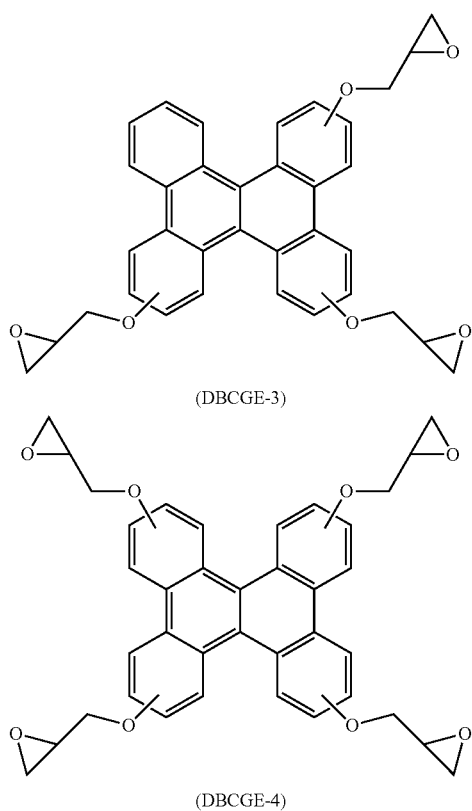

(DBCGE-3)

(DBCGE-4)

(Synthesis Example 9) Synthesis of
Dibenzochrysene Acryl Compound

On the basis of the description of Japanese Patent Application Laid-Open No. 2014-152164, 10 g (0.026 mol of hydroxydibenzochrysene obtained in Synthesis Example 2, and 50 mg of phenothiazine (Kanto Chemical Co., Inc.) were dissolved in 200 g of acetonitrile (manufactured by Wako Pure Chemical Industries, Ltd.). Then, 18.5 g (0.2 mol) of acryloyl chloride (manufactured by Wako Pure Chemical Industries, Ltd.) and 26 g (0.26 mol of triethylamine (manufactured by Kanto Chemical Co., Inc.) were dropped thereto, and the mixture was stirred at 25° C. for 6 hours. Then, 10 g of methanol was dropped thereto. The reaction solution was washed by the addition of 800 g of ethyl acetate and 150 g of distilled water. Washing with distilled water was repeated twice. Then, the solvent was distilled off under reduced pressure using an evaporator. The obtained oily matter was purified by silica gel column chromatography using a mixed solvent of toluene/ethyl acetate=10/1 and dried under reduced pressure to obtain 9.4 g of a brown powdery solid. As a result of liquid chromatography mass spectrometry (LC/MS analysis), the obtained compound was confirmed to be a 4-substituted dibenzochrysene acryl compound (ACDBC-4) represented by the following formula:

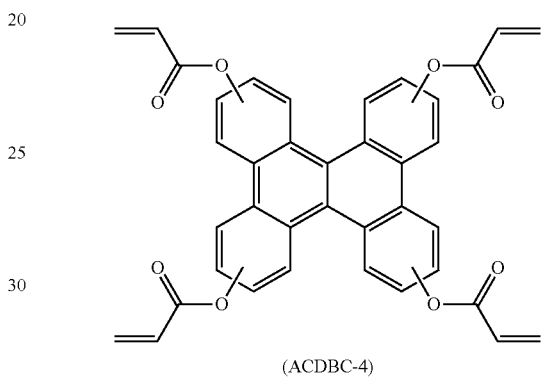

(ACDBC-4)

(Synthesis Example 10) Synthesis of
Dibenzochrysene Methacryl Compound

On the basis of the description of Japanese Patent Application Laid-Open No. 2014-152164, 10 g (0.026 mol of hydroxydibenzochrysene obtained in Synthesis Example 2, and 50 mg of phenothiazine (Kanto Chemical Co., Inc.) were dissolved in 200 g of acetonitrile (manufactured by Wako Pure Chemical Industries, Ltd.). Then, 20.9 g (0.2 mol) of methacryloyl chloride (manufactured by Wako Pure Chemical Industries, Ltd.) and 26 g (0.26 mol) of triethylamine (manufactured by Kanto Chemical Co., Inc.) were dropped thereto, and the mixture was stirred at 25° C. for 6 hours. Then, 10 g of methanol was dropped thereto. The obtained reaction solution was washed by the addition of 800 g of ethyl acetate and 150 g of distilled water. Washing with distilled water was repeated twice. Then, the solvent was distilled off under reduced pressure using an evaporator. The obtained oily matter was purified by silica gel column chromatography using a mixed solvent of toluene/ethyl acetate=10/1 and dried under reduced pressure to obtain 11.3 g of a brown powdery solid. As a result of liquid chromatography mass spectrometry (LC/MS analysis), the obtained compound was confirmed to be a 4-substituted dibenzochrysene methacryl compound (MCDBC-4) represented by the following formula:

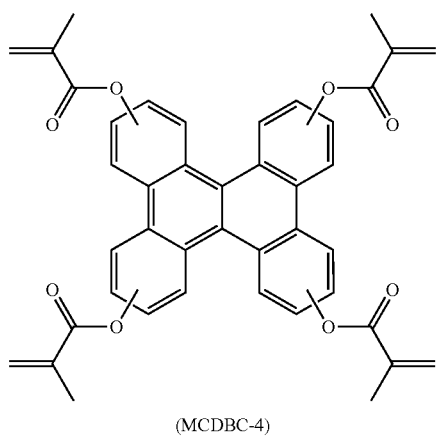

(MCDBC-4)

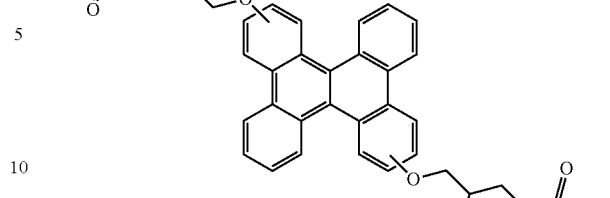

(AODBC-2)

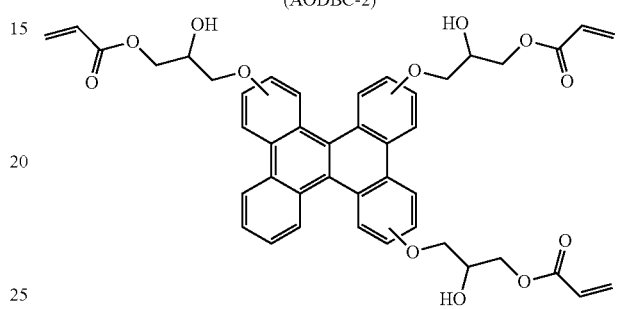

(AODBC-3)

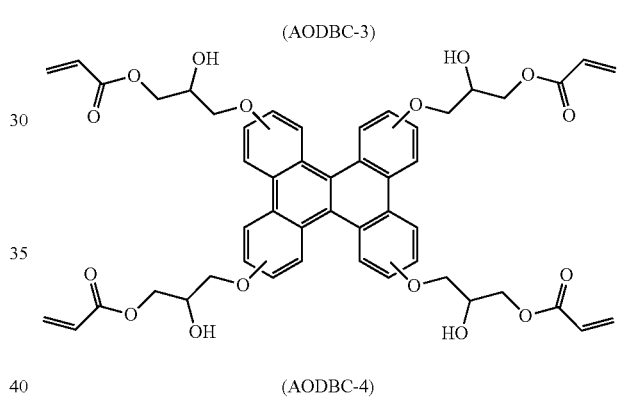

(AODBC-4)

(Synthesis Example 11) Synthesis of Acryloyloxydibenzochrysene Compound

On the basis of the description of Japanese Patent Application Laid-Open No. 2014-152164, 5.0 g (0.0081 mol) of dibenzochrysene glycidyl ether obtained in Synthesis Example 8, 30 mg of phenothiazine (Kanto Chemical Co., Inc.), and 60 mg of triphenylphosphine (manufactured by Wako Pure Chemical Industries, Ltd.) were dissolved in 50.0 g (0.7 mol) of acrylic acid (manufactured by Kanto Chemical Co., Inc.). Then, 100 g of toluene (manufactured by Wako Pure Chemical Industries, Ltd.) was added thereto, and the mixture was reacted at 90° C. for 10 hours in an oil bath. 400 g of ethyl acetate and a saturated aqueous solution of sodium bicarbonate were added to the obtained reaction solution, followed by the separation of the ethyl acetate phase. Subsequently, insoluble matter was filtered off, and the ethyl acetate phase was then washed with 100 g of distilled water, further concentrated under reduced pressure, and then dried to obtain 3.1 g of a brown solid. As a result of liquid chromatography mass spectrometry (LC/MS analysis), the obtained compound was confirmed to be a mixture of acryloyloxydibenzochrysene (AODBC) represented by the following formulas:

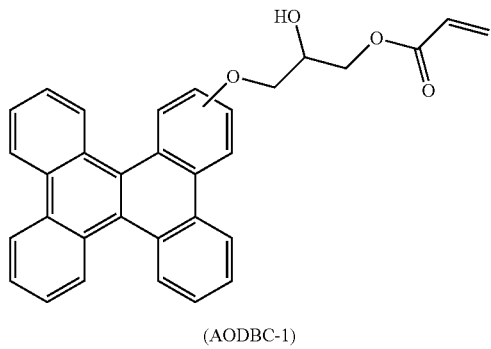

(AODBC-1)

(Synthesis Example 12) Synthesis of Methacryloyloxydibenzochrysene Compound

On the basis of the description of Japanese Patent Application Laid-Open No. 2014-152164, 5.0 g (0.0081 mol) of dibenzochrysene glycidyl ether obtained in Synthesis Example 8, 30 mg of phenothiazine (Kanto Chemical Co., Inc.), and 60 mg of triphenylphosphine (manufactured by Wako Pure Chemical Industries, Ltd.) were dissolved in 60.3 g (0.7 mol) of methacrylic acid (manufactured by Kanto Chemical Co., Inc.). Then, 100 g of toluene (manufactured by Wako Pure Chemical Industries, Ltd.) was added thereto. The mixture was reacted at 90° C. for 10 hours in an oil bath. 400 g of ethyl acetate and a saturated aqueous solution of sodium bicarbonate were added to the obtained reaction solution, followed by the separation of the ethyl acetate phase. Subsequently, insoluble matter was filtered off, and the ethyl acetate phase was then washed with 100 g of distilled water, concentrated under reduced pressure, and then dried to obtain 3.6 g of a brown solid. As a result of liquid chromatography mass spectrometry (LC/MS analysis), the obtained compound was confirmed to be a mixture of methacryloyloxydibenzochrysene (MAODBC) represented by the following formulas:

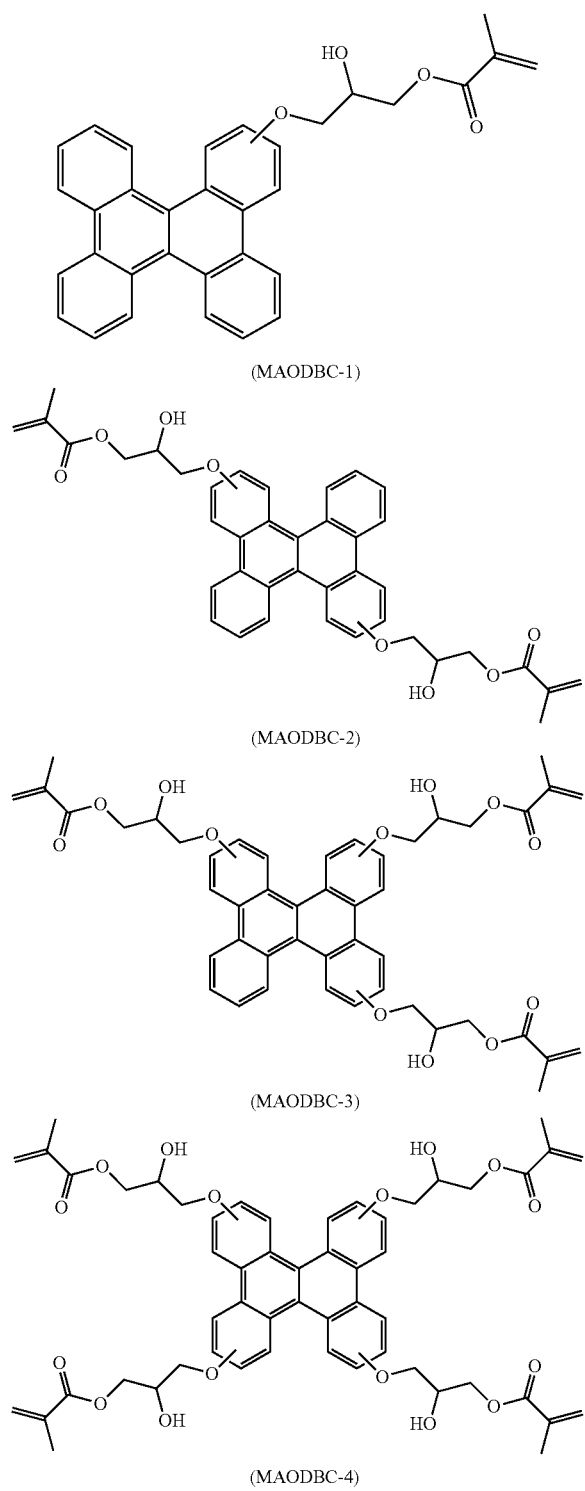

(MAODBC-1)

(MAODBC-2)

(MAODBC-3)

(MAODBC-4)

(Synthesis Example 13) Synthesis of Tetrathiol Dibenzochrysene

On the basis of the description of Japanese Patent Application Laid-Open No. 2013-227307, after sulfonation of dibenzochrysene, the sulfonic acid group of the obtained compound was converted to a sulfonyl halogen group (—$SO_2X$). The sulfonyl halogen group of the obtained compound was further converted to a thiol group to obtain 8.6 g of tetrathiol dibenzochrysene. As a result of liquid chromatography mass spectrometry (LC/MS analysis), the obtained compound was confirmed to be tetrathiol dibenzochrysene (SDBC-4) represented by the following formula:

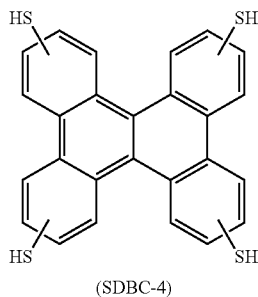

(SDBC-4)

(Synthesis Example 14) Synthesis of Tetraallyloxydibenzochrysene

On the basis of the description of Japanese Patent Application Laid-Open No. 2014-152164, 5 g (0.013 mol) of hydroxydibenzochrysene obtained in Synthesis Example 2 and 12.3 g (0.10 mol) of allyl bromide (manufactured by Tokyo Kasei Kogyo Co., Ltd.) were dissolved in 50 g of dimethyl sulfoxide (manufactured by Wako Pure Chemical Industries, Ltd.). Then, 2.54 g (0.064 mol) of sodium hydroxide (manufactured by Tosoh Corp., product name: Tosoh Pearl) was added thereto, and the mixture was stirred at 80° C. for 18 hours under a nitrogen gas stream. After the reaction terminated, the reaction solution was washed by the addition of 300 g of ethyl acetate and 80 g of distilled water. Washing with distilled water was repeated twice. Then, the solvent was distilled off under reduced pressure using an evaporator. The obtained solid was purified by silica gel column chromatography using toluene and dried under reduced pressure to obtain 4.6 g of a brown powdery solid. As a result of liquid chromatography mass spectrometry (LC/MS analysis), the obtained compound was confirmed to be tetraallyloxydibenzochrysene (TAODBC) represented by the following formula:

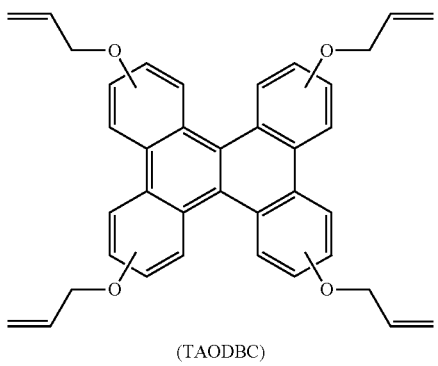

(TAODBC)

(Synthesis Example 15) Synthesis of HDBC-4-BOC

In a container (internal capacity: 200 mL) equipped with a stirrer, a condenser tube, and a burette, 4.9 g (12.5 mmol)

of the compound (HDBC-4) obtained in Synthesis Example 2 and 5.5 g (25 mmol) of di-t-butyl dicarbonate (manufactured by Sigma-Aldrich Corp.) were added to 100 mL of acetone, then 3.45 g (25 mmol) of potassium carbonate (manufactured by Sigma-Aldrich Corp.) was added, and the contents were stirred at 20° C. for 6 hours to perform reaction and obtain a reaction solution. Next, the reaction solution was concentrated. The reaction product was precipitated by the addition of 100 g of pure water to the concentrate. After cooling to room temperature, the solid matter was separated by filtration.

The obtained solid matter was filtered, dried, and then separated and purified by column chromatography to obtain 2 g of the objective compound (HDBC-4-BOC) represented by the formula (HDBC-4-BOC) shown below.

As a result of measuring the molecular weight of the obtained compound (HDBC-4-BOC) by the above method, it was 792.

The following peaks were found by the NMR measurement of the obtained compound (HDBC-4-BOC) under the above measurement conditions, and the compound was confirmed to have a chemical structure of the following formula (HDBC-4-BOC).

δ (ppm) 7.0 to 10.0 (12H, Ph-H), 1.6 (36H, C—CH$_3$)

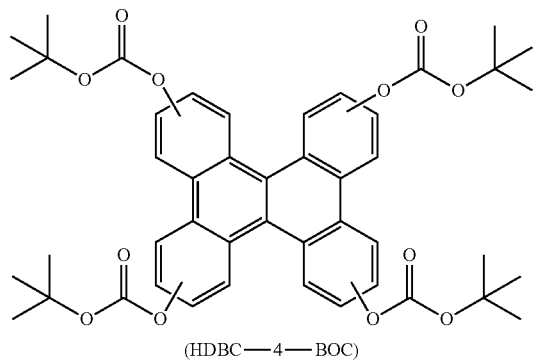

(HDBC—4—BOC)

(Synthesis Example 16) Synthesis of HDBC-4-MeBOC

In a container (internal capacity: 200 mL) equipped with a stirrer, a condenser tube, and a burette, 4.9 g (12.5 mmol) of the compound (HDBC-4) obtained in Synthesis Example 2 and 5.4 g (27 mmol) of t-butyl bromoacetate (manufactured by Sigma-Aldrich Corp.) were added to 100 mL of acetone, then 3.8 g (27 mmol) of potassium carbonate (manufactured by Sigma-Aldrich Corp.) and 0.8 g of 18-crown-6 were added, and the contents were stirred for 3 hours under reflux to perform reaction and obtain a reaction solution. Next, the reaction solution was concentrated. The reaction product was precipitated by the addition of 100 g of pure water to the concentrate. After cooling to room temperature, the solid matter was separated by filtration.

The obtained solid matter was filtered, dried, and then separated and purified by column chromatography to obtain 1.8 g of the objective compound (HDBC-4-MeBOC) represented by the formula (HDBC-4-MeBOC) shown below.

As a result of measuring the molecular weight of the obtained compound (HDBC-4-MeBOC) by the above method, it was 848.

The following peaks were found by the NMR measurement of the obtained compound (HDBC-4-MeBOC) under the above measurement conditions, and the compound was confirmed to have a chemical structure of the following formula (HDBC-4-MeBOC).

δ (ppm) 7.0 to 10.0 (12H, Ph-H), 4.7 to 4.8 (8H, C—CH$_2$—C), 1.3 to 1.4 (36H, C—CH$_3$)

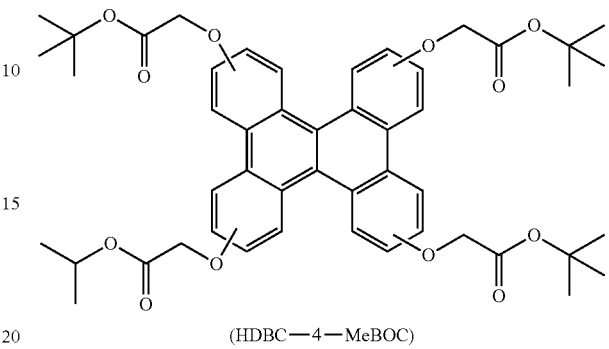

(HDBC—4—MeBOC)

(Synthesis Example 17) Synthesis of TetP-1

In a four necked flask (1000 mL) sufficiently dried, substituted with nitrogen, and equipped with a dropping funnel, a Dimroth condenser tube, a thermometer, and a stirring blade, 108.8 g/0.8 mol of 2,3,6-trimethylphenol manufactured by Honshu Chemical Industry Co., Ltd. and 18.4 g/0.1 mol of 2,7-naphthalenedicarboxaldehyde manufactured by Mitsubishi Gas Chemical Company, Inc. were mixed under a nitrogen gas stream, and dissolved by heating to about 60° C. Then, 0.1 mL of sulfuric acid, 0.8 mL of 3-mercaptopropionic acid, and 10 mL of toluene were added, and the mixture was reacted while stirring.

After the reaction terminated, it was stood to cool, and after it reached room temperature, it was cooled in an ice bath. It was left at rest for 1 hour, to produce a target light yellow crude crystal, which was filtered. Subsequently, the crude crystal was washed with warm water of 60° C. by stirring and recrystallized to obtain 8.99 g of the objective product represented by the following formula (TetP-1).

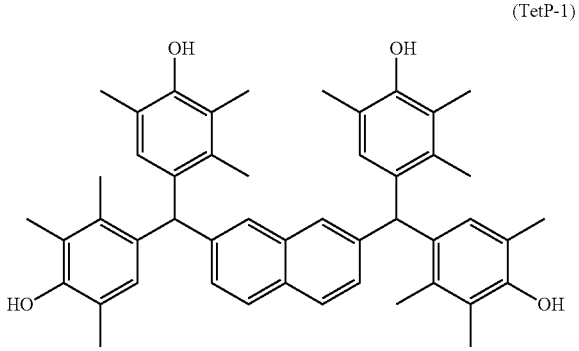 [SMILES: Cc1cc(C(c2ccc3ccc(C(c4cc(C)c(O)c(C)c4C)c4cc(C)c(O)c(C)c4C)cc3c2)c2cc(C)c(O)c(C)c2C)c(C)c(C)c1O]

(TetP-1)

(Synthesis Example 18) Synthesis of CR-1

74.3 g (3.71 mol) of anhydrous HF and 50.5 g (0.744 mol) of BF$_3$ were charged into a temperature-controllable autoclave (made of SUS316L) having an internal capacity of 500 mL and equipped with an electromagnetic stirring device, and the content was stirred and increased in pressure with carbon monoxide to 2 MPa while maintaining the liquid temperature to −30° C. Thereafter, while maintaining the pressure to 2 MPa and the liquid temperature to −30° C., a raw material obtained by mixing 57.0 g (0.248 mol) of 4-cyclohexylbenzene and 50.0 g of n-heptane was fed thereto. After maintaining the content for 1 hour, the content was collected into ice, diluted with benzene, and neutralized to provide an oily layer, which was analyzed by gas chromatograph for evaluating the reaction performance. The 4-cyclohexylbenzene conversion was 100%, and the 4-cyclohexylbenzaldehyde selectivity was 97.3%.

The target component was isolated by simple distillation and analyzed by GC-MS. That is, it was measured using Agilent 5975/6890N manufactured by Agilent Corporation. The result exhibited a molecular weight of 188, which was 4-cyclohexylbenzaldehyde (CHBAL) as the following formula. The chemical shift value of $^1$H-NMR in a deuterated chloroform solvent (δ ppm, TMS standard) was 1.0 to 1.6 (m, 10H), 2.6 (m, 1H), 7.4 (d, 2H), 7.8 (d, 2H), and 10.0 (s, 1H).

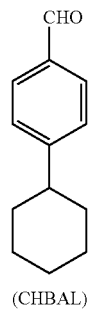

(CHBAL)

Under a nitrogen gas stream, resorcinol manufactured by Kanto Chemical Co., Inc. (22 g, 0.2 mol), the above 4-cyclohexylbenzaldehyde (46.0 g, 0.2 mol), and dehydrated ethanol (200 mL) were charged to a four necked flask (1000 mL) sufficiently dried, substituted with nitrogen, and equipped with a dropping funnel, a Dimroth condenser tube, a thermometer, and a stirring blade, to prepare an ethanol solution. This solution was heated to 85° C. by a mantle heater while stirring. Then, 75 mL of concentrated hydrochloric acid (35%) was dropped through the dropping funnel for 30 minutes, and continuously stirred at 85° C. for 3 hours. After the reaction terminated, it was stood to cool, and after it reached room temperature, it was cooled in an ice bath. It was left at rest for 1 hour, to produce a target light yellow crude crystal, which was filtered. The crude crystal was washed twice with 500 mL of methanol, filtered, and dried in a vacuum to obtain 50 g of the product.

The result of LC-MS analysis for the structure of the product exhibited a molecular weight of 1121. The chemical shift value (δ ppm, TMS standard) of $^1$H-NMR of the product in a deuterated chloroform solvent was 0.8 to 1.9 (m, 44H), 5.5 to 5.6 (d, 4H), 6.0 to 6.8 (m, 24H), and 8.4 to 8.5 (m, 8H). From these results, the obtained product was identified as an objective compound (CR-1) (yield: 91%).

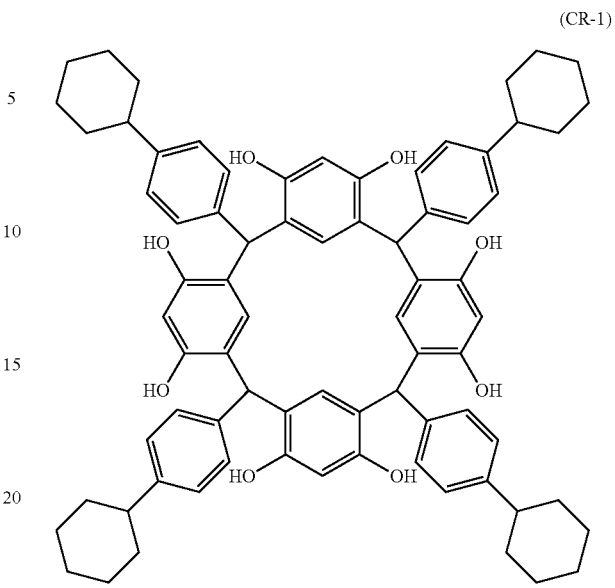

(CR-1)

Examples 4 to 19 and Comparative Examples 1 and 2

The following tests were conducted as Example 4 using the compounds obtained in Synthesis Example 2 and Synthesis Example 18 at a mass ratio of 1:9, Example 5 using the compounds obtained in Synthesis Example 2 and Synthesis Example 18 at a mass ratio of 9:1, Example 6 using the compounds obtained in Synthesis Example 2 and Synthesis Example 18 at a mass ratio of 5:5, Examples 7 to 19 using the compounds obtained in Synthesis Examples 4 to 16, Comparative Example 1 using the compound obtained in Synthesis Example 17, and Comparative Example 2 using the compound obtained in Synthesis Example 18.

(1) Solubility Test of Compound in Safe Solvent

The above compounds obtained in Synthesis Examples 2 and 4 to 18 were tested and evaluated for their solubility in propylene glycol monomethyl ether (PGME) and propylene glycol monomethyl ether acetate (PGMEA).

The evaluation was conducted according to the following criteria, and the results are shown in Table 2.
A: 10.0 wt % ≤ dissolution amount
B: 3.0 wt % ≤ dissolution amount <10.0 wt %
C: dissolution amount <3.0 wt %

(2) Resist Performance Test

Each component was prepared according to Table 1 into a homogeneous solution, which was then filtered through a Teflon membrane filter with a pore diameter of 0.1 μm to prepare a resist composition.

Of the above components, as the acid generating agent (C), the acid crosslinking agent (G), the acid diffusion controlling agent (E), and the solvent, the followings were used:

Acid Generating Agent (C)
P-1: triphenylbenzenesulfonium trifluoromethanesulfonate (Midori Kagaku Co., Ltd.)
Acid Crosslinking Agent (G)
C-1: NIKALAC MW-100LM (Sanwa Chemical Co., Ltd.)
Acid Diffusion Controlling Agent (E)
Q-1: trioctylamine (Tokyo Kasei Kogyo Co., Ltd.) Solvent S-1: propylene glycol monomethyl ether (Tokyo Kasei Kogyo Co., Ltd.)

Each prepared resist composition was evaluated for its heat resistance by the following procedures. A clean silicon wafer was spin coated with a resist, and then baked in an oven of 110° C. to form a resist film with a thickness of 60 nm. The film was visually observed.

As a result, all of the films were confirmed to be good films having no defect and have good heat resistance (evaluation: ○ (good)).

Then, each resist composition was evaluated for patterning by the following procedures.

A clean silicon wafer was spin coated with a resist, and then prebaked (PB) before exposure in an oven of 110° C. to form a resist film with a thickness of 60 nm. The resist film was irradiated with electron beams of 1:1 line and space setting with a 5 μm interval, a 50 nm interval, a 40 nm interval, and a 25 nm interval using an electron beam lithography system (ELS-7500 manufactured by ELIONIX INC.). After irradiation, it was heated at each predetermined temperature for 90 seconds, and immersed in 2.38% by weight TMAH alkaline developing solution for 60 seconds for development. Subsequently, it was washed with ultrapure water for 30 seconds, and dried to form a negative type resist pattern.

The obtained line and space were observed by a scanning electron microscope (S-4800 manufactured by Hitachi High-Technologies Corporation).

The pattern having each resolution was evaluated for whether or not pattern shape, line edge roughness, and sensitivity were good. A resist pattern having good pattern shape, line edge roughness, and sensitivity was evaluated as ○ (good). Unsuccessful formation of a resist pattern was evaluated as X (poor). First, the patterns with the resolution of 5 μm were evaluated as ○ in all of Examples 4 to 19 and Comparative Examples 1 and 2. Next, the patterns with the resolution of 25 nm in Example 4, Comparative Example 1, and Comparative Example 2 were evaluated. The evaluation results are shown in Table 2.

The minimum line width of the pattern which could be well formed was used as the resolution of the pattern. The rectangular pattern shape was evaluated as goodness. As for the line edge roughness, a pattern having asperities of less than 5 nm was evaluated as goodness. The dose amount (μC/cm$^2$) in this case was used as sensitivity. The dose amount of less than 150 μC/cm$^2$ was evaluated as goodness.

In the resists of Example 4, a resist pattern with good resolution of 25 nm and good sensitivity could be obtained. The roughness of the pattern was also small, and its shape was also good.

On the other hand, in the resists of Comparative Examples 1 and 2, resist patterns with good resolution of 40 nm could be obtained, but, a resist patterns with resolution of 25 nm could not be obtained.

TABLE 2

| | (1) Solubility test of compound in safe solvent | | Compound of Synthesis Example | Acid generating agent (P-1) | Acid crosslinking agent (C-1) | Acid diffusion controlling agent (Q-1) | Solvent (S-1) | Heat resistance | Pattern evaluation (resolution: |
|---|---|---|---|---|---|---|---|---|---|
| | (2) Resist performance evaluation | | | | | | | | |
| | Resist composition | | | | | | | | |
| | PGME | PGMEA | (g) | (g) | (g) | (g) | (g) | evaluation | 5 μm) |
| Example 4 (HDBC:CR-1 = 1:9 [mass ratio]) | A | A | 1 | 0.375 | 0.25 | 0.0375 | 30 | ○ | ○ |
| Example 5 (HDBC:CR-1 = 9:1 [mass ratio]) | B | B | 1 | 0.375 | 0.25 | 0.0375 | 30 | ○ | ○ |
| Example 6 (HDBC:CR-1 = 5:5 [mass ratio]) | A | B | 1 | 0.375 | 0.25 | 0.0375 | 30 | ○ | ○ |
| Example 7 (IDBC mixture obtained in Synthesis Example 4) | A | A | 1 | 0.375 | 0.25 | 0.0375 | 30 | ○ | ○ |
| Example 8 (NO2DBC mixture obtained in Synthesis Example 5) | A | A | 1 | 0.375 | 0.25 | 0.0375 | 30 | ○ | ○ |
| Example 9 (NH2DBC mixture obtained in Synthesis Example 6) | A | A | 1 | 0.375 | 0.25 | 0.0375 | 30 | ○ | ○ |
| Example 10 (AGDBC mixture obtained in Synthesis Example 7) | A | A | 1 | 0.375 | 0.25 | 0.0375 | 30 | ○ | ○ |
| Example 11 (DBCGE mixture obtained in Synthesis Example 8) | A | A | 1 | 0.375 | 0.25 | 0.0375 | 30 | ○ | ○ |
| Example 12 (ACDBC-4 obtained in Synthesis Example 9) | A | A | 1 | 0.375 | 0.25 | 0.0375 | 30 | ○ | ○ |
| Example 13 (MCDBC-4 obtained in Synthesis Example 10) | A | A | 1 | 0.375 | 0.25 | 0.0375 | 30 | ○ | ○ |
| Example 14 (AODBC mixture obtained in Synthesis Example 11) | A | A | 1 | 0.375 | 0.25 | 0.0375 | 30 | ○ | ○ |
| Example 15 (MAODBC mixture obtained in Synthesis Example 12) | A | A | 1 | 0.375 | 0.25 | 0.0375 | 30 | ○ | ○ |

TABLE 2-continued

| | (1) Solubility test of compound in safe solvent | | (2) Resist performance evaluation | | | | | | |
|---|---|---|---|---|---|---|---|---|---|
| | | | Resist composition | | | | | | |
| | | | Compound of Synthesis Example (g) | Acid generating agent (P-1) (g) | Acid crosslinking agent (C-1) (g) | Acid diffusion controlling agent (Q-1) (g) | Solvent (S-1) (g) | Heat resistance evaluation | Pattern evaluation (resolution: 5 μm) |
| | PGME | PGMEA | | | | | | | |
| Example 16 (SDBC-4 obtained in Synthesis Example 13) | A | A | 1 | 0.375 | 0.25 | 0.0375 | 30 | ○ | ○ |
| Example 17 (TAODBC obtained in Synthesis Example 14) | A | A | 1 | 0.375 | 0.25 | 0.0375 | 30 | ○ | ○ |
| Example 18 (HDBC-4-BOC obtained in Synthesis Example 15) | A | A | 1 | 0.375 | 0 | 0.0375 | 30 | ○ | ○ |
| Example 19 (HDBC-4-MeBOC obtained in Synthesis Example 16) | A | A | 1 | 0.375 | 0 | 0.0375 | 30 | ○ | ○ |
| Comparative Example 1 (TetP-1) | B | B | 1 | 0.375 | 0.25 | 0.0375 | 30 | ○ | ○ |
| Comparative Example 2 (CR-1) | B | C | 1 | 0.375 | 0.25 | 0.0375 | 30 | ○ | ○ |

TABLE 3

| | (2) Resist performance evaluation | | | | | |
|---|---|---|---|---|---|---|
| | Resist composition | | | | | |
| | Compound of Synthesis Example (g) | Acid generating agent (P-1) (g) | Acid crosslinking agent (C-1) (g) | Acid diffusion controlling agent (Q-1) (g) | Solvent (S-1) (g) | Pattern evaluation (resolution: 25 nm) |
| Example 4 (HDBC:CR-1 = 1:9 [mass ratio]) | 1 | 0.375 | 0.25 | 0.0375 | 30 | ○ |
| Comparative Example 1 (TetP-1) | 1 | 0.375 | 0.25 | 0.0375 | 30 | X |
| Comparative Example 2 (CR-1) | 1 | 0.375 | 0.25 | 0.0375 | 30 | X |

As seen in the above results, the resist material of the present invention has higher solubility in a safe solvent than that of the comparative resist material (TetP-1) or (CR-1), and the resist composition containing the resist material of the present invention has higher sensitivity than that of the resist composition containing the comparative resist material (TetP-1) or (CR-1), and enables the formation of the resist pattern having a better shape having smaller roughness. As long as the above configuration of the present embodiment is met, resist materials other than those described in examples also exhibit the same effects.

The present invention is suitably used in a resist composition which contains a compound represented by a specific chemical structural formula and is useful as a resist material, and a method for forming a resist pattern using the resist composition.

The invention claimed is:

1. A resist material comprising a compound represented by the following formula (3):

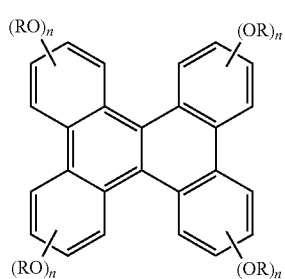

(3)

wherein each R is independently a hydrogen atom or an acid dissociation reactive group, wherein at least one of R is an acid dissociation reactive group; and each n is independently an integer of 0 to 4, wherein at least one of n is an integer of 1 to 4, wherein the acid dissociation reactive group is a group selected from the group consisting of the following:

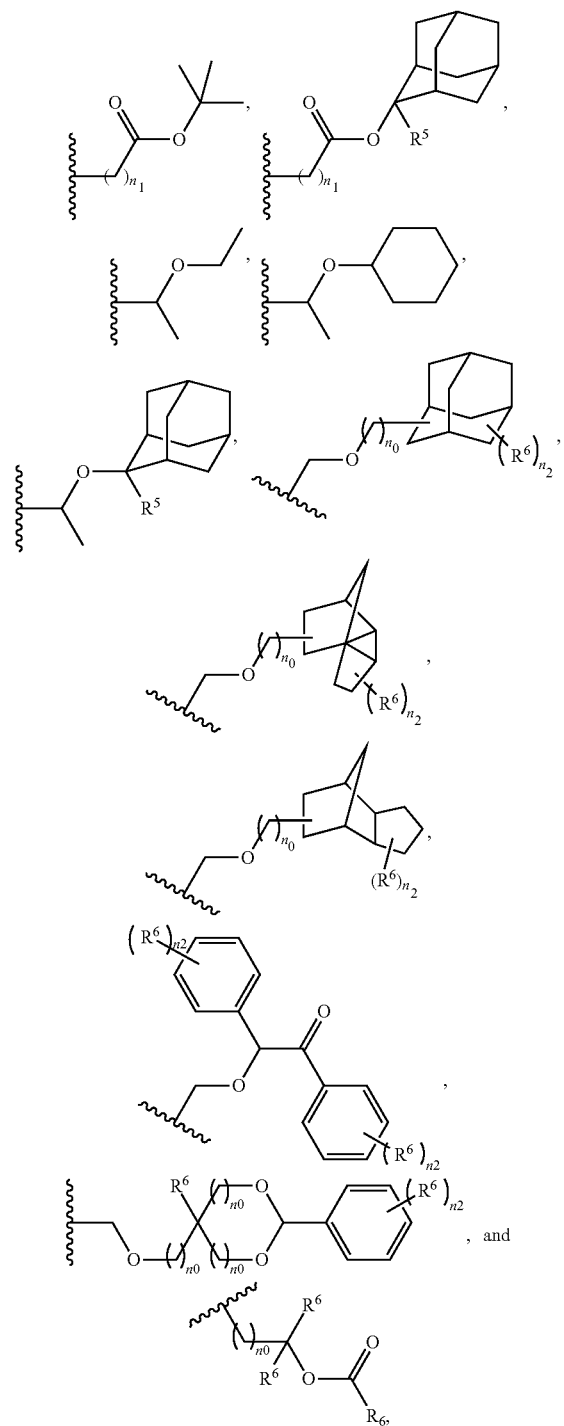

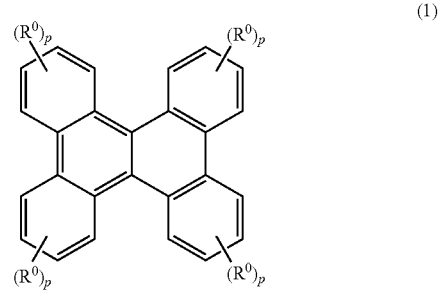

wherein each $R^0$ is independently a monovalent group having an oxygen atom, a monovalent group having a sulfur atom, a monovalent group having a nitrogen atom, a hydrocarbon group, or a halogen atom; and each p is independently an integer of 0 to 4; and at least one of an acid generating agent and an acid crosslinking agent.

3. The resist composition according to claim 2, wherein the compound having crosslinking reactivity is an aldehyde, a ketone, a carboxylic acid, a carboxylic acid halide, a halogen-containing compound, an amino compound, an imino compound, an isocyanate, or an unsaturated hydrocarbon group-containing compound.

4. The resist composition according to claim 2, wherein the resin is at least one kind selected from the group consisting of a novolac-based resin, an aralkyl-based resin, a hydroxystyrene-based resin, a (meth)acrylic acid-based resin, and a copolymer thereof.

5. The resist composition according to claim 2, wherein the resin has at least one structure selected from the group consisting of structures represented by the following formulas (4-1) to (4-16):

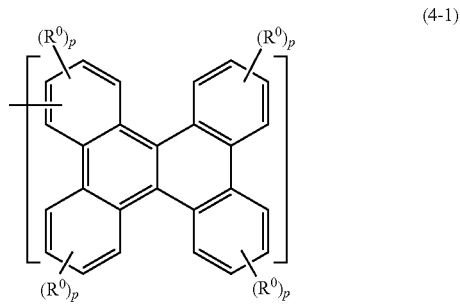

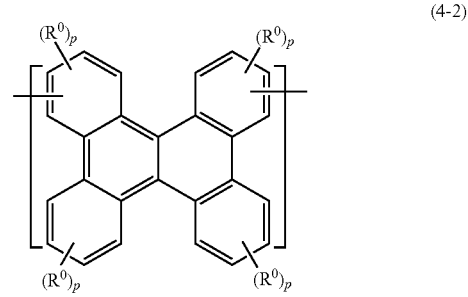

wherein $R^5$ is a hydrogen atom, or a linear or branched alkyl group having 1 to 4 carbon atoms; $R^6$ is a hydrogen atom, a linear or branched alkyl group having 1 to 4 carbon atoms, a cyano group, a nitro group, a heterocyclic group, a halogen atom, or a carboxyl group; $n_1$ is an integer of 0 to 4; $n_2$ is an integer of 1 to 5; and $n_0$ is an integer of 0 to 4.

2. A resist composition comprising:
a resin obtained through a reaction of at least a compound represented by the following formula (1) with a compound having crosslinking reactivity:

(4-3)
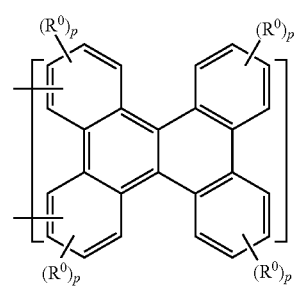
(4-4)
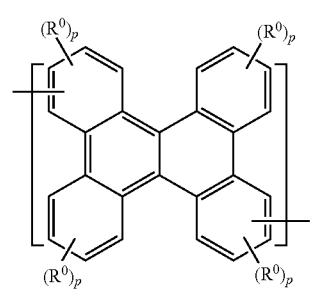
(4-5)
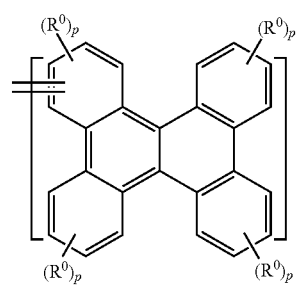
(4-6)
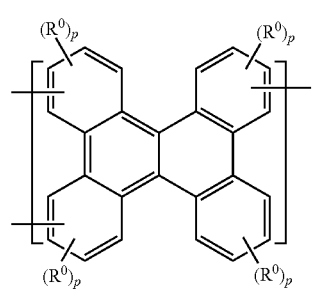
(4-7)
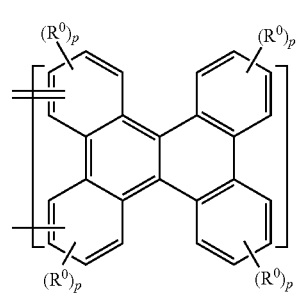
(4-8)
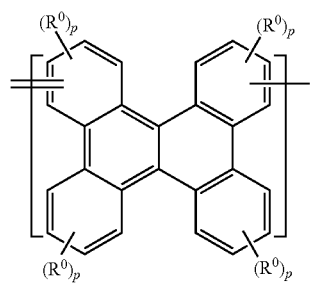
(4-9)
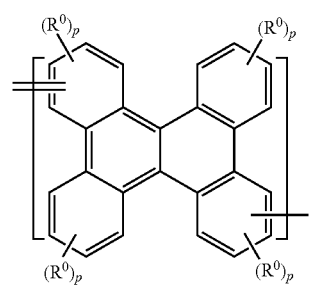
(4-10)
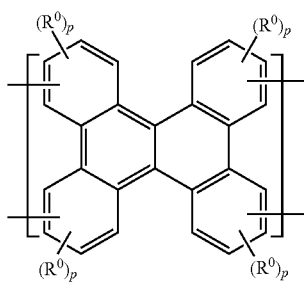
(4-11)
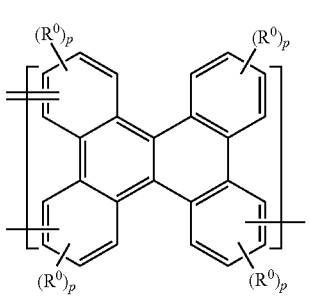
(4-12)
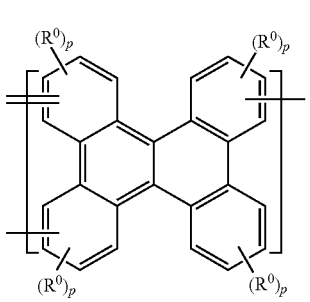

-continued

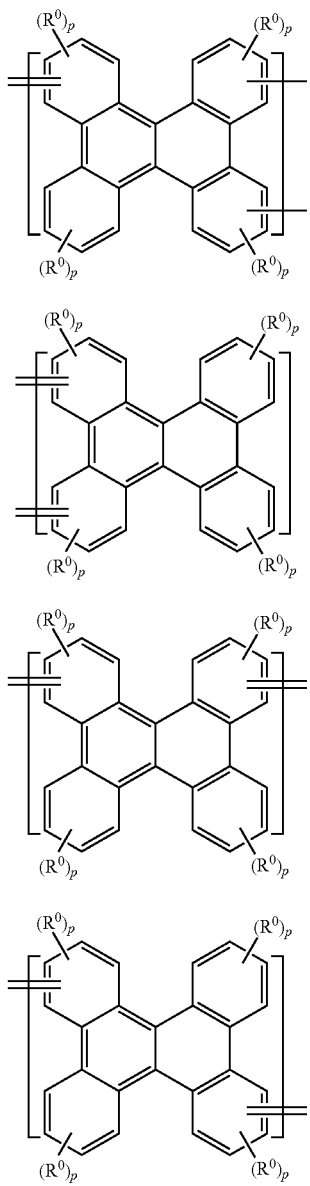

(4-13)

(4-14)

(4-15)

(4-16)

wherein $R^0$ and p are as defined in the formula (1).

6. A resist composition comprising:
a resist material including a compound represented by the following formula (3)

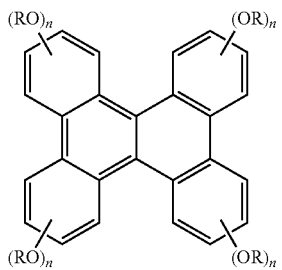

(3)

wherein each R is independently a hydrogen atom or an acid dissociation reactive group, wherein at least one of R is an acid dissociation reactive group; and each n is independently an integer of 0 to 4, wherein at least one of n is an integer of 1 to 4, wherein the acid dissociation reactive group is a group selected from the group consisting of the following:

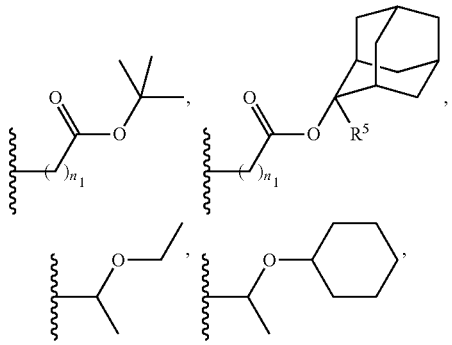

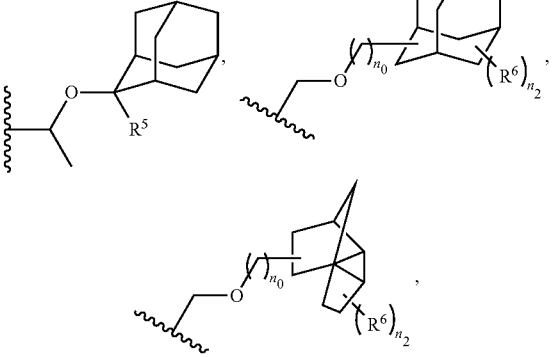

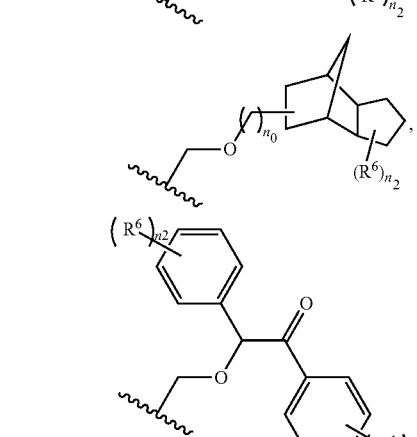

, and wherein $R^5$ is a hydrogen atom, or a linear or branched alkyl group having 1 to 4 carbon atoms; $R^6$ is a hydrogen atom, a linear or branched alkyl group having 1 to 4 carbon atoms, a cyano group, a nitro group, a heterocyclic group, a halogen atom, or a carboxyl group; $n_1$ is an integer of 0 to 4; $n_2$ is an integer of 1 to 5; and $n_0$ is an integer of 0 to 4;

a solvent; and an acid generating agent.

7. A resist composition comprising:

a resist material including a compound represented by the following formula (3)

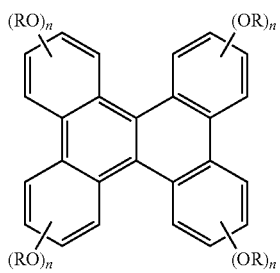

(3)

wherein each R is independently a hydrogen atom or an acid dissociation reactive group, wherein at least one of R is an acid dissociation reactive group; and each n is independently an integer of 0 to 4, wherein at least one of n is an integer of 1 to 4, wherein the acid dissociation reactive group is a group selected from the group consisting of the following:

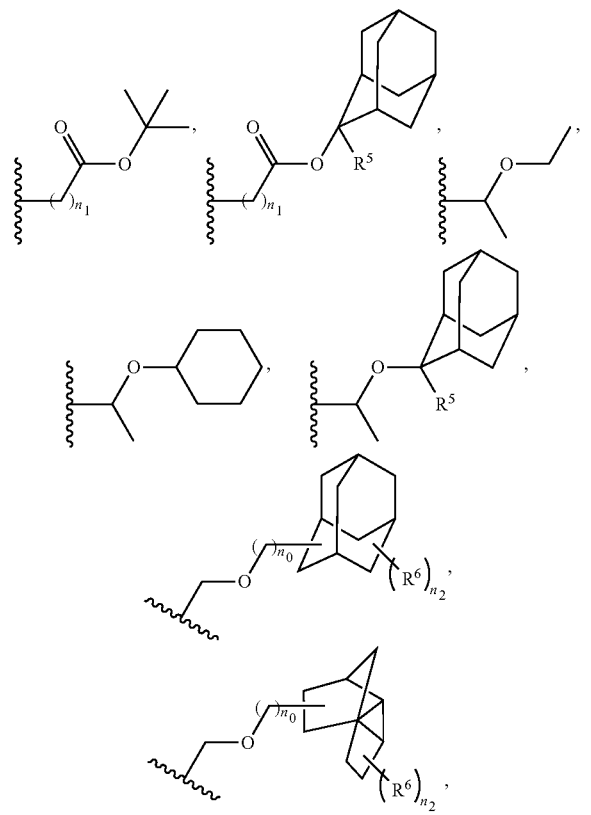

(13-4)

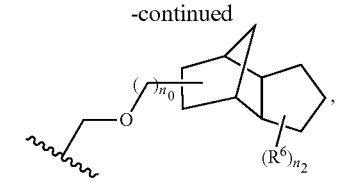

and

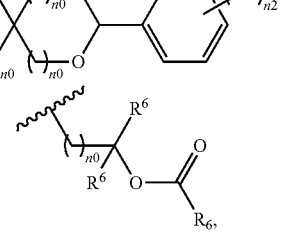

wherein $R^5$ is a hydrogen atom, or a linear or branched alkyl group having 1 to 4 carbon atoms; $R^6$ is a hydrogen atom, a linear or branched alkyl group having 1 to 4 carbon atoms, a cyano group, a nitro group, a heterocyclic group, a halogen atom, or a carboxyl group; $n_1$ is an integer of 0 to 4; $n_2$ is an integer of 1 to 5; and $n_0$ is an integer of 0 to 4;

a solvent; and an acid crosslinking agent.

8. A method for forming a resist pattern, comprising the steps of:

coating a substrate with the resist composition according to claim 6, thereby forming a resist film;

exposing the resist film; and developing the exposed resist film.

9. A method for forming a resist composition comprising the steps of:

obtaining a resist material comprising a compound represented by the following formula (1)

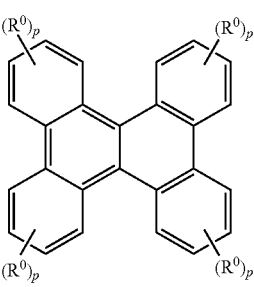

(1)

wherein each $R^0$ is independently a monovalent group having an oxygen atom, a monovalent group having a sulfur atom, a monovalent group having a nitrogen atom, a hydrocarbon group, or a halogen atom; and each p is independently an integer of 0 to 4; and forming the resist composition from the resist material and at least one of an acid generating agent and an acid crosslinking agent;

wherein at least one p is an integer of 1 to 4.

10. The method of claim 9, wherein at least one of $R^0$ is the monovalent group having the oxygen atom.

11. The method of claim 9, wherein the compound represented by the formula (1) is a compound represented by the following formula (2):

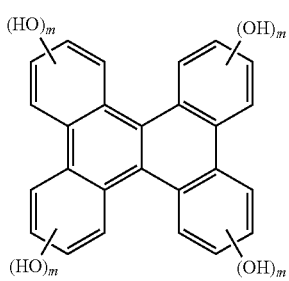

(2)

wherein each m is independently an integer of 0 to 4, wherein at least one of m is an integer of 1 to 4.

12. The method of claim 11, wherein the compound represented by the formula (2) is at least one kind selected from a compound group represented by the following formulas (2-1) to (2-6):

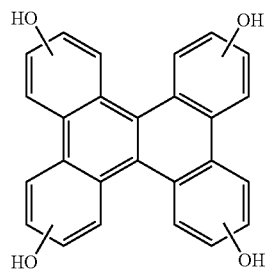

(2-1)

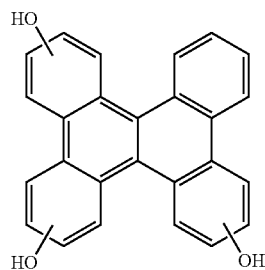

(2-2)

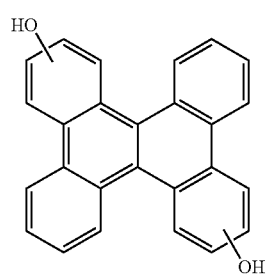

(2-3)

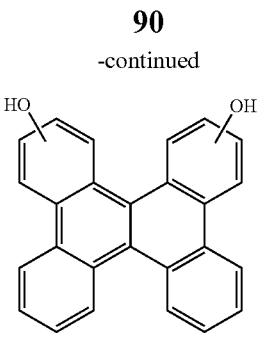

(2-4)

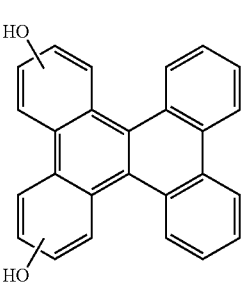

(2-5)

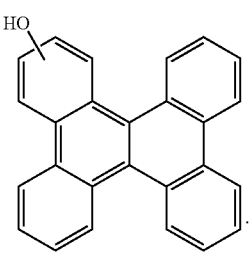

(2-6)

13. The method of claim 9, wherein the compound represented by the formula (1) is a compound represented by the following formula (3):

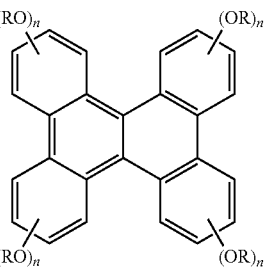

(3)

wherein each R is independently a hydrogen atom or an acid dissociation reactive group, wherein at least one of R is an acid dissociation reactive group; and each n is independently an integer of 0 to 4, wherein at least one of n is an integer of 1 to 4.

14. The method of claim 13, wherein the compound represented by the formula (3) is at least one kind selected from a compound group represented by the following formulas (3-1) to (3-6):

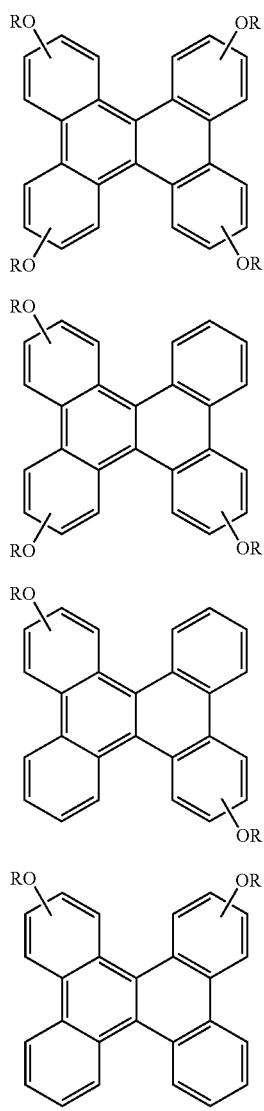

(3-1)

(3-2)

(3-3)

(3-4)

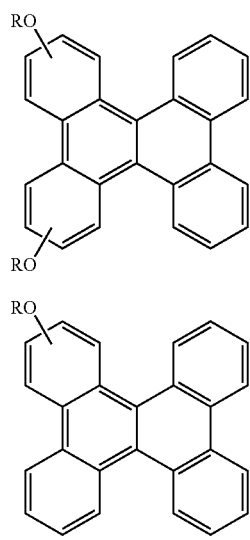

(3-5)

(3-6)

wherein R is as defined in the formula (3).

15. The method of claim 13, wherein the acid dissociation reactive group is a group selected from the group consisting of a substituted methyl group, a 1-substituted ethyl group, a 1-substituted n-propyl group, a 1-branched alkyl group, a silyl group, an acyl group, a 1-substituted alkoxymethyl group, a cyclic ether group, an alkoxycarbonyl group, and an alkoxycarbonylalkyl group.

16. The method of claim 9 further comprising the steps of:
obtaining a solvent; and
forming the resist composition from the solvent, the resist material and at least one of an acid generating agent and an acid crosslinking agent.

17. A method for forming a resist pattern, comprising the steps of:
coating a substrate with the resist composition according to claim 7, thereby forming a resist film;
exposing the resist film; and
developing the exposed resist film.

* * * * *

UNITED STATES PATENT AND TRADEMARK OFFICE
CERTIFICATE OF CORRECTION

PATENT NO. : 10,437,148 B2
APPLICATION NO. : 15/309780
DATED : October 8, 2019
INVENTOR(S) : Takumi Toida, Takashi Sato and Masatoshi Echigo It is certified that error appears in the above-identified patent and that said Letters Patent is hereby corrected as shown below:

In the Claims

Column 87, Line (4):
Claim 6, please delete "$n_0$is" and insert -- $n_0$ is --, therefor.

Signed and Sealed this
Twenty-sixth Day of May, 2020

Andrei Iancu
*Director of the United States Patent and Trademark Office*